(12) United States Patent
Lee et al.

(10) Patent No.: US 9,236,340 B2
(45) Date of Patent: Jan. 12, 2016

(54) STRING SELECTION STRUCTURE OF THREE-DIMENSIONAL SEMICONDUCTOR DEVICE

(71) Applicant: Samsung Electronics Co., Ltd., Suwon-si, Gyeonggi-do (KR)

(72) Inventors: Changhyun Lee, Suwon-si (KR); Sung-Min Hwang, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/088,127

(22) Filed: Nov. 22, 2013

(65) Prior Publication Data
US 2014/0198572 A1  Jul. 17, 2014

(30) Foreign Application Priority Data
Jan. 11, 2013 (KR) .................. 10-2013-0003275

(51) Int. Cl.
| | |
|---|---|
| G11C 16/10 | (2006.01) |
| H01L 23/50 | (2006.01) |
| G11C 16/08 | (2006.01) |
| G11C 11/56 | (2006.01) |
| G11C 16/04 | (2006.01) |
| H01L 27/115 | (2006.01) |

(52) U.S. Cl.
CPC ............ *H01L 23/50* (2013.01); *G11C 11/5635* (2013.01); *G11C 16/0483* (2013.01); *G11C 16/08* (2013.01); *H01L 27/1157* (2013.01); *H01L 27/11565* (2013.01); *H01L 27/11582* (2013.01); *H01L 2924/0002* (2013.01)

(58) Field of Classification Search
CPC .......................... G11C 16/0483; G11C 16/10
USPC ....................... 365/185.05, 185.24
See application file for complete search history.

(56) References Cited

U.S. PATENT DOCUMENTS

| | | | |
|---|---|---|---|
| 7,982,261 B2 | 7/2011 | Kidoh et al. | |
| 8,247,863 B2 | 8/2012 | Fukuzumi et al. | |
| 8,334,561 B2 | 12/2012 | Fukuzumi et al. | |
| 2010/0207193 A1 | 8/2010 | Tanaka et al. | |
| 2010/0276659 A1* | 11/2010 | Lowrey ........................... | 257/5 |
| 2011/0298013 A1 | 12/2011 | Hwang et al. | |
| 2011/0306195 A1 | 12/2011 | Kim et al. | |

(Continued)

FOREIGN PATENT DOCUMENTS

| | | |
|---|---|---|
| JP | 2010-114369 | 5/2010 |
| KR | 10-0693879 | 3/2007 |
| KR | 10-1036155 | 5/2011 |
| KR | 10-1056113 | 8/2011 |
| KR | 10-2011-0132865 | 12/2011 |
| KR | 10-2012-0029889 | 3/2012 |

*Primary Examiner* — Michael Tran
(74) *Attorney, Agent, or Firm* — F. Chau & Associates, LLC

(57) ABSTRACT

A three-dimensional semiconductor device includes first and second selection lines stacked one on the other. An upper line horizontally crosses over the first and second selection lines. First and second vertical patterns vertically cross the first and second selection lines. The first and second vertical patterns are connected in common to the upper line. Each of the first and second vertical patterns constitutes first and second selection transistors that are connected in series to each other. The first selection transistors of the first and second vertical patterns are controlled by the first and second selection lines, respectively.

27 Claims, 61 Drawing Sheets

(56) References Cited

U.S. PATENT DOCUMENTS

2012/0007167 A1* 1/2012 Hung et al. .................. 257/324
2012/0032245 A1 2/2012 Hwang et al.
2012/0108048 A1* 5/2012 Lim et al. .................... 438/586
2012/0153372 A1* 6/2012 Kim et al. .................... 257/314
2012/0236642 A1* 9/2012 Lue .......................... 365/185.05
2013/0134493 A1* 5/2013 Eom et al. .................... 257/314

* cited by examiner

D : Depletion mode Transistor
E : Enhancement mode Transistor

D : Depletion mode Transistor
E : Enhacement mode Transistor

D : Depletion mode Transistor
E : Enhancement mode Transistor

Fig. 49

| VP1 | VP2 | VP3 | BL | SSL1-VP1 (Enh) | SSL2-VP1 (Dep) | SSL1-VP2 (Dep) | | SSL2-VP2 (Enh) | | SSL1-VP3 (Enh) | SSL2-VP3 (Dep) |
|---|---|---|---|---|---|---|---|---|---|---|---|
| | | | | | | VP1-side | VP3-side | VP1-side | VP3-side | | |
| PGM | Inhibit | Inhibit | 0 | Vcc | 0 | Vcc | 0 | 0 | 0 | 0 | 0 |
| Inhibit | PGM | Inhibit | 0 | 0 | Vcc | 0 | Vcc | Vcc | 0 | Vcc | Vcc |
| Inhibit | Inhibit | PGM | 0 | 0 | Vcc | Vcc | 0 | 0 | Vcc | Vcc | 0 |
| PGM | PGM | Inhibit | 0 | Vcc | Vcc | Vcc | 0 | Vcc | 0 | 0 | 0 |
| PGM | Inhibit | PGM | 0 | Vcc | Vcc | 0 | Vcc | Vcc | Vcc | Vcc | Vcc |

| VP1 | VP2 | VP3 | BL | SSL1-VP1 (Dep) | SSL2-VP1 (Enh) | SSL1-VP2 (Enh) | | SSL2-VP2 (Dep) | | SSL1-VP3 (Dep) | SSL2-VP3 (Enh) |
|---|---|---|---|---|---|---|---|---|---|---|---|
| | | | | | | VP1-side | VP3-side | VP1-side | VP3-side | | |
| PGM | Inhibit | Inhibit | 0 | 0 | Vcc | 0 | Vcc | 0 | 0 | 0 | 0 |
| Inhibit | PGM | Inhibit | 0 | Vcc | 0 | Vcc | 0 | 0 | 0 | Vcc | 0 |
| Inhibit | Inhibit | PGM | 0 | 0 | 0 | 0 | 0 | Vcc | Vcc | 0 | Vcc |

Fig. 50

| VP1 | VP2 | VP3 | BL | SSL1-VP1 (Enh) | SSL2-VP1 (Dep) | SSL1-VP2 (Dep) | | SSL2-VP2 (Enh) | | SSL1-VP3 (Enh) | SSL2-VP3 (Dep) |
|---|---|---|---|---|---|---|---|---|---|---|---|
| | | | | | | VP1-side | VP3-side | VP1-side | VP3-side | | |
| Read | Unselect | Unselect | 0.7 | Vread | 0 | Vread | 0 | 0 | 0 | 0 | 0 |
| Unselect | Read | Unselect | 0.7 | 0 | Vread | 0 | 0 | Vread | Vread | 0 | Vread |
| Unselect | Unselect | Read | 0.7 | 0 | 0 | Vread | Vread | 0 | Vread | Vread | 0 |
| Read | Read | Unselect | 0.7 | Vread | Vread | Vread | 0 | Vread | Vread | 0 | 0 |
| Read | Unselect | Read | 0.7 | Vread | 0 | Vread | Vread | 0 | Vread | Vread | Vread |

| VP1 | VP2 | VP3 | BL | SSL1-VP1 (Dep) | SSL2-VP1 (Enh) | SSL1-VP2 (Enh) | | SSL2-VP2 (Dep) | | SSL1-VP3 (Dep) | SSL2-VP3 (Enh) |
|---|---|---|---|---|---|---|---|---|---|---|---|
| | | | | | | VP1-side | VP3-side | VP1-side | VP3-side | | |
| Read | Unselect | Unselect | 0.7 | 0 | Vread | 0 | 0 | Vread | 0 | 0 | 0 |
| Unselect | Read | Unselect | 0.7 | Vread | 0 | 0 | 0 | 0 | 0 | Vread | 0 |
| Unselect | Unselect | Read | 0.7 | 0 | 0 | 0 | 0 | 0 | Vread | 0 | Vread |

Fig. 51

| VP1 | VP2 | VP3 | BL (VP1/VP3) | BL (VP2) | SSL-VP1 (Enh) | SSL-VP2 (Enh) | | SSL1-VP3 (Enh) |
|---|---|---|---|---|---|---|---|---|
| | | | | | | VP1-side WL | VP3-side WL | |
| PGM | Inhibit | Inhibit | 0 | Vcc | Vcc | Vcc | 0 | 0 |
| Inhibit | PGM | Inhibit | Vcc | 0 | Vcc | Vcc | Vcc | Vcc |
| Inhibit | Inhibit | PGM | 0 | Vcc | 0 | 0 | Vcc | Vcc |
| PGM | PGM | Inhibit | 0 | 0 | Vcc | Vcc | Vcc | 0 |
| PGM | Inhibit | PGM | 0 | Vcc | Vcc | Vcc | Vcc | Vcc |
| Inhibit | PGM | PGM | 0 | 0 | Vcc | Vcc | Vcc | Vcc |

Fig. 52

| VP1 | VP2 | VP3 | BL (VP1/VP3) | BL (VP2) | SSL-VP1 (Enh) | SSL-VP2 (Enh) | | SSL1-VP3 (Enh) |
|---|---|---|---|---|---|---|---|---|
| | | | | | | VP1-side WL | VP3-side WL | |
| Read | Unselect | Unselect | 0.7 | 0 | Vread | Vread | 0 | 0 |
| Unselect | Read | Unselect | 0 | 0.7 | Vread | Vread | Vread | Vread |
| Unselect | Unselect | Read | 0.7 | 0 | 0 | 0 | Vread | Vread |

STRING SELECTION STRUCTURE OF THREE-DIMENSIONAL SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0003275 filed on Jan. 11, 2013 in the Korean Intellectual Property Office, the disclosure of which is incorporated by reference herein in its entirety.

TECHNICAL FIELD

Exemplary embodiments of the inventive concept relate to semiconductor devices, and in particular, to string selection structures of three-dimensional semiconductor devices.

DISCUSSION OF RELATED ART

By arranging memory cells in 3D, a highly integrated semiconductor device may be achieved. Word lines or bit lines may be arranged or interconnected in various ways so as to provide a further integrated semiconductor device.

SUMMARY

According to an exemplary embodiment of the inventive concept, a three-dimensional semiconductor device may include first and second selection lines that may be stacked one on the other. An upper line horizontally crosses over the first and second selection lines. First and second vertical patterns vertically cross the first and second selection lines. The first and second vertical patterns are connected in common to the upper line. Each of the first and second vertical patterns constitutes first and second selection transistors that are connected in series to each other. The first and second selection transistors, respectively, have first and second threshold voltages that are different from each other. The first selection transistors of the first and second vertical patterns are controlled by the first and second selection lines, respectively.

In an exemplary embodiment of the inventive concept, the first selection transistors of the first and second vertical patterns, respectively, use the first and second selection lines as their respective gate electrodes. The second selection transistors of the first and second vertical patterns, respectively, use the second and first selection lines as their respective gate electrodes.

In an exemplary embodiment of the inventive concept, the device may further include an additional upper line. The additional upper line horizontally crosses over the first and second selection lines. A third vertical pattern vertically crosses the first and second selection lines. The third vertical pattern is connected to the additional upper line. Each of the first, second, and third vertical patterns may overlap both of the upper line and the additional upper line, when viewed in plan view.

In an exemplary embodiment of the inventive concept, both of the first and second selection transistors may include metal-oxide-semiconductor field effect transistors (MOSFETs) of substantially the same conductivity type. The first threshold voltage may be lower than the second threshold voltage.

In an exemplary embodiment of the inventive concept, both of the first and second selection transistors may include n-MOSFETs. The first threshold voltage may have a negative value, and the second threshold voltage may have a positive value.

In an exemplary embodiment of the inventive concept, the first and second selection transistors include a charge storing layer. The first selection transistors may be subjected to electrical erasing, and thus, a threshold voltage of the first selection transistors may be lower than a threshold voltage of the second selection transistors.

In an exemplary embodiment of the inventive concept, the first selection transistors of the first and second vertical patterns may include n-MOSFETs. At least one of the n-MOSFETs has an n-type channel region.

According to an exemplary embodiment of the inventive concept, a three-dimensional semiconductor device may include unit structures. At least one of the unit structures includes first and second selection lines stacked one on the other. First and second vertical patterns penetrate the first and second selection lines. Upper lines are provided on the unit structures. The upper lines cross over the first and second selection lines. In at least one of the unit structures, the first and second vertical patterns may be connected in common to one of the upper lines. Each of the first and second vertical patterns constitutes first and second selection transistors that are connected in series to each other. The first and second selection transistors, respectively, have first and second threshold voltages that are different from each other. The first selection transistors of the first and second vertical patterns are controlled by the first and second selection lines, respectively.

In an exemplary embodiment of the inventive concept, the unit structures include first and second unit structures adjacent to each other. The first and second unit structures have substantially mirror symmetry.

In an exemplary embodiment of the inventive concept, the first and second unit structures may be spaced apart from each other.

In an exemplary embodiment of the inventive concept, the first and second unit structures may at least partially contact each other.

In an exemplary embodiment of the inventive concept, the second vertical pattern of the first unit structure functions as the second vertical pattern of the second unit structure.

In an exemplary embodiment of the inventive concept, an upper portion of the second vertical pattern may be at least partially cut by a slit that is formed substantially parallel to the upper line.

In an exemplary embodiment of the inventive concept, each of the first and second unit structures may further include plugs disposed between the first and second vertical patterns and the upper lines. The plugs of the first and second unit structures have substantially mirror symmetry.

In an exemplary embodiment of the inventive concept, each of the first and second unit structures may further include plugs disposed between the first and second vertical patterns and the upper lines. The plugs of the first and second unit structures have substantially rotational symmetry.

In an exemplary embodiment of the inventive concept, each of the first and second unit structures may further include a plurality of word lines that are stacked one on another below the first selection line. Each of pairs of the first and second selection lines, which are included in the first and second unit structures and are located at substantially the same level, are electrically separated from each other. Each of pairs of the word lines, which are included in the first and second unit structures and are located at substantially the same level, are electrically connected to each other to be in an equipotential state.

In an exemplary embodiment of the inventive concept, each of the first and second unit structures may further include a plurality of word lines that are stacked one on another below the first selection line. Each of pairs of the first and second selection lines, which are included in the first and second unit structures and are located at substantially the same level, are electrically connected to each other to be in an equipotential state. Each of pairs of the word lines, which are included in the first and second unit structures and are located at substantially the same level, are electrically connected to each other to be in an equipotential state.

According to an exemplary embodiment of the inventive concept, a three-dimensional semiconductor device may include a selection line. First and second upper lines horizontally cross over the selection line. First and second vertical patterns vertically cross the selection line. The first and second vertical patterns are connected to the first and second upper lines, respectively. Each of the first and second vertical patterns may overlap both of the first and second upper lines, when viewed in plan view.

In an exemplary embodiment of the inventive concept, the first and second vertical patterns may be arranged along a longitudinal direction of the first and second upper lines.

In an exemplary embodiment of the inventive concept, a width of each of the first and second upper lines may be smaller than about half a width of each of the first and second vertical patterns.

In an exemplary embodiment of the inventive concept, the device may further include plugs interposed between the first and second upper lines and the first and second vertical patterns. The plugs may connect one of the first and second upper lines to a corresponding one of the first and second vertical patterns.

In an exemplary embodiment of the inventive concept, the first and second vertical patterns constitute a pair of selection transistors sharing the selection line as a gate electrode thereof.

In an exemplary embodiment of the inventive concept, at least two upper lines including the first and second upper lines may be provided on each of the first and second vertical patterns.

According to an exemplary embodiment of the inventive concept, a method of operating a three-dimensional semiconductor device may include connecting one of the first and second vertical patterns selectively to the upper line. A first voltage is applied to one of the first and second selection lines, and a second voltage is applied to the other of the first and second selection lines. The first voltage is higher than both of the first and second threshold voltages. The second voltage has an intermediate level between the first and second threshold voltages.

According to an exemplary embodiment of the inventive concept, a semiconductor device comprises a first string selection structure and a second string selection structure. The first string selection structure includes a first selection line. First and second upper lines horizontally cross over the first selection line. First and second vertical patterns vertically cross the first selection line. The first and second vertical patterns are connected to the first and second upper lines, respectively. Each of the first and second vertical patterns overlaps both of the first and second upper lines, when viewed in plan view. The second string selection structure includes second and third selection lines that are stacked one on the other. A third upper line horizontally crosses over the second and third selection lines. Third and fourth vertical patterns vertically cross the second and third selection lines. The third and fourth vertical patterns are connected in common to the third upper line. Each of the third and fourth vertical patterns includes first and second selection transistors that are connected in series to each other. The first and second selection transistors respectively have first and second threshold voltages that are different from each other. The first selection transistors of the third and fourth vertical patterns are controlled by the second and third selection lines, respectively. The first selection line is shared by the first and second vertical patterns. Each of the second and third selection lines is shared by the third and fourth vertical patterns.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein, wherein:

FIGS. 49 and 50 are tables illustrating a method of operating a three-dimensional NAND FLASH memory device, according to an exemplary embodiment of the inventive concept;

FIGS. 51 and 52 are tables illustrating a method of operating a three-dimensional NAND FLASH memory device, according to an exemplary embodiment of the inventive concept;

DETAILED DESCRIPTION OF EMBODIMENTS

Figure 1:
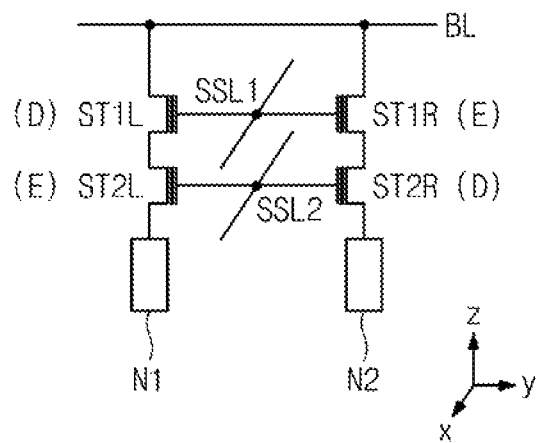
FIG. 1 is a circuit diagram illustrating a string selection structure according to an exemplary embodiment of the inventive concept.

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein. Like reference numerals may denote like or similar elements throughout the specification and the drawings.

It will be understood that when an element is referred to as being "connected to," "coupled to," or "on" another element, it can be directly connected to, coupled to, or on the other element or intervening elements may be present. As used herein, the singular forms "a," "an" and "the" are intended to include the plural forms as well, unless the context clearly indicates otherwise.

Figure 2:
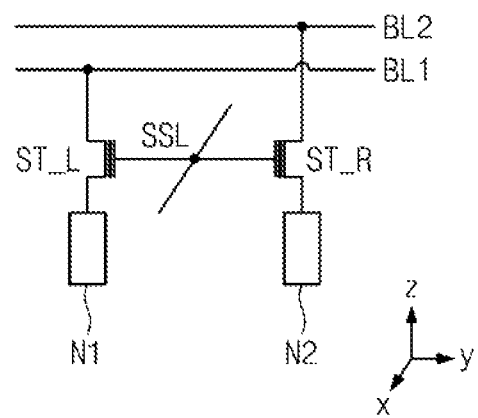
FIG. 2 is a circuit diagram illustrating a string selection structure according to an exemplary embodiment of the inventive concept.

FIG. 1 is a circuit diagram illustrating a string selection structure according to an exemplary embodiment of the inventive concept, and FIG. 2 is a circuit diagram illustrating a string selection structure according to an exemplary embodiment of the inventive concept. For the purpose of description, the string selection structures of FIGS. 1 and 2 will be referred to as a "first string selection structure" and a "second string selection structure", respectively.

Referring to FIG. 1, first and second nodes N1 and N2 are connected in common to a bit line BL through selection transistors. In an exemplary embodiment of the inventive concept, each of the first and second nodes N1 and N2 may be a portion of a memory cell string constituting a three-dimensional NAND FLASH memory device.

The selection transistors may include a left-top selection transistor ST1L and a left-bottom selection transistor ST2L, which are connected in series between the bit line BL and the first node N1, and a right-top selection transistor ST1R and a right-bottom selection transistor ST2R, which are connected in series between the bit line BL and the second node N2. The left-top and right-top selection transistors ST1L and ST1R may be controlled in common by a first string selection line SSL1, and the left-bottom and right-bottom selection transistors ST2L and ST2R may be controlled in common by a second string selection line SSL2. For example, the first string selection line SSL1 may function as a common gate electrode of the left-top and right-top selection transistors ST1L and ST1R, and the second string selection line SSL2 may function as a common gate electrode of the left-bottom and right-bottom selection transistors ST2L and ST2R. The first and second string selection lines SSL1 and SSL2 may cross the bit line BL.

According to an exemplary embodiment of the inventive concept, one of the left-top and left-bottom selection transistors ST1L and ST2L may have a higher threshold voltage than the other. One of the right-top and right-bottom selection transistors ST1R and ST2R may have a higher threshold voltage than the other. The selection transistors may have inversion symmetry. For example, one of the left-top and right-top selection transistors ST1L and ST1R may have a higher threshold voltage than the other. One of the left-bottom and right-bottom selection transistors ST2L and ST2R may have a higher threshold voltage than the other.

In an exemplary embodiment of the inventive concept, the left-top and right-bottom selection transistors ST1L and ST2R may be operated as depletion-mode transistors, and the left-bottom and right-top selection transistors ST2L and ST1R may be operated as enhancement-mode transistors. In an exemplary embodiment of the inventive concept, the left-top and right-bottom selection transistors ST1L and ST2R may be operated as enhancement-mode transistors, and the left-bottom and right-top selection transistors ST2L and ST1R may be operated as depletion-mode transistors.

When the depletion-mode transistor has a threshold voltage of Vth(D) and the enhancement-mode transistor has a threshold voltage of Vth(E), electric connections between the bit line BL and the first and second nodes N1 and N2 can be selectively controlled by adjusting voltages V1 and V2 that are applied to the first and second string selection lines SSL1 and SSL2, respectively, as shown in the following TABLE 1.

TABLE 1

|  | Voltage applied to SSL1 | Voltage applied to SSL2 | ST1L ST2L | ST1R ST2R | Connection State N1-BL | N2-BL |
|---|---|---|---|---|---|---|
| Case I | Vth(D) < V1 < Vth(E) | Vth(D) < V2 < Vth(E) | ON OFF | OFF ON | Disconnected | Disconnected |
| Case II | Vth(D) < V1 < Vth(E) | Vth(E) < V2 | ON ON | OFF ON | Connected | Disconnected |
| Case III | Vth(E) < V1 | Vth(D) < V2 < Vth(E) | ON OFF | ON ON | Disconnected | Connected |
| Case IV | Vth(E) < V1 | Vth(E) < V2 | ON ON | ON ON | Connected | Connected |

According to TABLE 1, when the voltages V1 and V2 satisfy the voltage condition of Case I, both of the first and second nodes N1 and N2 are electrically disconnected from the bit line BL. When the voltages V1 and V2 satisfy the voltage condition of Case II or III, the first node N1 or the second node N2 is selectively connected to the bit line BL. Further, when the voltages V1 and V2 satisfy the voltage condition of Case IV, both the first and second nodes N1 and N2 are electrically connected to the bit line BL.

In an exemplary embodiment of the inventive concept, the selection transistors may be metal-oxide-semiconductor (MOS) field effect transistors having substantially the same conductivity type (for example, n-type). When the selection transistors are NMOSFETs, the threshold voltage Vth(D) of the depletion-mode transistor may have a negative value. Such a negative threshold voltage may be achieved by performing electrical erasing on the transistor or by forming a channel region of the transistor with an n-type semiconductor material.

Referring to FIG. 2, each of first and second bit lines BL1 and BL2 may be electrically connected to its corresponding one of the first and second nodes N1 and N2. For example, the first bit line BL1 may be connected to the first node N1 through a left selection transistor ST_L, and the second bit line BL2 may be electrically connected to the second node N2 through a right selection transistor ST_R. The left and right selection transistors ST_L and ST_R may be connected in common to a string selection line SSL that crosses the first and second bit lines BL1 and BL2.

In an exemplary embodiment of the inventive concept, the left and right selection transistors ST_L and ST_R may have substantially the same threshold voltage. For example, the left and right selection transistors ST_L and ST_R may be operated in substantially the same mode (e.g., one of the depletion and enhancement modes). According to this configuration, although the string selection line SSL is shared by the left and right selection transistors ST_L and ST_R, each of the first and second nodes N1 and N2 can be selectively connected to its corresponding one of the bit lines since the first and second nodes N1 and N2 are connected to bit lines different from each other.

In an exemplary embodiment of the inventive concept, each of the first and second nodes N1 and N2 may be a portion of a memory cell string constituting a three-dimensional NAND FLASH memory device. In an exemplary embodiment of the inventive concept, like the string selection transistor shown in FIG. 1, the string selection transistors may have a multi-layered structure between the first and second bit lines BL1 and BL2 and the first and second nodes N1 and N2.

Figure 3:
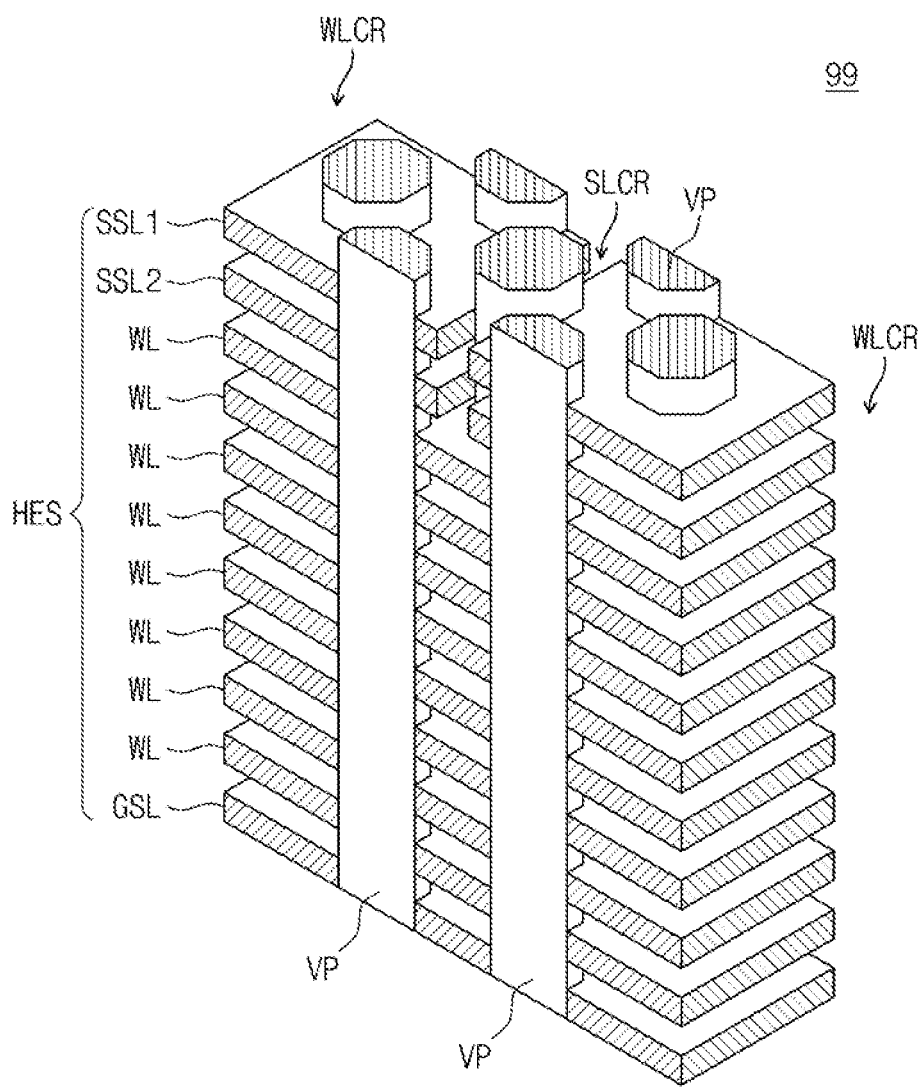
FIG. 3 is a perspective view illustrating a three-dimensional semiconductor device according to an exemplary embodiment of the inventive concept.
Figure 4:
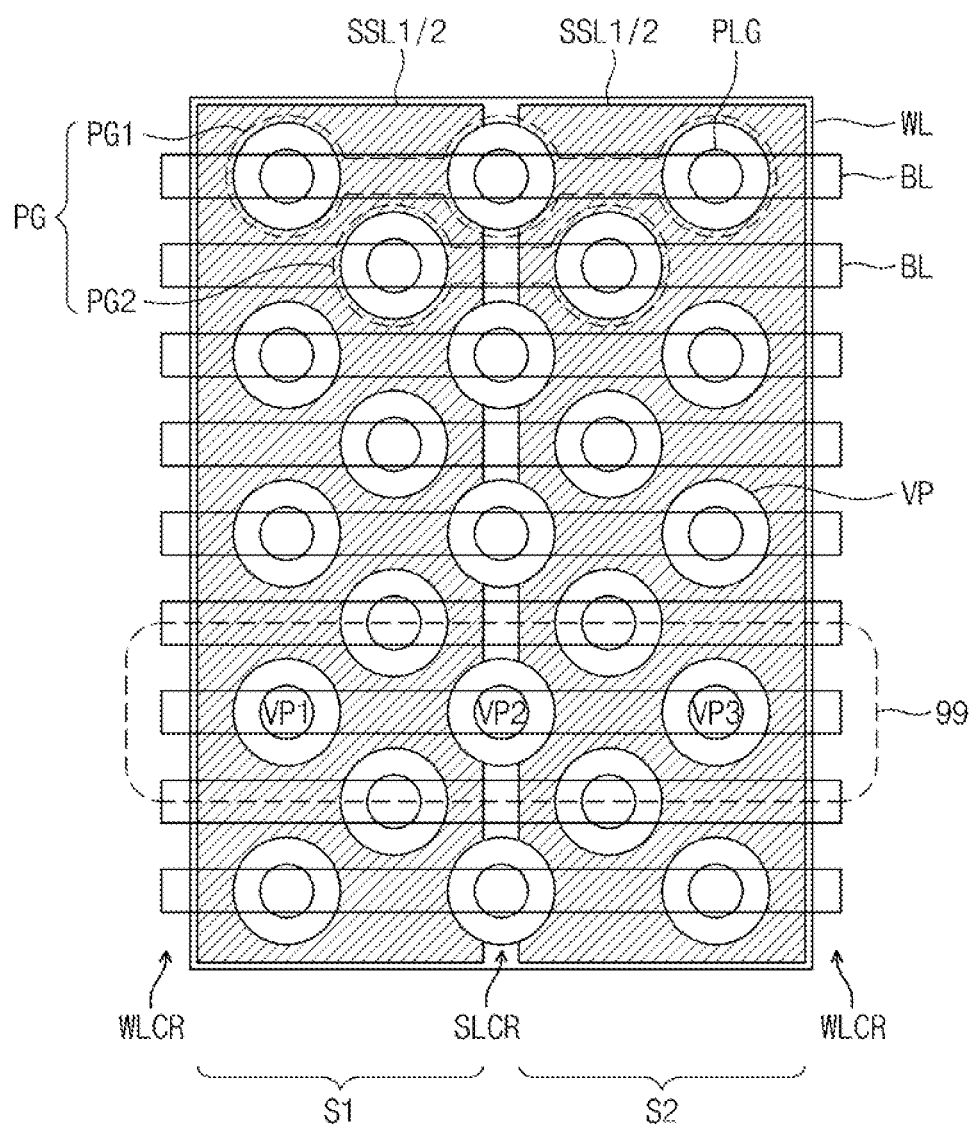
FIGS. 4 and 5, respectively, are a plan view and a circuit diagram illustrating a string selection structure that can be used in a three-dimensional semiconductor device of FIG. 3, according to an exemplary embodiment of the inventive concept.
Figure 5:
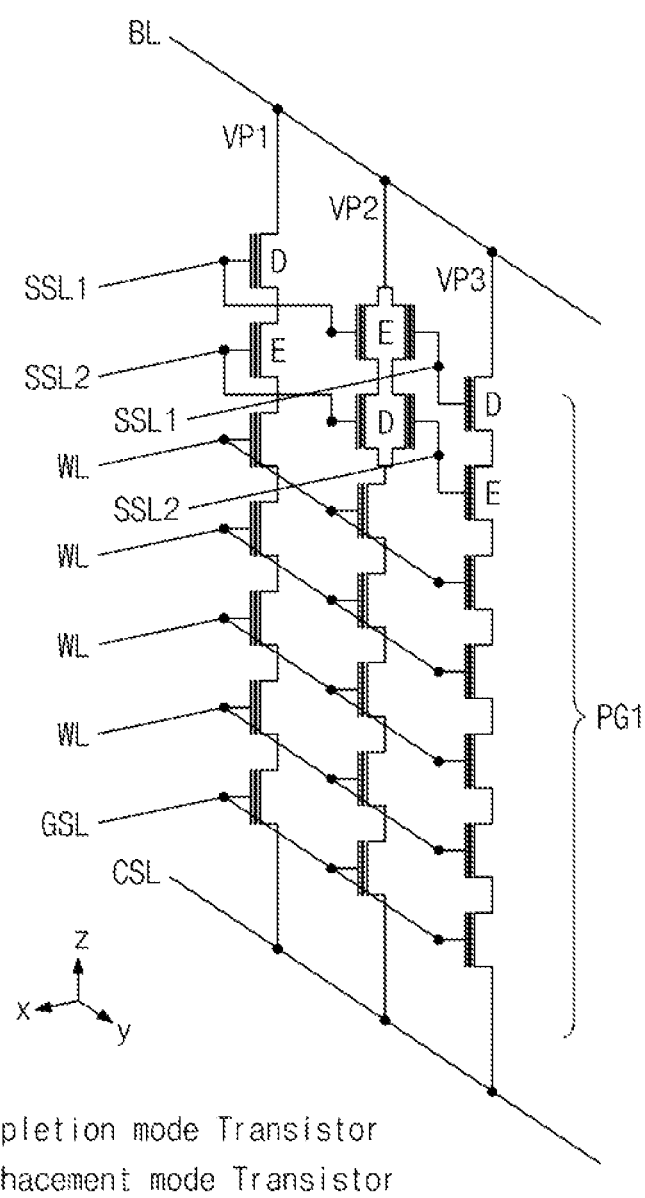

FIG. 3 is a perspective view illustrating a three-dimensional semiconductor device according to an exemplary embodiment of the inventive concept. FIGS. 4 and 5, respectively, are a plan view and a circuit diagram illustrating a string selection structure that can be used in the three-dimensional semiconductor device of FIG. 3, according to an exemplary embodiment of the inventive concept FIG. 3 may correspond to a portion of FIG. 4 depicted in dotted lines 99.

Referring to FIG. 3, vertical patterns VP may penetrate vertically a horizontal electrode structure HES. The horizontal electrode structure HES may include a plurality of horizontal patterns that are vertically spaced apart from each other. Outer sidewalls of the horizontal electrode structure HES may be defined by a pair of outer cutting regions WLCR (or word line cutting region).

In an exemplary embodiment of the inventive concept, the horizontal electrode structure HES or the horizontal patterns may include a ground selection line GSL, string selection lines SSL1 and SSL2 that have a double layer structure, and a plurality of word lines WL sequentially stacked between the ground and string selection lines GSL and SSL2. At least one of the string selection lines SSL1 and SSL2 and the ground selection line GSL may be formed of substantially the same material as the word lines WL.

According to an exemplary embodiment of the inventive concept, an inner cutting region SLCR (or a selection line cutting region) may be formed at a center of the horizontal electrode structure HES, when viewed in plan view. The inner cutting region SLCR may be parallel to the outer cutting regions WLCR. For example, the horizontal electrode structure HES may include a first unit structure S1 and a second unit structure S2 that are divided by the inner cutting region SLCR, when viewed in plan view.

The inner cutting region SLCR may have a bottom that is lower than a bottom surface of a lower one of the string selection lines SSL1 and SSL2, and thus, the inner cutting region SLCR may define inner sidewalls of the string selection lines SSL1 and SSL2. For example, the string selection lines SSL1 and SSL2 of the first unit structure S1 may be horizontally spaced apart from the string selection lines SSL1 and SSL2 of the second unit structure S2. Accordingly, in each horizontal electrode structure HES, the string selection lines SSL1 and SSL2 may be spaced apart from each other in both of vertical and horizontal directions.

In each horizontal electrode structure HES, the word lines WL may be spaced apart from each other in the vertical direction but not in the horizontal direction. For example, the word lines WL of the first unit structure S1 may be horizontally elongated and may function as the word lines WL of the second unit structure S2. The word lines WL of the first and second unit structures S1 and S2 may be connected to each other to be in an equipotential state. Due to the horizontal separation between the string selection lines SSL1 and SSL2, the first and second unit structures S1 and S2 can be independently operated from each other.

Each of the vertical patterns VP may include a multi-layered structure. For example, each of the vertical patterns VP may include a semiconductor layer and at least one insulating layer.

The vertical patterns VP may be two-dimensionally arranged and may penetrate the horizontal electrode structure HES. For example, in each horizontal electrode structure HES, the vertical patterns VP may constitute a plurality of pillar groups PG arranged along a longitudinal direction (hereinafter, "column direction") of the outer cutting regions WLCR, and each of the pillar groups PG may include at least two of the vertical patterns VP.

Figure 6:
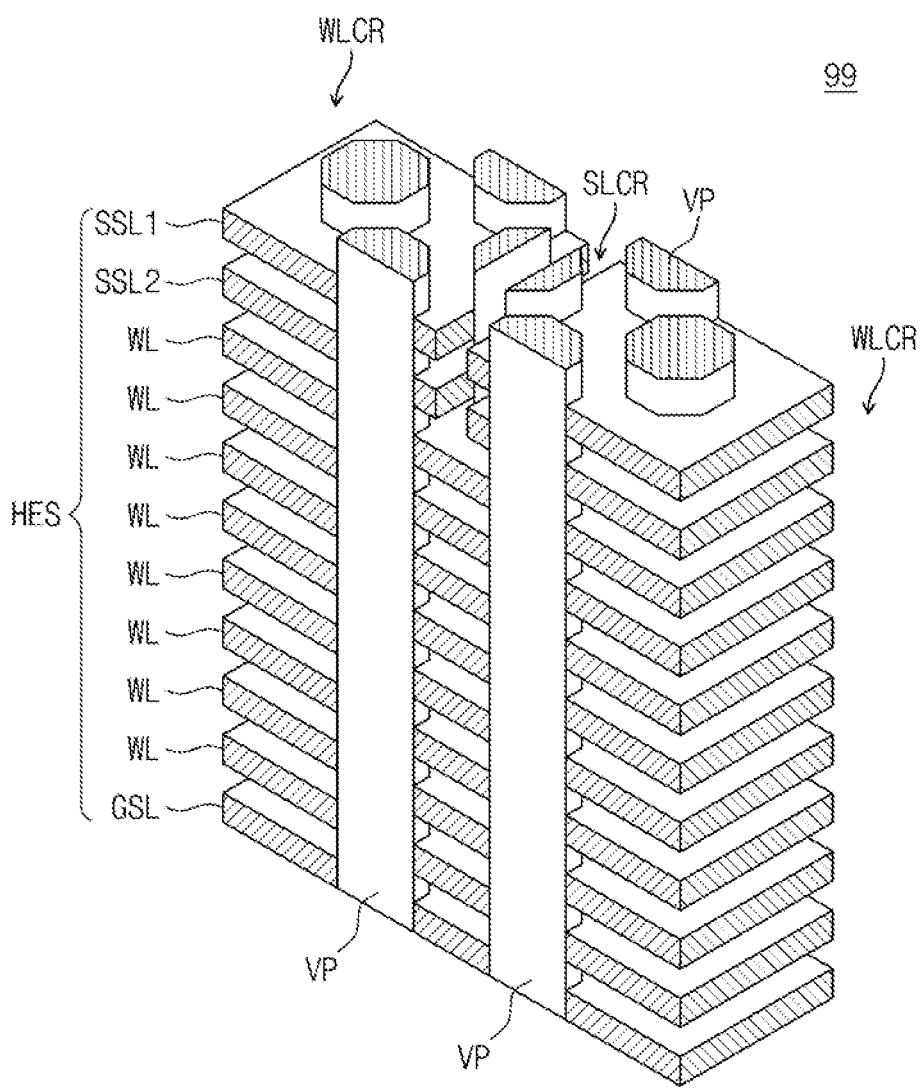
FIG. 6 is a perspective view illustrating a three-dimensional semiconductor device according to an exemplary embodiment of the inventive concept.
Figure 8:
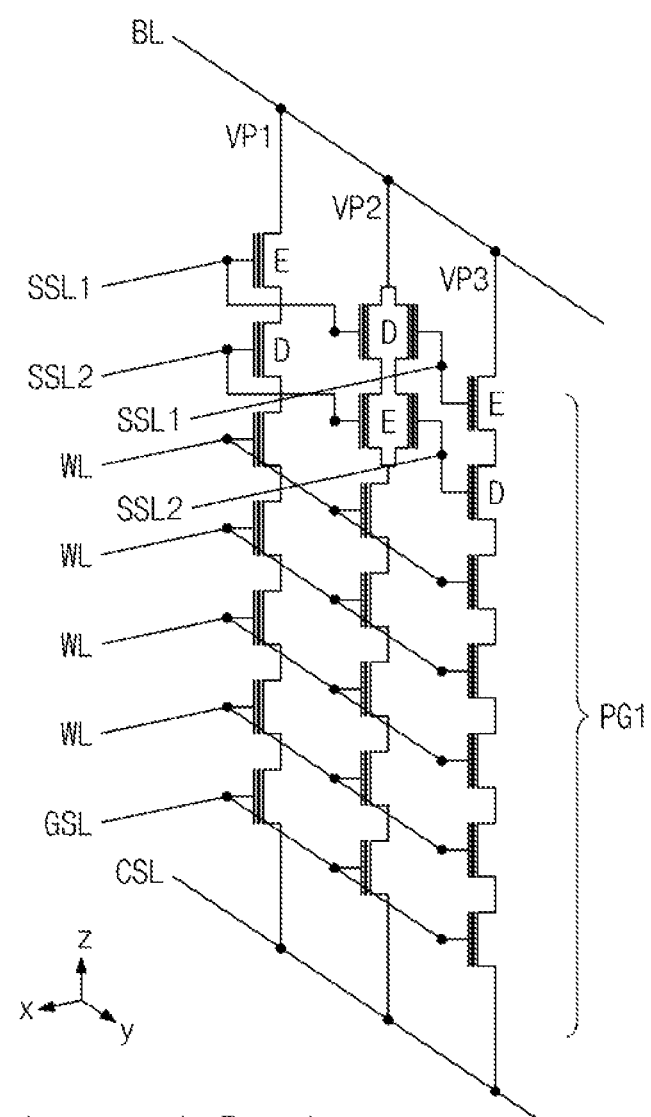

According to an exemplary embodiment of the inventive concept, as shown in FIGS. 4, 6, and 8, each of odd-numbered ones (hereinafter, first pillar groups PG1) of the pillar groups PG may include three vertical patterns, and each of even-numbered ones (hereinafter, second pillar groups PG2) may include two vertical patterns. For example, each of the first pillar groups PG1 may include a pair of vertical patterns, which are disposed at left and right sides, respectively, of the inner cutting region SLCR, and a vertical pattern passing through the inner cutting region SLCR. Each of the second pillar groups PG2 may include a pair of vertical patterns, which are disposed at left and right sides, respectively, of the inner cutting region SLCR.

Referring to FIGS. 4 and 5 in conjunction with FIG. 3, bit lines BL may cross the horizontal electrode structure HES. Each of the bit lines BL may be provided on the corresponding one of the pillar groups PG. For example, each of the pillar groups PG may be connected to the corresponding one of the bit lines BL. For example, each of the odd-numbered ones of the bit lines BL may be connected in common to three vertical patterns (e.g., constituting the first pillar group PG1) penetrating one horizontal electrode structure HES. Each of the even-numbered ones of the bit lines BL may be connected in common to two vertical patterns (e.g., constituting the second pillar group PG2) penetrating one horizontal electrode structure HES. The bit lines BL may be electrically connected to the vertical patterns VP by plugs PLG interposed therebetween.

The string selection lines SSL1 and SSL2 may be used as gate electrodes of string selection transistors for controlling electric connections between the vertical patterns VP and the bit lines BL. According to an exemplary embodiment of the inventive concept, each of the string selection transistors may be operated as a depletion-mode or enhancement-mode transistor. As shown in FIG. 5, the string selection transistors, in each of the first and second pillar groups PG1 and PG2, may have inversion symmetry, thus constituting the first string selection structure of FIG. 1. The string selection transistors of the first pillar group PG1 and the second pillar group PG2 may have mirror symmetry with respect to the inner cutting region SLCR.

As described above, each of the first pillar groups PG1 may include one vertical pattern (hereinafter, a center pattern VP2) passing through the inner cutting region SLCR. As shown in FIG. 5, the center pattern VP2 may be shared by the first string selection structures of the first and second pillar groups PG1 and PG2.

Figure 7:
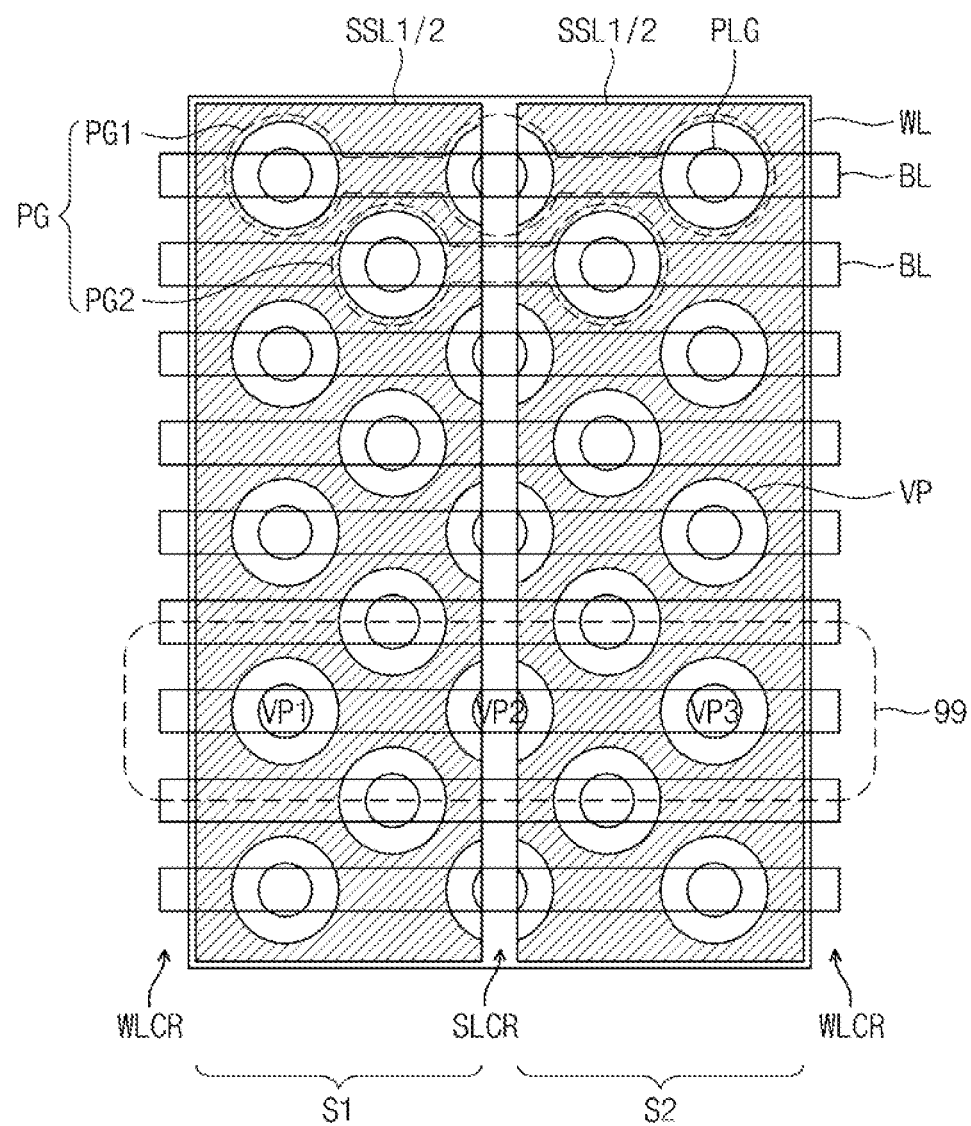
FIGS. 7 and 8, respectively, are a plan view and a circuit diagram illustrating a string selection structure that can be used in a three-dimensional semiconductor device of FIG. 6, according to an exemplary embodiment of the inventive concept.

FIG. 6 is a perspective view illustrating a three-dimensional semiconductor device according to an exemplary embodiment of the inventive concept. FIGS. 7 and 8, respectively, are a plan view and a circuit diagram illustrating a string selection structure that can be used in the three-dimensional semiconductor device of FIG. 6, according to an exemplary embodiment of the inventive concept. FIG. 6 may correspond to a portion of FIG. 7 depicted by dotted lines 99.

Referring to FIG. 6, according to an exemplary embodiment of the inventive concept, the horizontal electrode structure HES may have substantially the same technical features as the horizontal electrode structure HES described above with reference to FIG. 3. The pillar groups PG may have substantially the same arrangement as the pillar groups PG described above with reference to FIG. 3. However, according to an exemplary embodiment of the inventive concept, the inner cutting region SLCR may partially cut some of the vertical patterns VP. For example, an upper portion of each of the center patterns VP2 of the first pillar groups PG1 may be partially cut by the inner cutting region SLCR. By partially cutting the center patterns, the string selection line SSL1 may be separated from the string selection line SSL2 or the first and second unit structures S1 and S2 may be operated independently from each other.

According to an exemplary embodiment of the inventive concept, as shown in FIG. 8, the string selection transistors constituting the first string selection structure may have an inverted structure of the structure shown in FIG. 5. For example, the first string selection structures respectively shown in FIG. 8 and FIG. 5 may have mirror symmetry in the vertical direction. However, the first string selection structure is not limited thereto. For example, the first string selection structure shown in FIG. 8 may be substantially the same as the structure described above with reference to FIG. 5.

Figure 9:
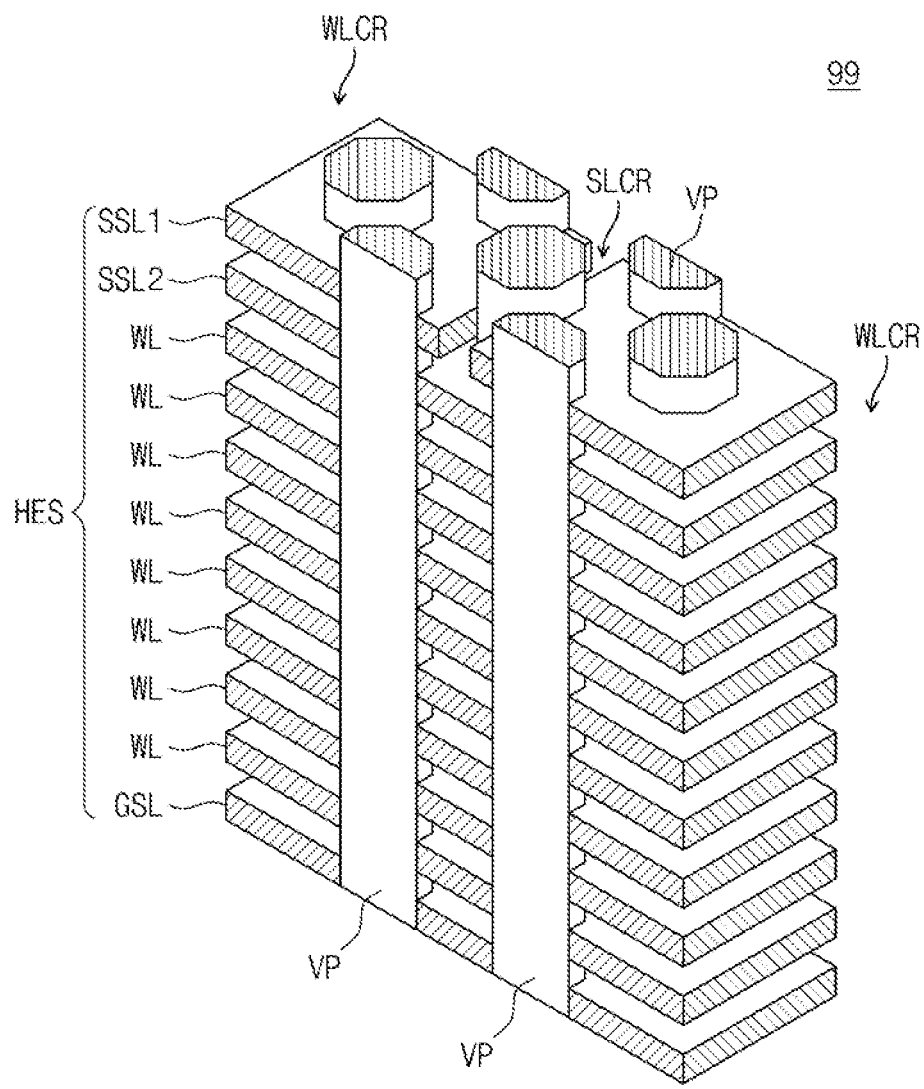
FIG. 9 is a perspective view illustrating a three-dimensional semiconductor device according to an exemplary embodiment of the inventive concept.
Figure 10:
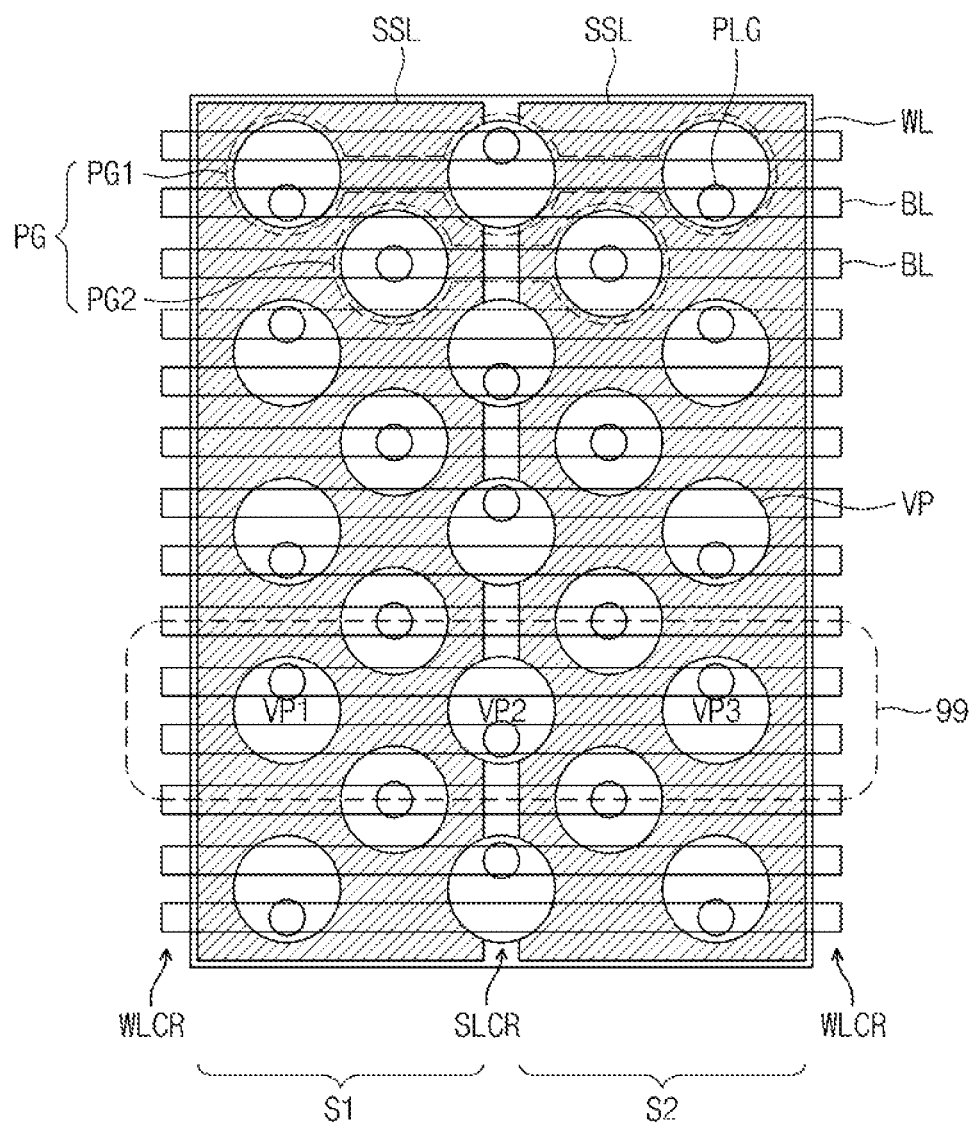
FIGS. 10 and 11, respectively, are a plan view and a circuit diagram illustrating a string selection structure that can be used in the three-dimensional semiconductor device of FIG. 9, according to an exemplary embodiment of the inventive concept.
Figure 11:
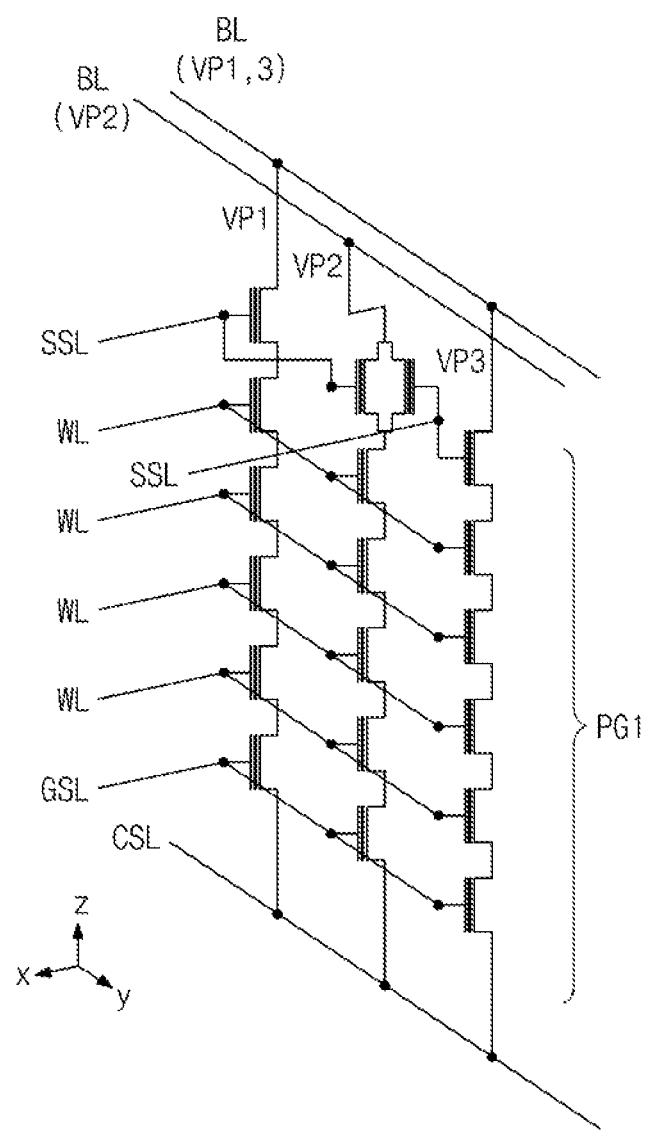
Figure 12:
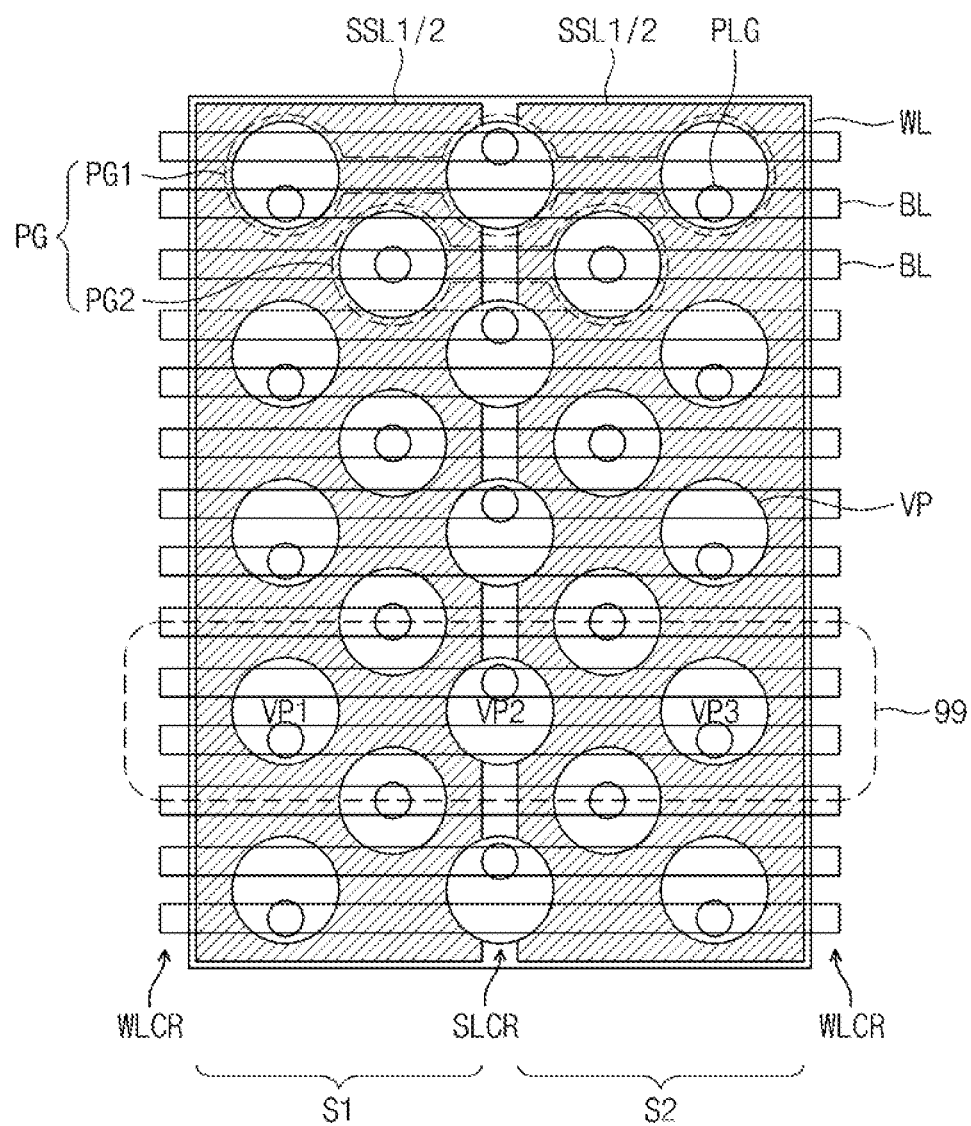
FIG. 12 is a plan view illustrating a string selection structure that can be used in the three-dimensional semiconductor device of FIG. 9, according to an exemplary embodiment of the inventive concept.

FIG. 9 is a perspective view illustrating a three-dimensional semiconductor device according to an exemplary embodiment of the inventive concept FIGS. 10 and 11, respectively, are a plan view and a circuit diagram illustrating a string selection structure that can be used in the three-dimensional semiconductor device of FIG. 9, according to an exemplary embodiment of the inventive concept. FIG. 12 is a plan view illustrating a string selection structure that can be used in the three-dimensional semiconductor device of FIG. 9, according to an exemplary embodiment of the inventive concept. FIG. 9 may correspond to a portion of FIG. 10 or 12 depicted by dotted lines 99.

Referring to FIG. 9, according to an exemplary embodiment of the inventive concept, the horizontal electrode structure HES may include string selection lines SSL that are provided as a single layer structure. Accordingly, each of the first and second unit structures S1 and S2 may include one string selection line SSL. The bottom of the inner cutting region SLCR may be lower than the bottom surfaces of the string selection lines SSL. Accordingly, the inner cutting region SLCR may define inner sidewalls of the string selection lines SSL. For example, the string selection lines SSL of the first and second unit structures S1 and S2 may be horizontally spaced apart from each other by the inner cutting region SLCR. Other features of the horizontal electrode structure HES shown in FIG. 9 may be substantially the same as the horizontal electrode structure HES described above with reference to FIG. 3.

Referring to FIGS. 10 and 11 in conjunction with FIG. 9, bit lines BL may cross the horizontal electrode structure HES. Each of the bit lines BL may be provided on the corresponding one of the pillar groups PG. For example, each of the pillar groups PG may be connected to the corresponding one of the bit lines BL. According to an exemplary embodiment of the inventive concept, when viewed in plan view, at least one of the pillar groups PG may overlap a plurality of the bit lines BL. For example, as shown in FIG. 10, a pair of bit lines (hereinafter, first bit lines) may be provided on each of the first pillar groups PG1, and one bit line (hereinafter, a second bit line) may be provided on each of the second pillar groups PG2. In an exemplary embodiment of the inventive concept, all or some of the bit lines BL each may have a width that is smaller than half the width of each vertical pattern VP.

One of the first bit lines may be connected to the center pattern VP2 of the first pillar group PG1, which penetrates the inner cutting region SLCR, and the others of the first bit lines may be connected, in common, to the pair of the vertical patterns of the first pillar group PG1, which penetrate the first and second unit structures S1 and S2, respectively. Similarly, the second bit line may be connected, in common, to the pair of the vertical patterns of the second pillar group PG2, which penetrate the first and second unit structures S1 and S2, respectively.

Since the string selection lines SSL of the first and second unit structures S1 and S2 are horizontally separated by the inner cutting region SLCR, a pair of the vertical patterns VP that are connected in common to one of the bit lines BL may be operated independently from each other. Since the center pattern VP2 and other vertical patterns of the first pillar group PG1 adjacent thereto are connected to the first bit lines that are different from each other, the second string selection structure of FIG. 2 may be used to connect them selectively and electrically to the first bit lines, as shown in FIG. 11. For example, each of the first pillar groups PG1 may constitute a pair of the second string selection structures, by which the center pattern VP2 is shared.

Referring back to FIG. 10, the plugs PLG may have mirror symmetry with respect to the second pillar group PG2, when viewed in plan view. The plugs PLG may have mirror symmetry with respect to the inner cutting region SLCR. Exemplary embodiments of the inventive concept are not limited thereto. For example, when viewed in plan view, the plugs PLG may have translational symmetry with respect to the second pillar group PG2, as shown in FIG. 12.

Figure 13:
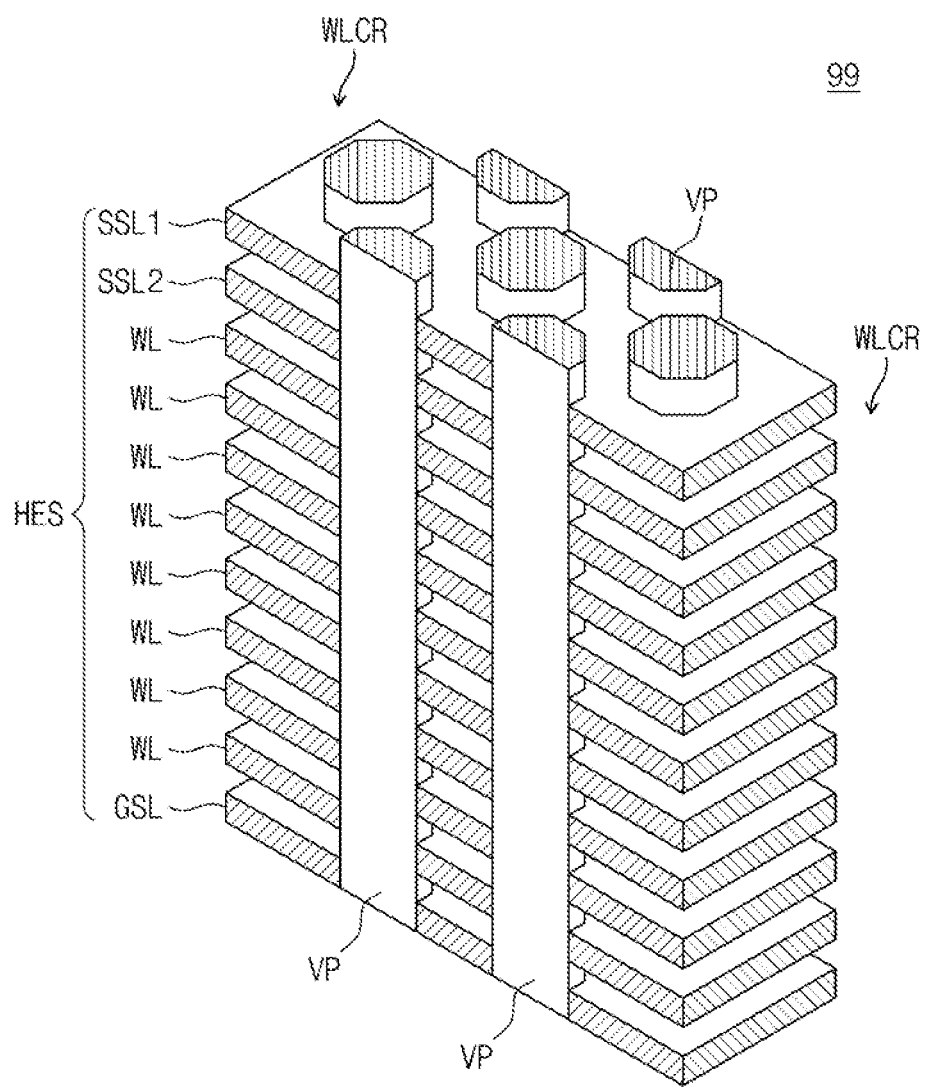
FIG. 13 is a perspective view illustrating a three-dimensional semiconductor device according to an exemplary embodiment of the inventive concept.
Figure 14:
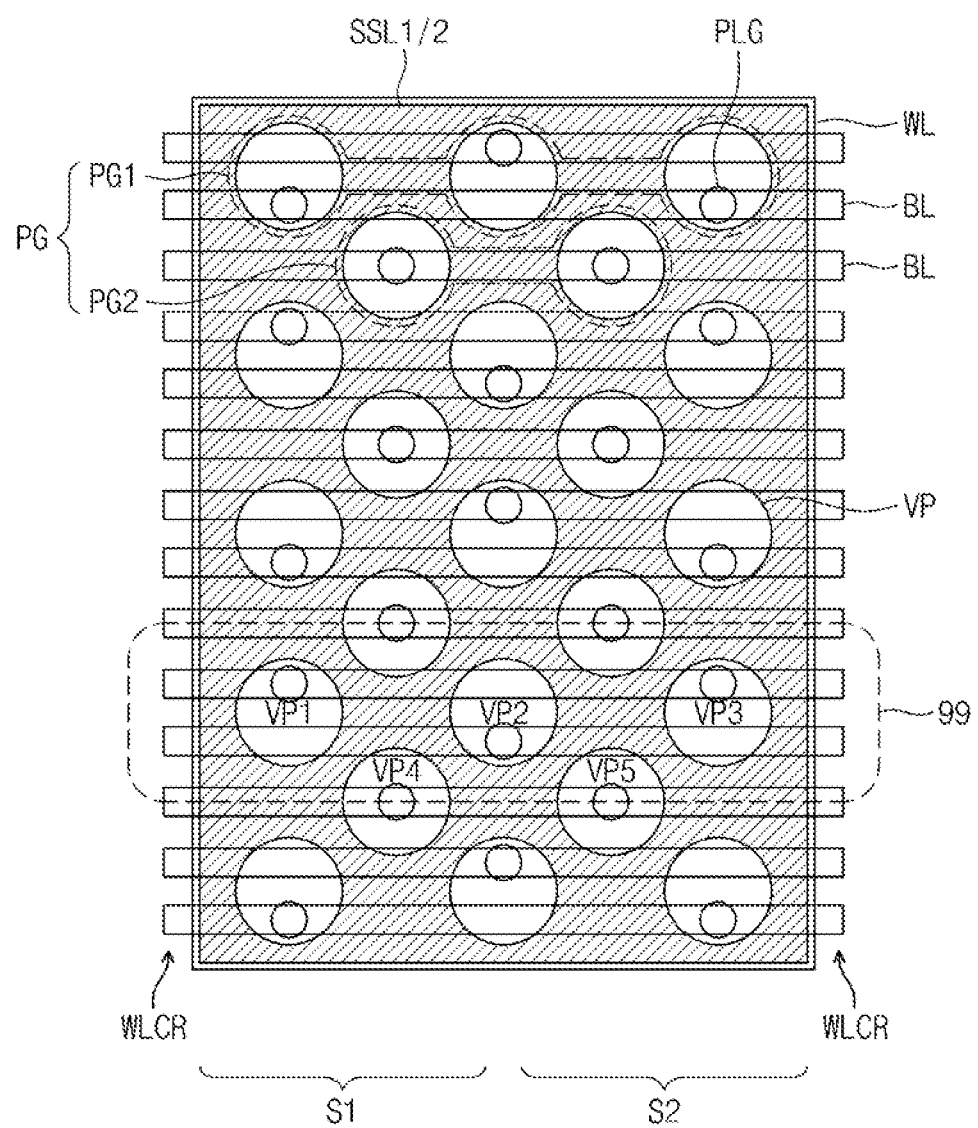
FIGS. 14 and 15, respectively, are a plan view and a circuit diagram illustrating a string selection structure that can be used in the three-dimensional semiconductor device of FIG. 13, according to an exemplary embodiment of the inventive concept.
Figure 15:
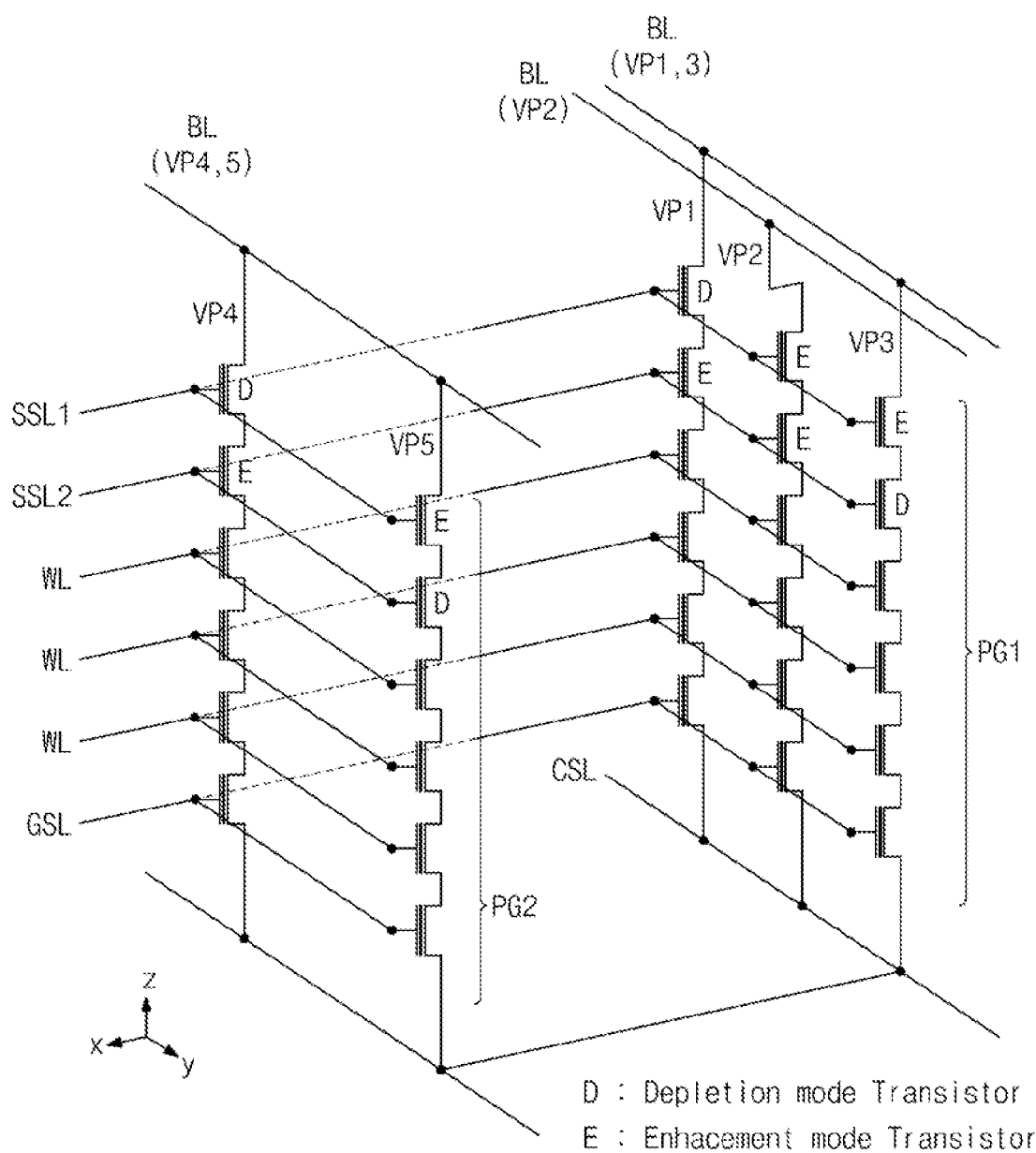
Figure 16:
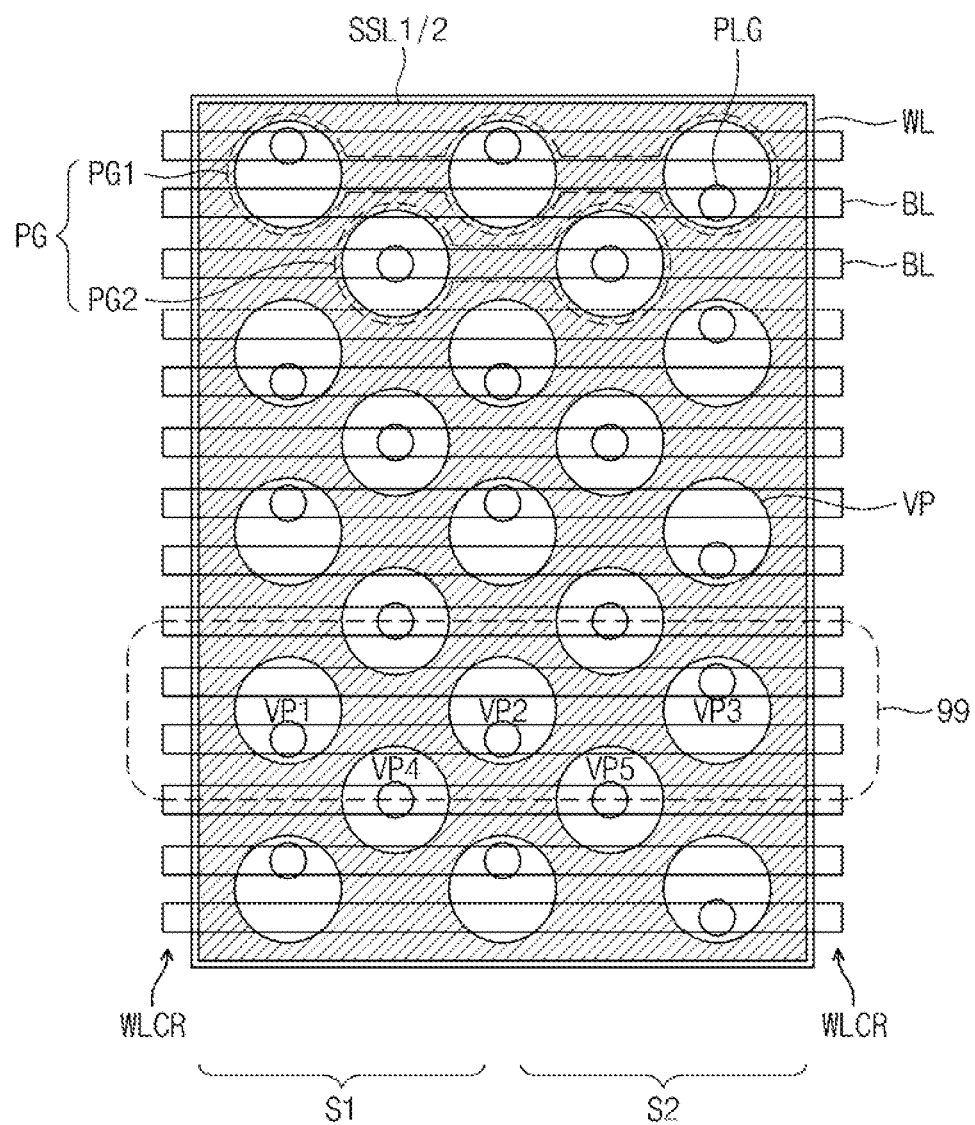
FIGS. 16 and 17, respectively, are a plan view and a circuit diagram illustrating a string selection structure that can be used in the three-dimensional semiconductor device of FIG. 13, according to an exemplary embodiment of the inventive concept.
Figure 17:
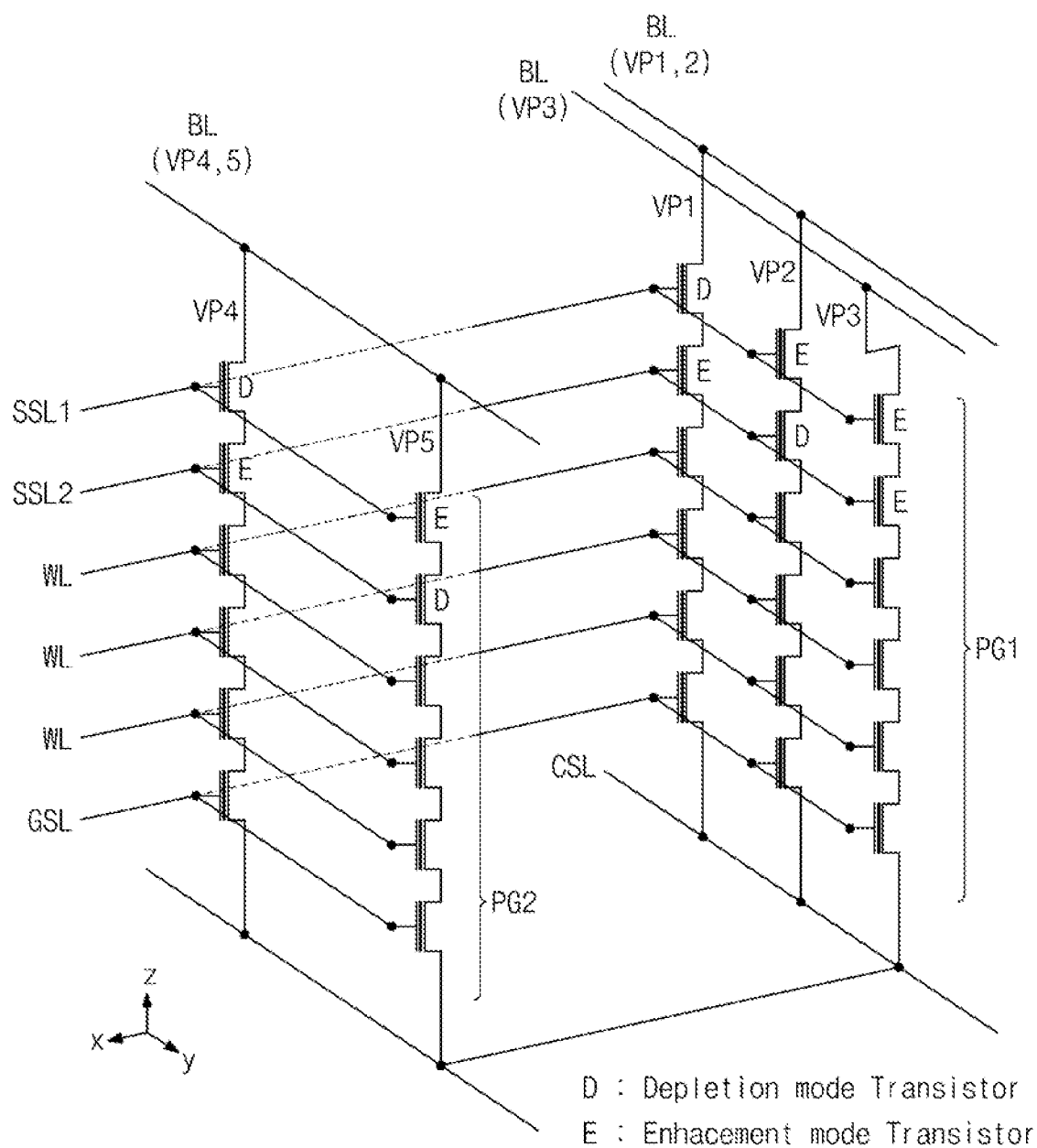
Figure 18:
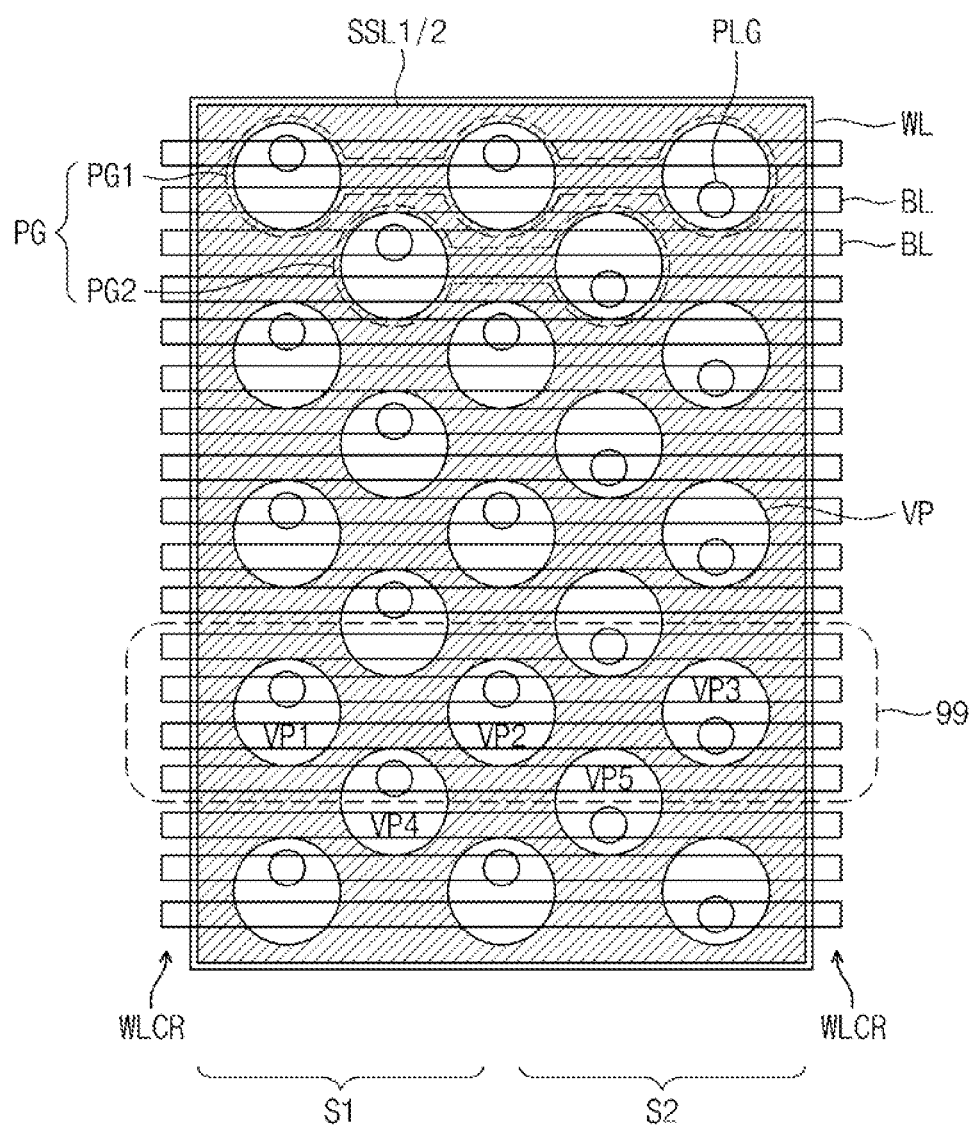
FIGS. 18 and 19, respectively, are a plan view and a circuit diagram illustrating a string selection structure that can be used in the three-dimensional semiconductor device of FIG. 13, according to an exemplary embodiment of the inventive concept.
Figure 19:
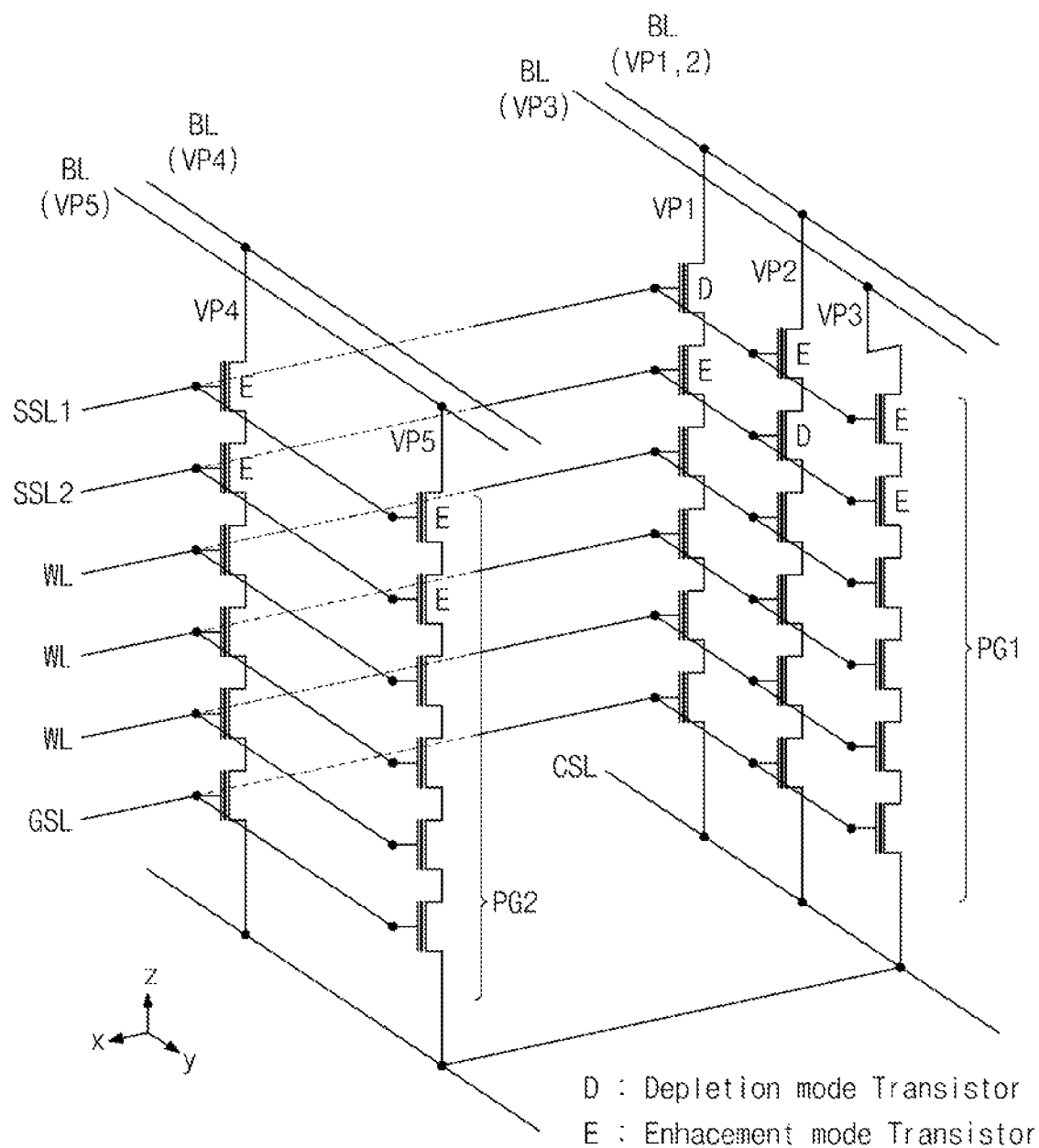

FIG. 13 is a perspective view illustrating a three-dimensional semiconductor device according to an exemplary embodiment of the inventive concept. FIGS. 14 and 15, respectively, are a plan view and a circuit diagram illustrating a string selection structure that can be used in the three-dimensional semiconductor device of FIG. 13, according to an exemplary embodiment of the inventive concept. FIGS. 16 and 17, respectively, are a plan view and a circuit diagram illustrating a string selection structure that can be used in the three-dimensional semiconductor device of FIG. 13, according to an exemplary embodiment of the inventive concept. FIGS. 18 and 19, respectively, are a plan view and a circuit diagram illustrating a string selection structure that can be used in the three-dimensional semiconductor device of FIG. 13, according to an exemplary embodiment of the inventive concept. FIG. 13 may correspond to a portion of FIG. 14, 16, or 18 depicted by dotted lines 99.

Referring to FIG. 13, according to an exemplary embodiment of the inventive concept, in the horizontal electrode structure HES, the inner cutting region SLCR is not provided. For example, the string selection lines SSL1 and SSL2 may have substantially the same shape as the word lines WL, when viewed in plan view. Alternatively, the string selection lines SSL1 and SSL2 may be different from the word lines WL in terms of a connection structure with an external wire. For example, as will be described with reference to FIGS. 56 through 63, the word lines WL and the string selection lines SSL1 and SSL2 may have a stepwise or terraced structure, when viewed in a vertical section view.

Since there is no inner cutting region SLCR, the string selection lines SSL1 and SSL2 of the horizontal electrode structure HES may be separated from each other in the vertical direction alone, but not in the horizontal direction. The first and second string selection structures that have been described above with reference to FIGS. 1 and 2, respectively, may be used individually or in combination, and thus, each of the vertical patterns VP may be selectively connected to the corresponding one of the bit lines.

For example, as shown in FIGS. 15 and 17, the vertical patterns VP4 and VP5 of the second pillar group PG2 may constitute the first string selection structure, thus achieving the selective connection. As shown in FIG. 19, the vertical patterns VP4 and VP5 of the second pillar group PG2 may constitute the second string selection structure, and thus, the selective connection can be achieved.

For the first pillar group PG1, as shown in FIG. 15, two vertical patterns VP1 and VP3 may constitute the first string selection structure for the selective connection, while a vertical pattern VP2 may be connected to the corresponding one of the first bit lines through a pair of enhancement-mode transistors E that are connected in series to each other.

In an exemplary embodiment of the inventive concept, as shown in FIGS. 17 and 19, for the first pillar group PG2, two adjacent vertical patterns VP1 and VP2 may constitute the first string selection structure for realizing the afore-described selective connection, while a vertical pattern VP3 may be connected to the corresponding one of the first bit lines through a pair of enhancement-mode transistors E that are connected in series to each other.

Figure 20:
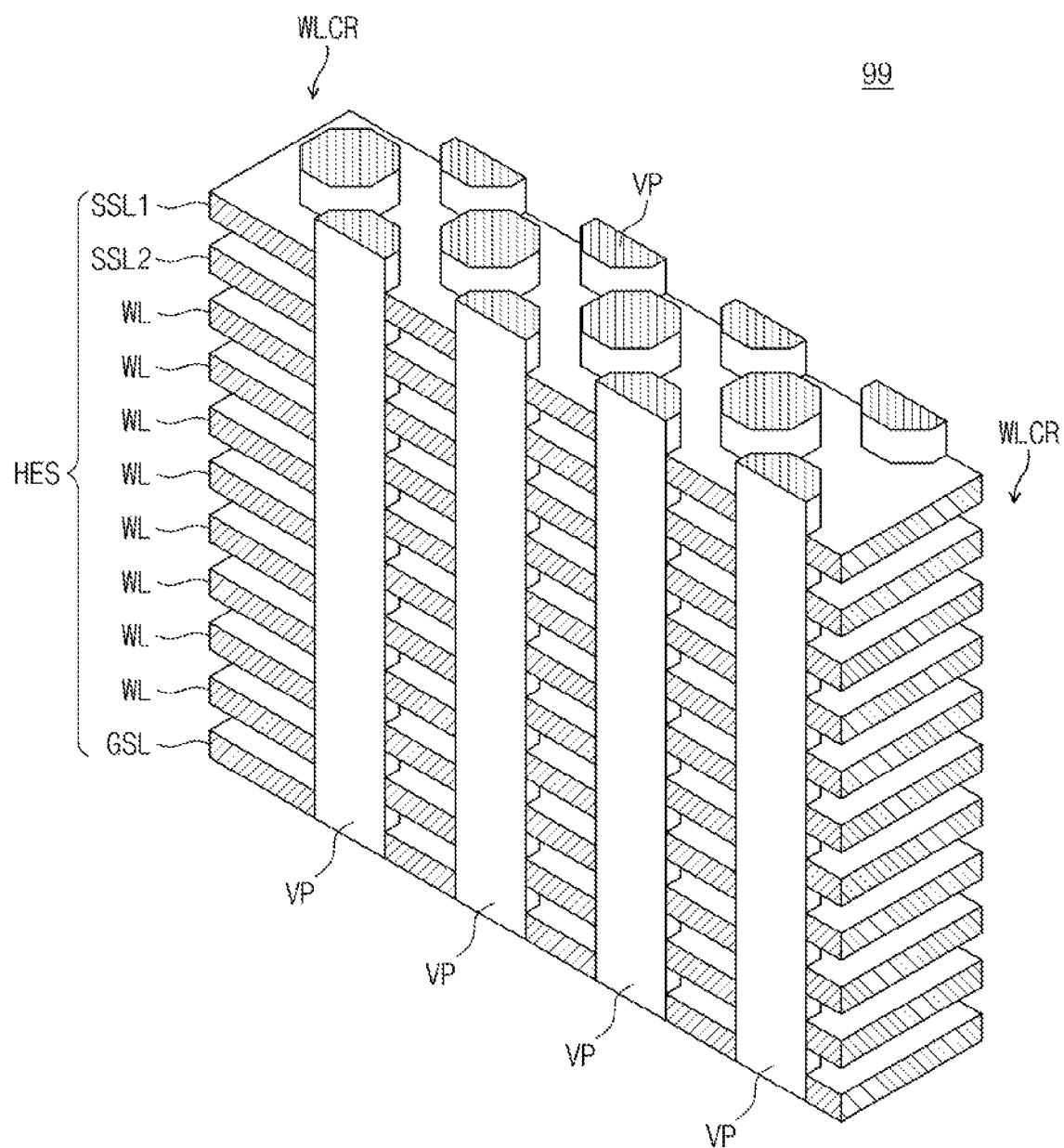
FIG. 20 is a perspective view illustrating a three-dimensional semiconductor device according to an exemplary embodiment of the inventive concept.
Figure 21:
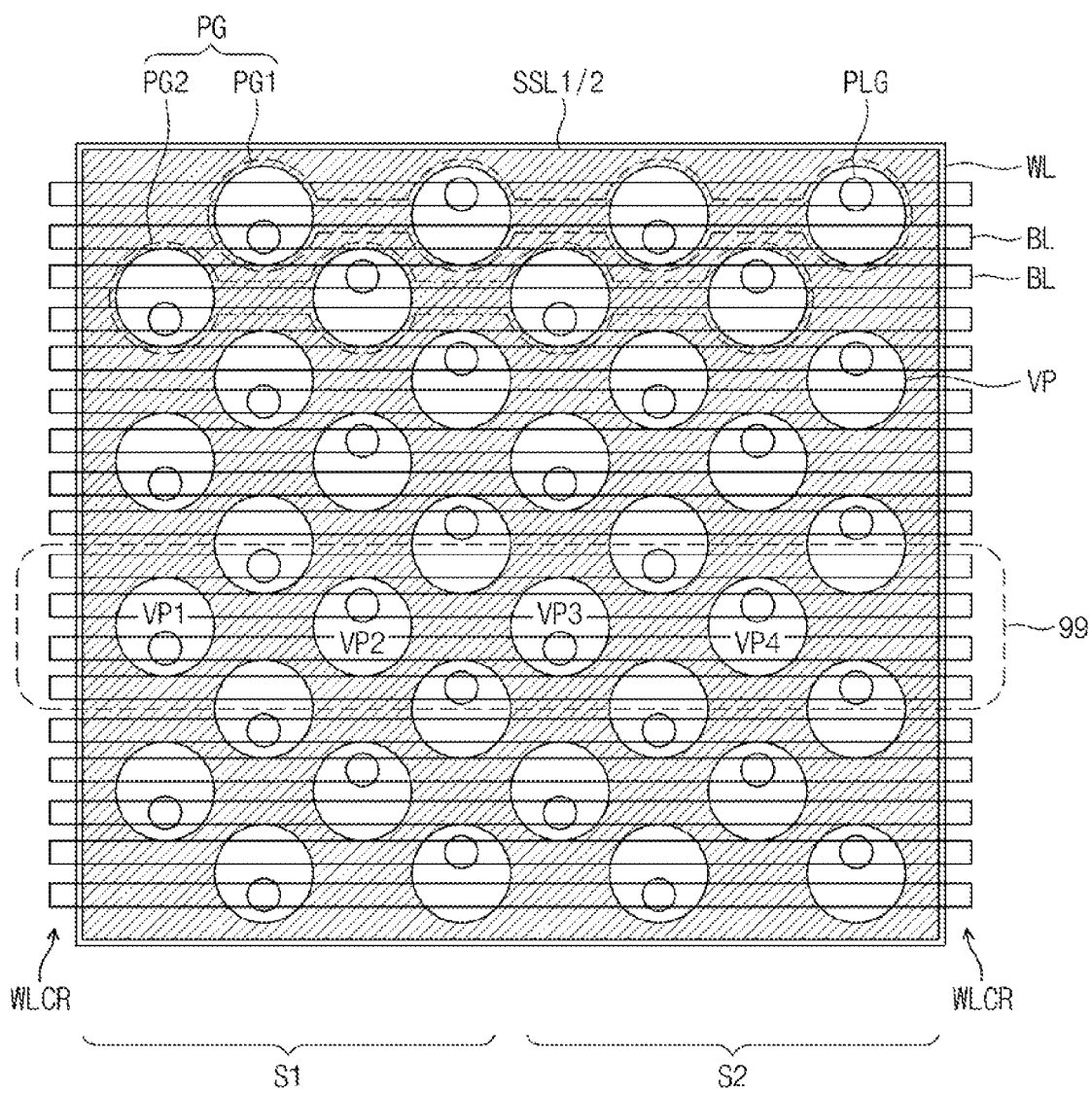
FIGS. 21 and 22, respectively, are a plan view and a circuit diagram illustrating a string selection structure that can be used in the three-dimensional semiconductor device of FIG. 20, according to an exemplary embodiment of the inventive concept.
Figure 22:
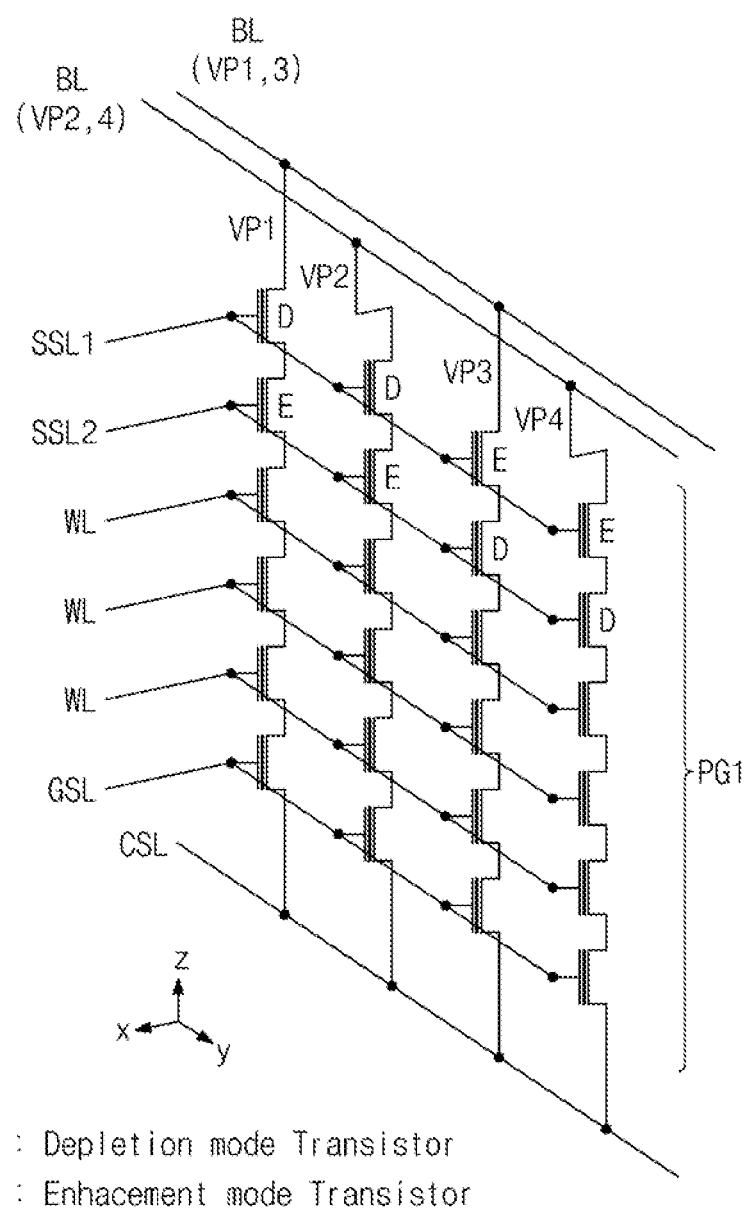

FIG. 20 is a perspective view illustrating a three-dimensional semiconductor device according to an exemplary embodiment of the inventive concept, and FIGS. 21 and 22, respectively, are a plan view and a circuit diagram illustrating a string selection structure that can be used in the three-dimensional semiconductor device of FIG. 20. FIG. 20 may correspond to a portion of FIG. 21 depicted by dotted lines 99.

Referring to FIG. 20, according to an exemplary embodiment of the inventive concept, in the horizontal electrode structure HES, the inner cutting region SLCR is not provided. For example, the string selection lines SSL1 and SSL2 may have substantially the same shape as the word lines WL, when viewed in plan view. However, in an exemplary embodiment of the inventive concept, the string selection lines SSL1 and SSL2 may be different from the word lines WL in terms of a connection structure with an external wire. For example, as will be described with reference to FIGS. 56 through 63, the word lines WL and the string selection lines SSL1 and SSL2 may have a stepwise or terraced structure, when viewed in a vertical section view.

According to an exemplary embodiment of the inventive concept, each pillar group PG may include four vertical patterns VP, as shown in FIG. 21, and two bit lines BL may be provided on each of the pillar groups PG.

As shown in FIGS. 21 and 22, in each of the pillar groups PG, each of the bit lines BL may be connected to a pair of the vertical patterns VP. For example, one of the bit lines BL may be connected to odd-numbered ones VP1 and VP3 of the vertical patterns VP, and the other may be connected to even-numbered ones VP2 and VP4 of the vertical patterns VP. The odd-numbered vertical patterns VP1 and VP3 may constitute the first string selection structure of FIG. 1, and similarly, the even-numbered vertical patterns VP2 and VP4 may constitute the first string selection structure of FIG. 1.

According to an exemplary embodiment of the inventive concept, one of the bit lines BL may be connected to the first and second vertical patterns VP1 and VP2 constituting the first string selection structure, and the other of the bit lines BL may be connected to the third and fourth vertical patterns VP3 and VP4 constituting the first string selection structure.

Figure 23:
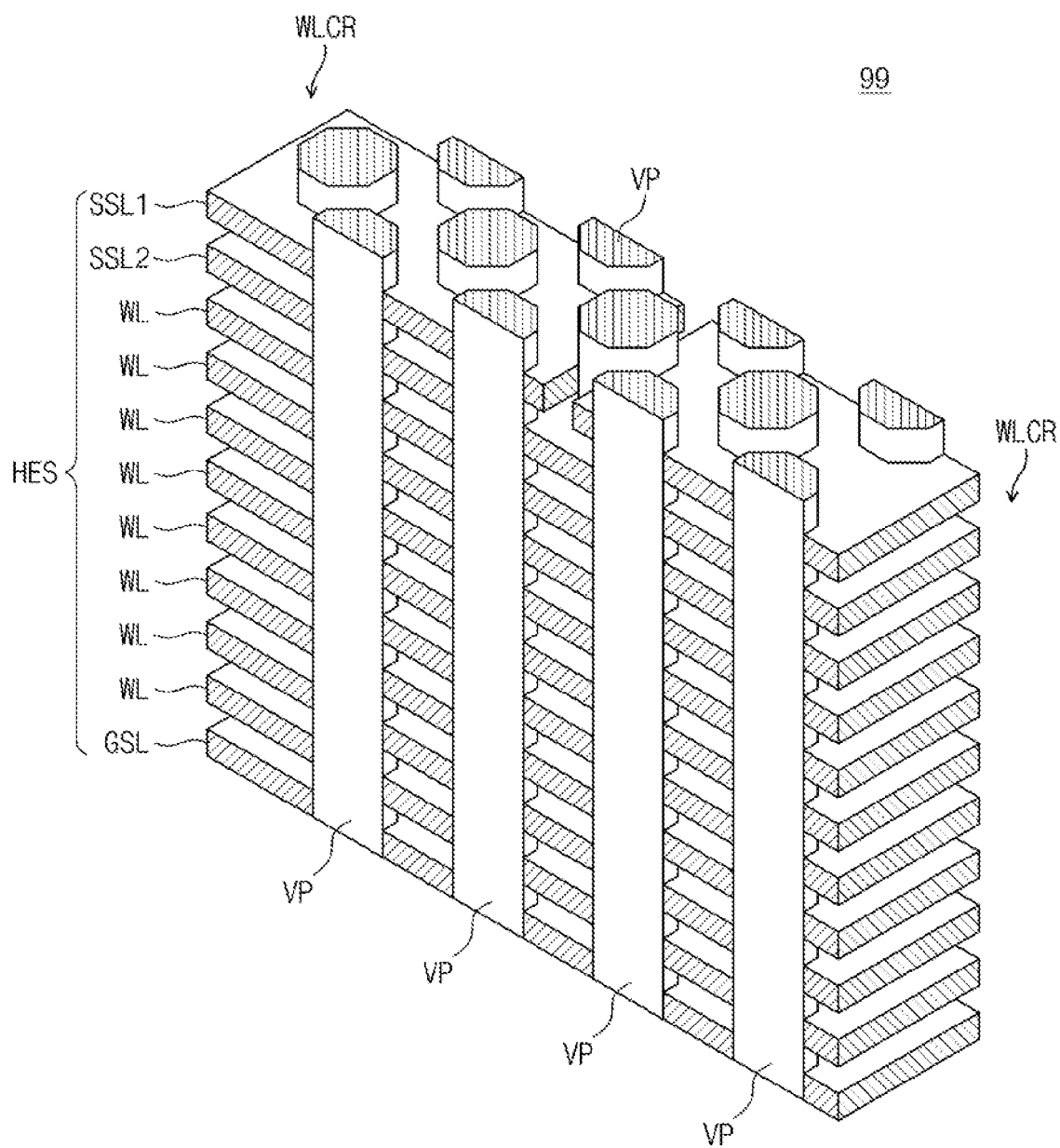
FIG. 23 is a perspective view illustrating a three-dimensional semiconductor device according to an exemplary embodiment of the inventive concept.
Figure 24:
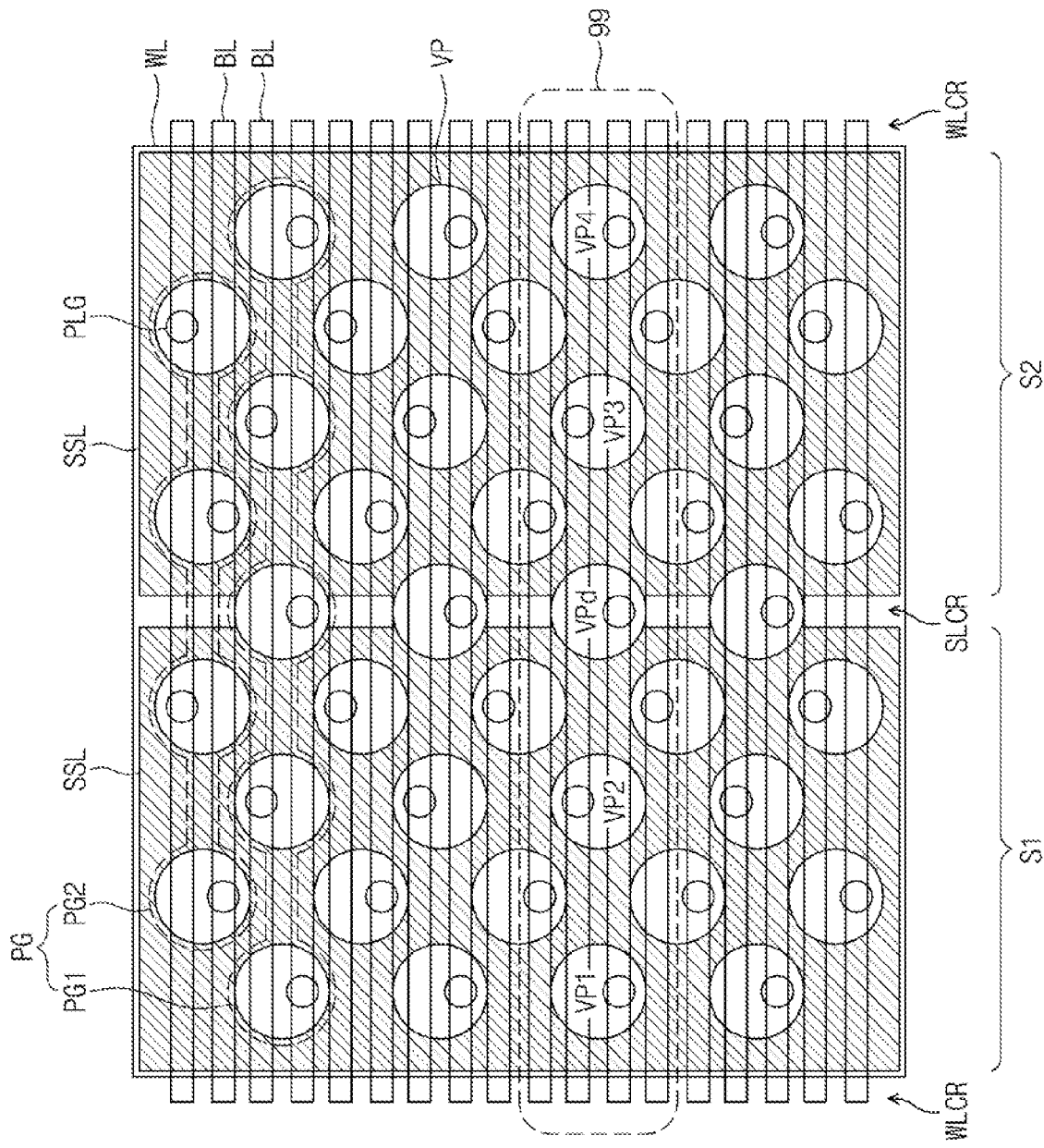
FIGS. 24 and 25, respectively, are a plan view and a circuit diagram illustrating a string selection structure that can be used in the three-dimensional semiconductor device of FIG. 23, according to an exemplary embodiment of the inventive concept.
Figure 25:
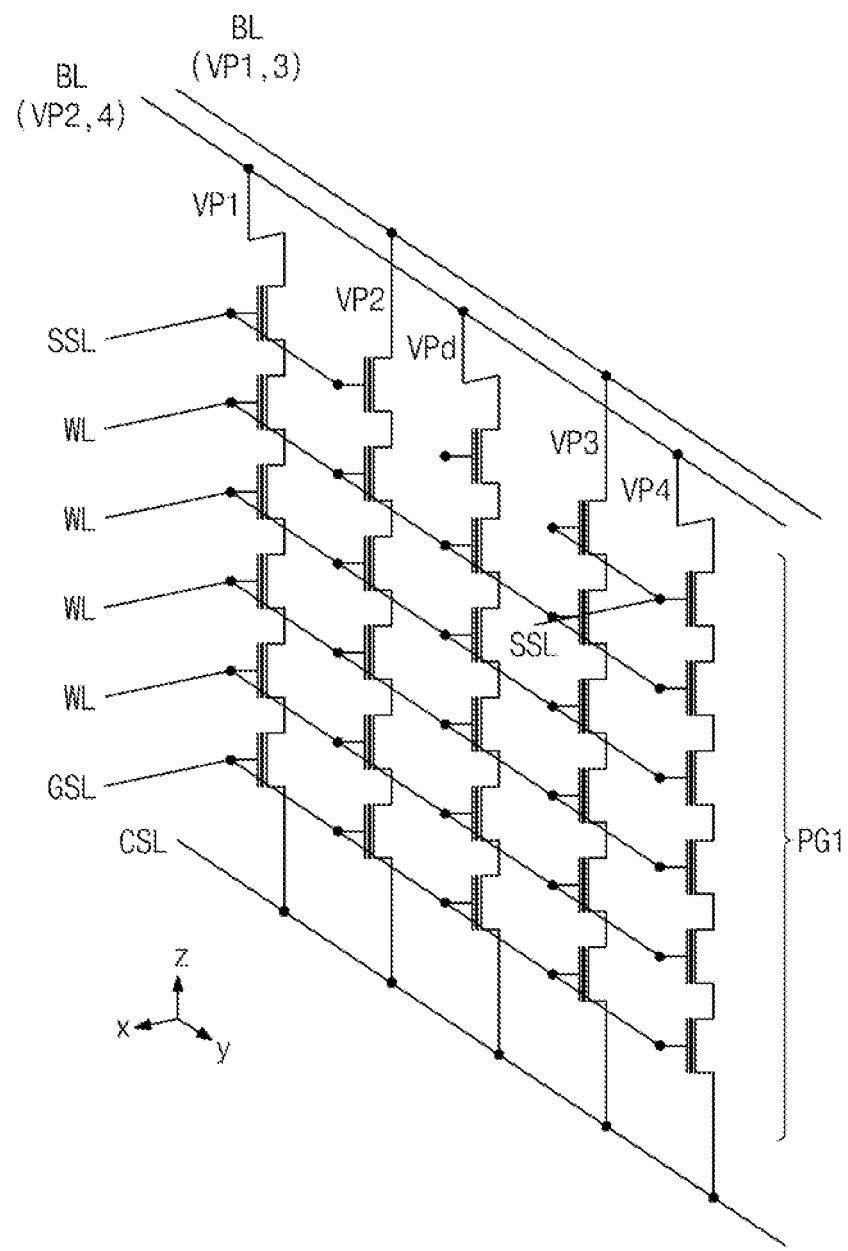
Figure 26:
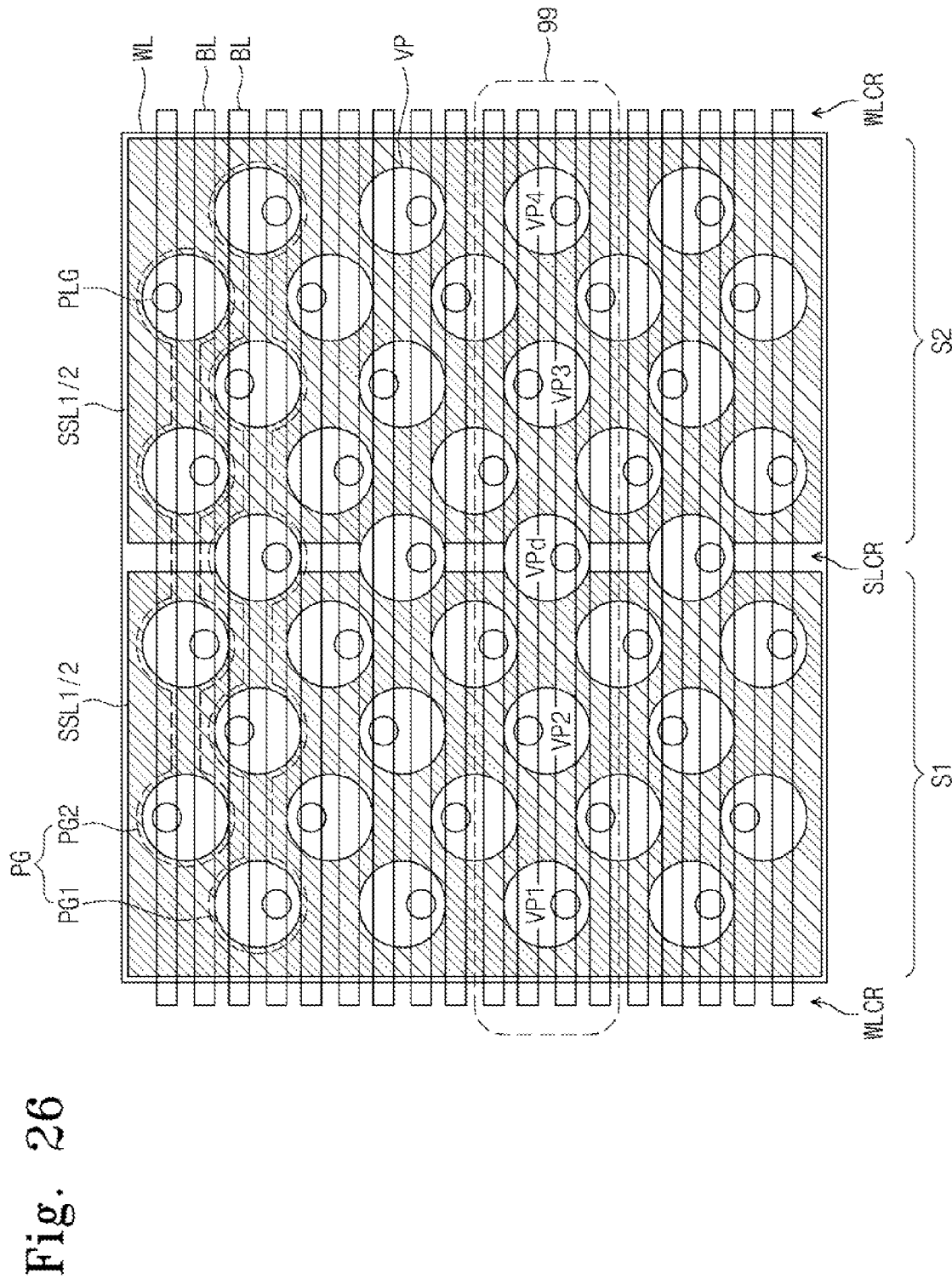
FIG. 26 is a plan view illustrating a string selection structure that can be used in the three-dimensional semiconductor device of FIG. 23, according to an exemplary embodiment of the inventive concept.

FIG. 23 is a perspective view illustrating a three-dimensional semiconductor device according to an exemplary embodiment of the inventive concept. FIGS. 24 and 25, respectively, are a plan view and a circuit diagram illustrating a string selection structure that can be used in the three-dimensional semiconductor device of FIG. 23, according to an exemplary embodiment of the inventive concept. FIG. 26 is a plan view illustrating a string selection structure that can be used in the three-dimensional semiconductor device of FIG. 23, according to an exemplary embodiment of the inventive concept. FIG. 23 may correspond to a portion of FIG. 24 or 26 depicted by dotted lines 99.

Referring to FIG. 23, according to an exemplary embodiment of the inventive concept, the horizontal electrode structure HES may include string selection lines SSL that are provided as a single layer structure. Accordingly, each of the first and second unit structures S1 and S2 may include one string selection line SSL. The bottom of the inner cutting region SLCR may be lower than the bottom surfaces of the string selection lines SSL. Accordingly, the inner cutting region SLCR may define inner sidewalls of the string selection lines SSL. For example, the string selection lines SSL of the first and second unit structures S1 and S2 may be horizontally spaced apart from each other by the inner cutting region SLCR.

According to an exemplary embodiment of the inventive concept, as shown in FIGS. 24 and 26, each of the first pillar groups PG1 may include five vertical patterns VP, each of the second pillar groups PG2 may include four vertical patterns VP, and two bit lines BL may be provided on each of the pillar groups PG.

As shown in FIGS. 24 and 25, in each of the first pillar groups PG1, one of the first bit lines BL may be connected to a pair (e.g., VP2 and VP3) of the vertical patterns VP penetrating the first and second unit structures S1 and S2, respectively, and the other of the first bit lines BL may be connected to another pair (e.g., VP1 and VP4) of the vertical patterns VP penetrating the first and second unit structures S1 and S2, respectively, and the center pattern VPd going through the inner cutting region SLCR.

In each of the second pillar groups PG2, each of the second bit lines BL may be connected to a pair of the vertical patterns VP penetrating the first and second unit structures S1 and S2, respectively. For example, one of the second bit lines BL may be connected to odd-numbered ones VP1 and VP3 of the vertical patterns VP, and the other thereof may be connected to even-numbered ones VP2 and VP4 of the vertical patterns VP.

As shown in FIG. 26, according to an exemplary embodiment of the inventive concept, one of the second bit lines BL may be connected to the first and fourth ones VP1 and VP4 of the vertical patterns VP constituting the second string selection structure, and similarly, the other of the second bit lines BL may be connected to the second and third ones VP2 and VP3 of the vertical patterns VP constituting the second string selection structure.

In each of the first and second pillar groups PG1 and PG2, a pair (e.g., VP1 and VP2) of the vertical patterns VP penetrating the first unit structure S1 may constitute the second string selection structure of FIG. 2. Similarly, a pair (e.g., VP3 and VP4) of the vertical patterns VP penetrating the second unit structure S2 may constitute the second string selection structure of FIG. 2.

Figure 27:
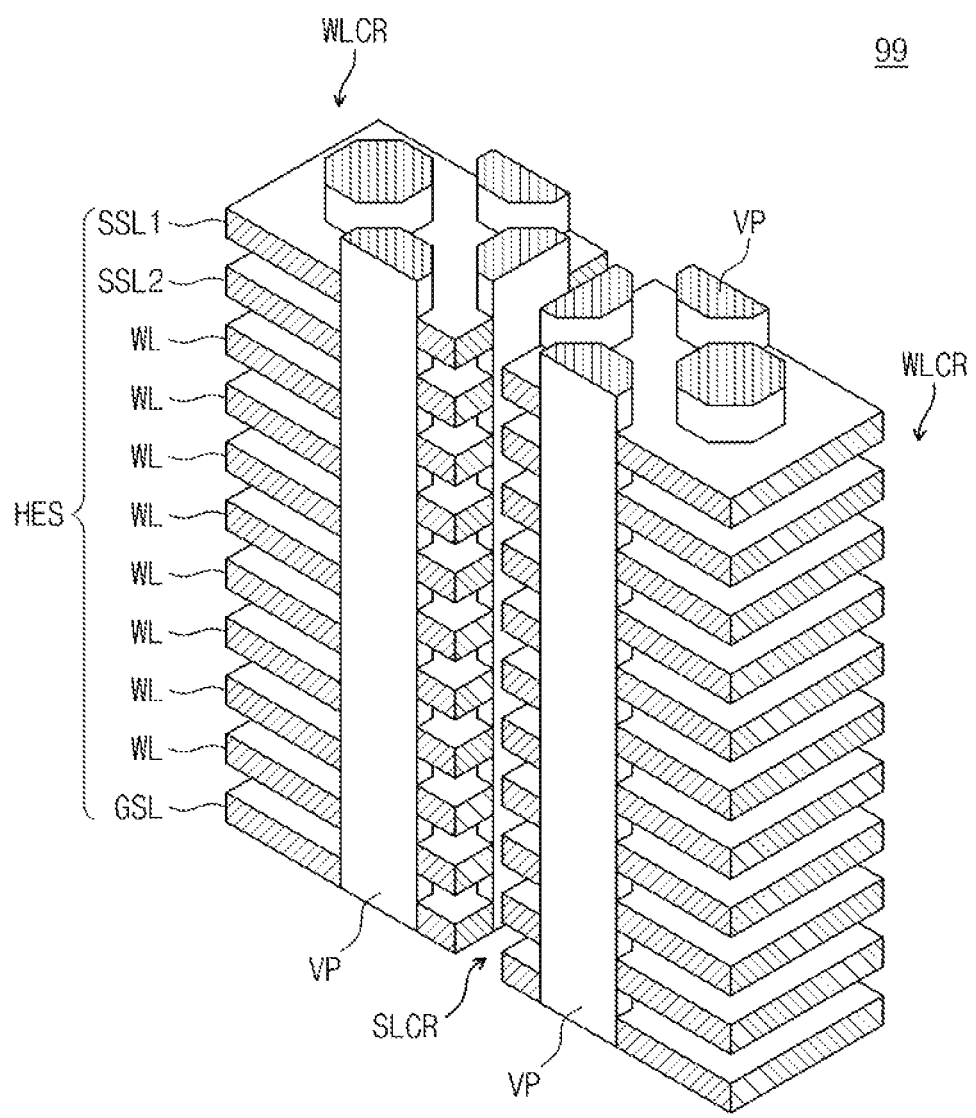
FIG. 27 is a perspective view illustrating a three-dimensional semiconductor device according to an exemplary embodiment of the inventive concept.
Figure 28:
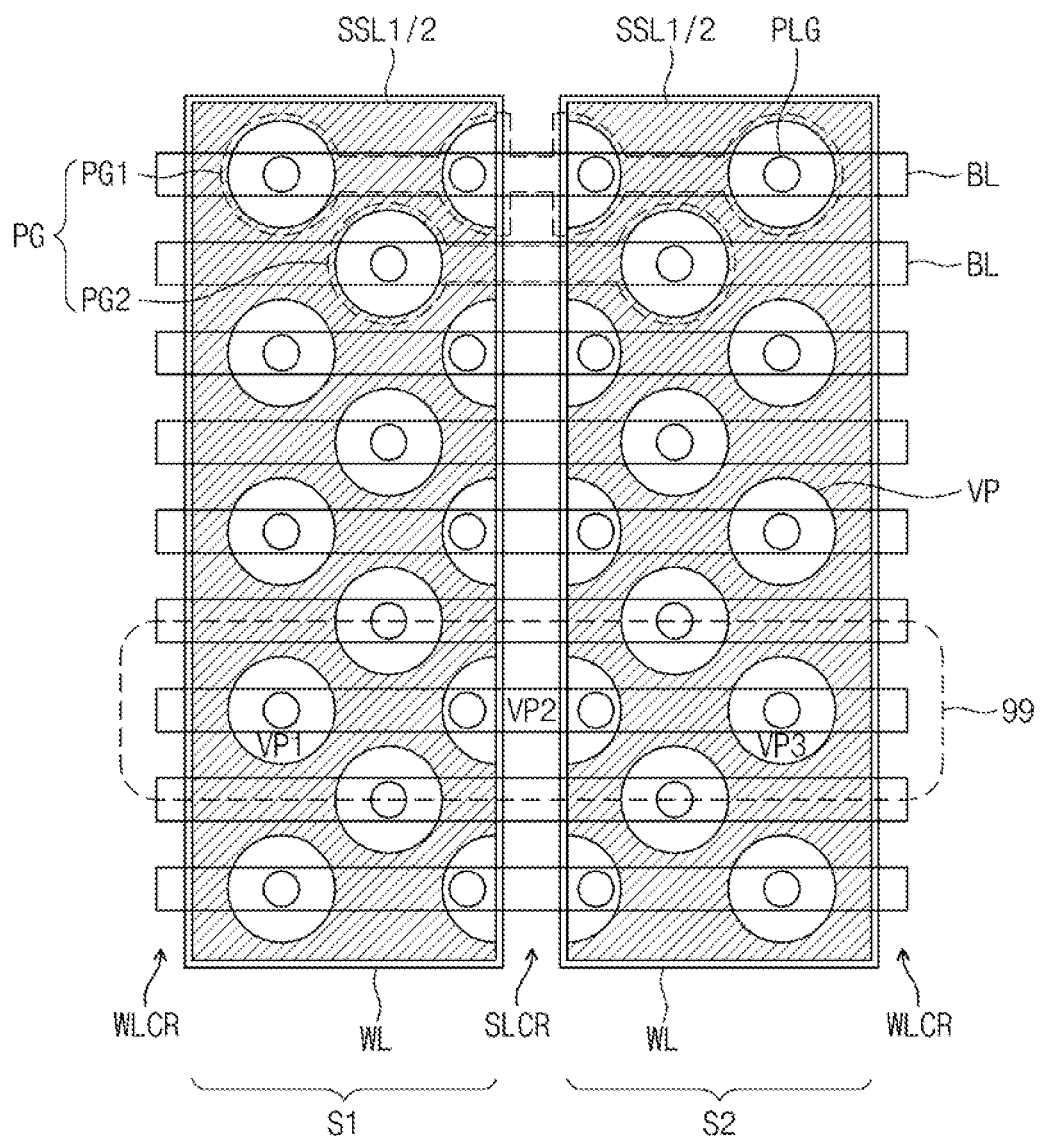
FIGS. 28 and 29, respectively, are a plan view and a circuit diagram illustrating a string selection structure that can be used in the three-dimensional semiconductor device of FIG. 27, according to an exemplary embodiment of the inventive concept.
Figure 29:
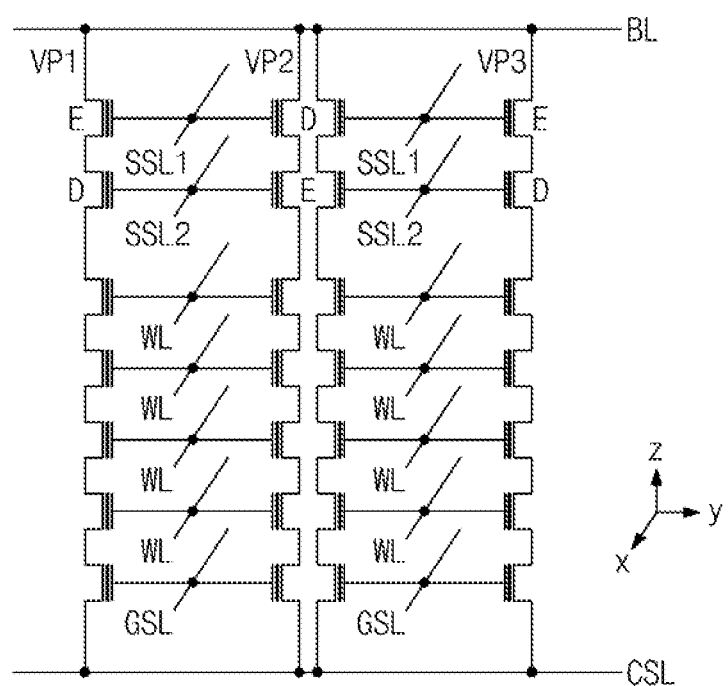
Figure 30:
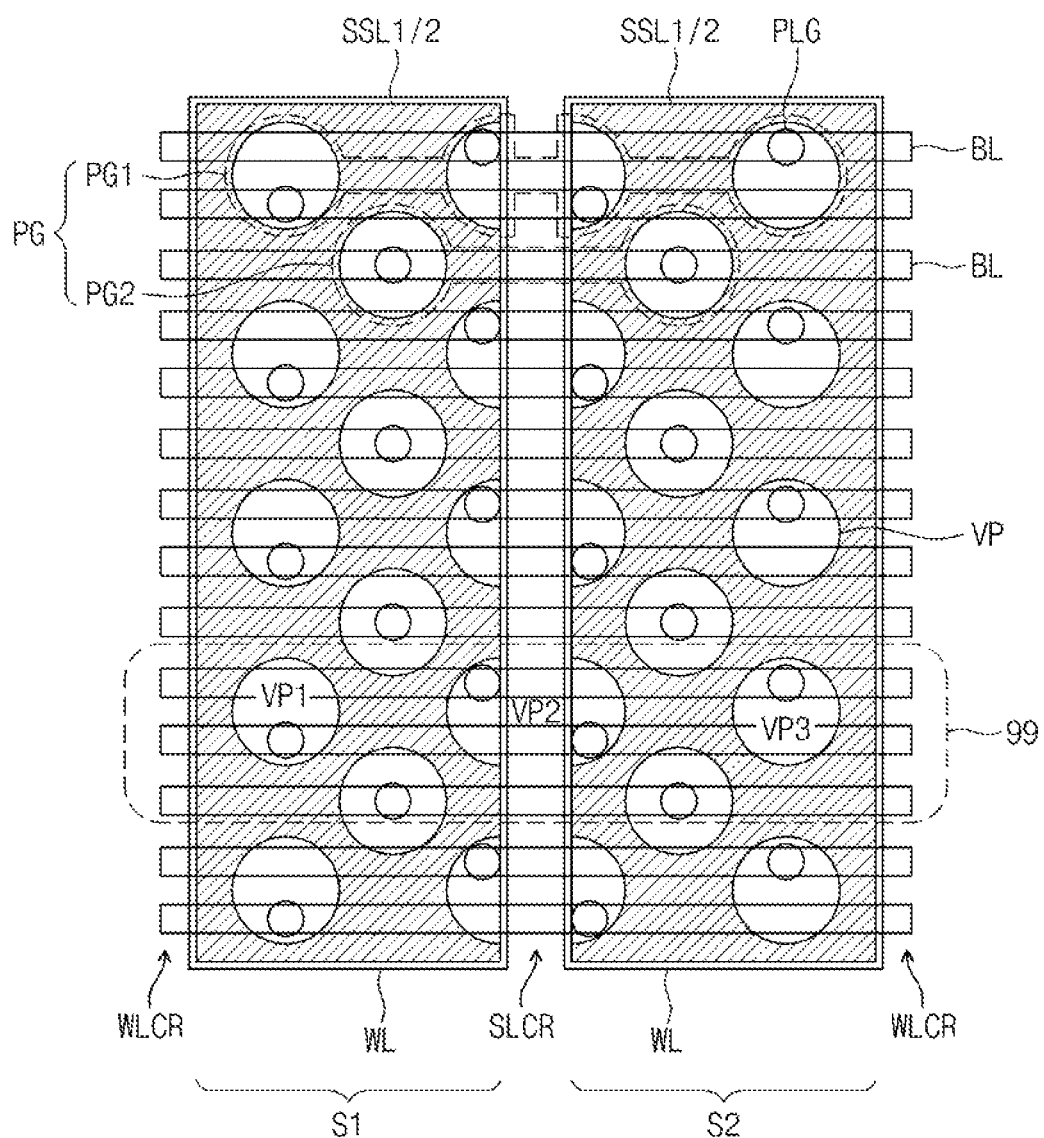
FIGS. 30 and 31, respectively, are a plan view and a circuit diagram illustrating a string selection structure that can be used in the three-dimensional semiconductor device of FIG. 27, according to an exemplary embodiment of the inventive concept.
Figure 31:
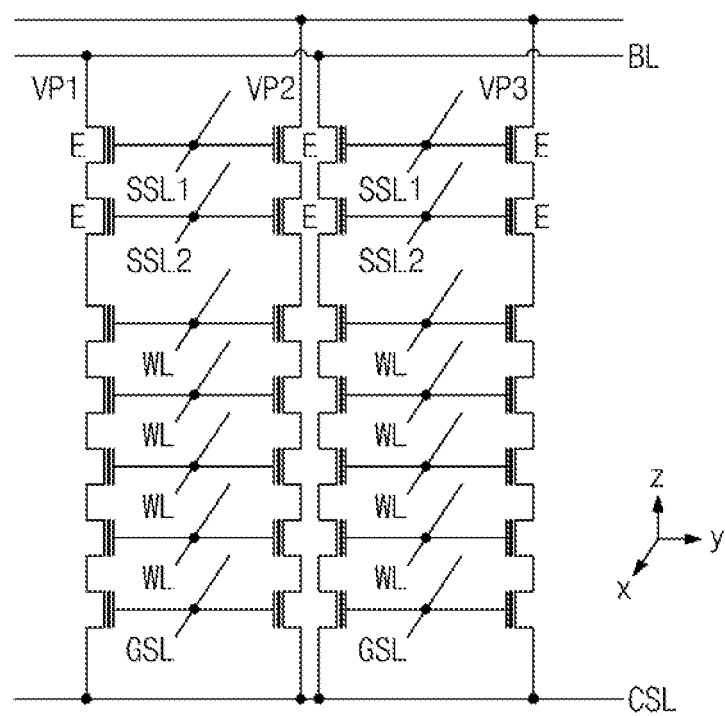
Figure 32:
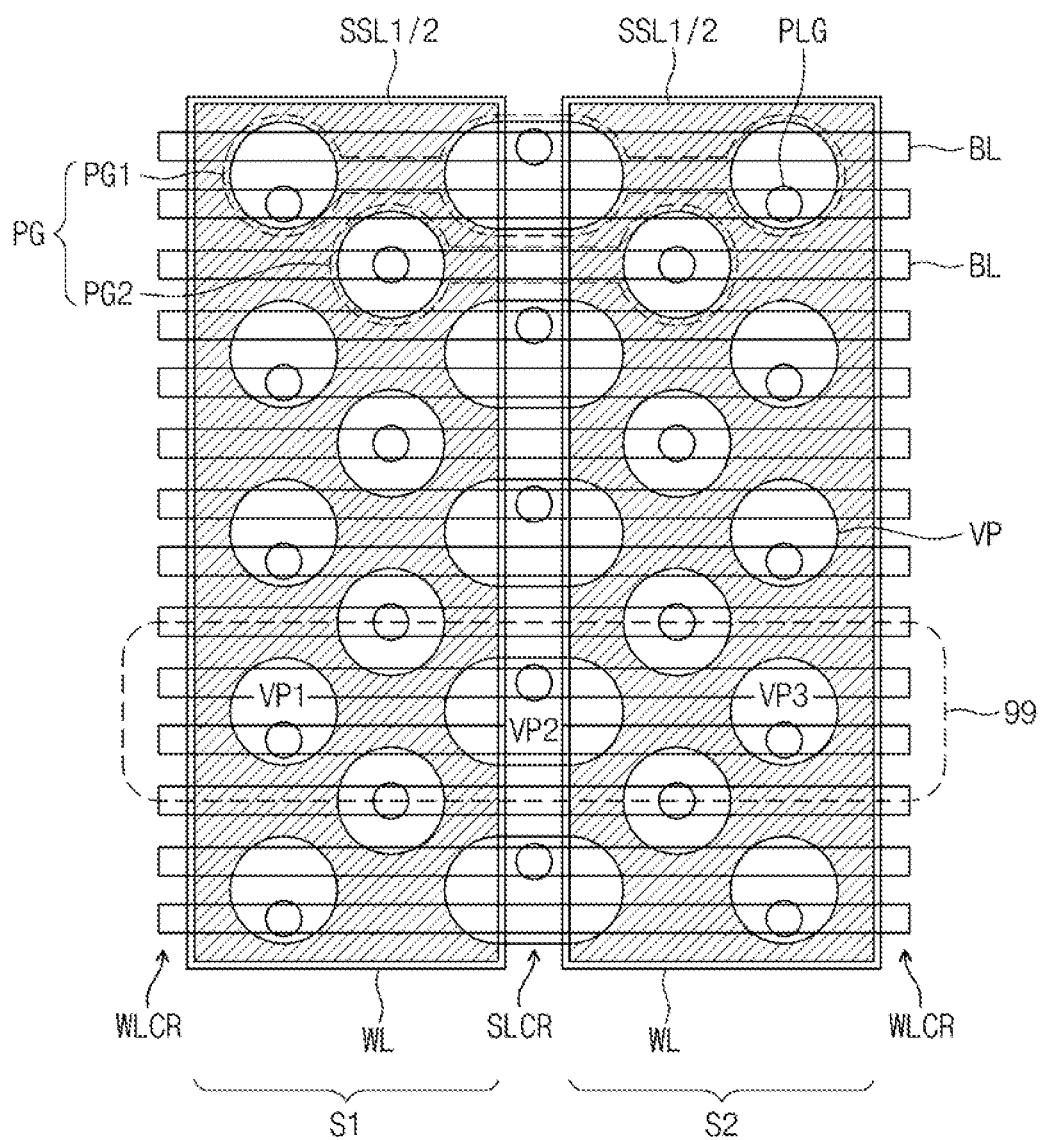
FIGS. 32 and 33 are plan views illustrating a string selection structure that can be used in the three-dimensional semiconductor device of FIG. 27, according to an exemplary embodiment of the inventive concept.
Figure 33:
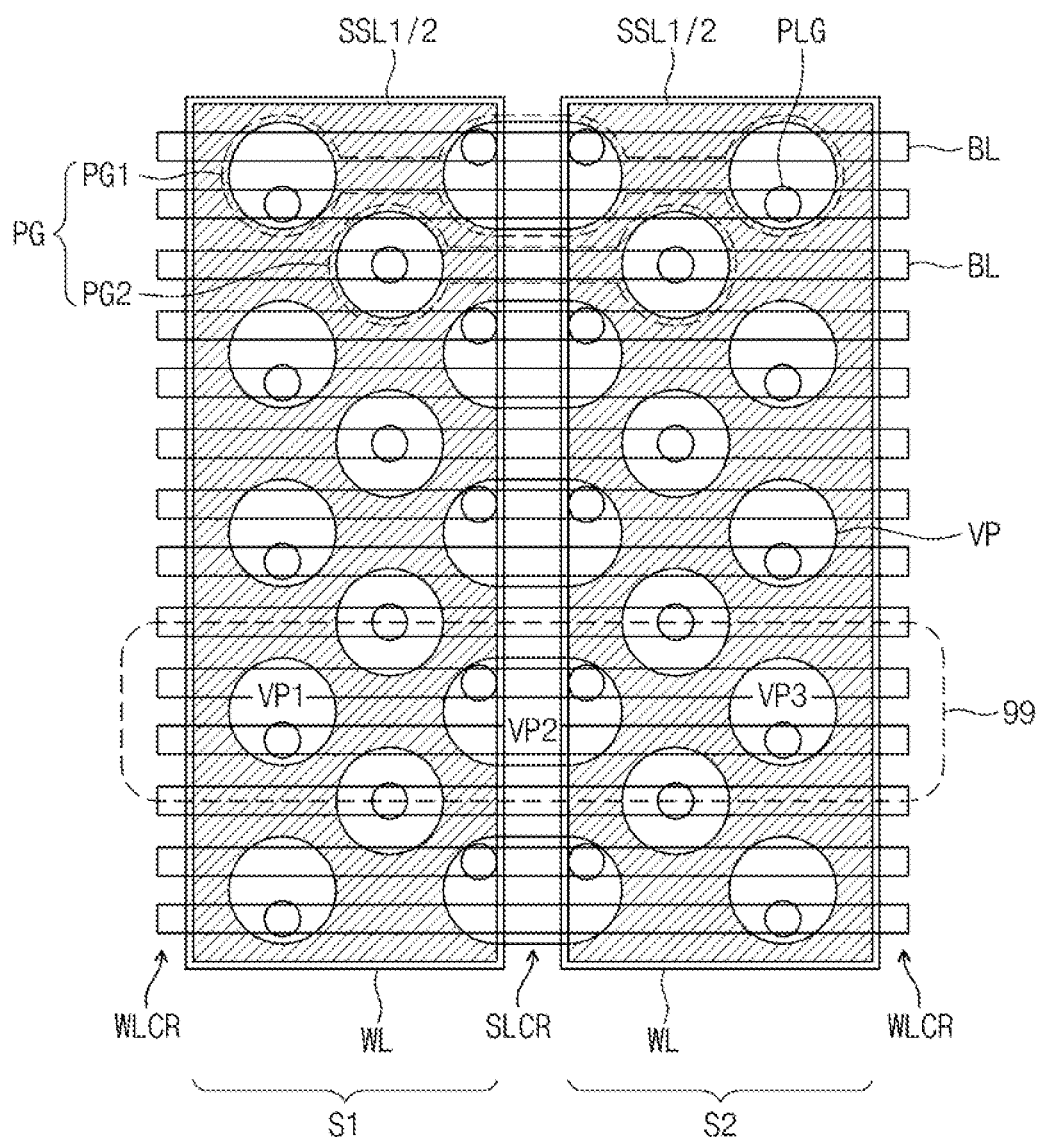
Figure 34:
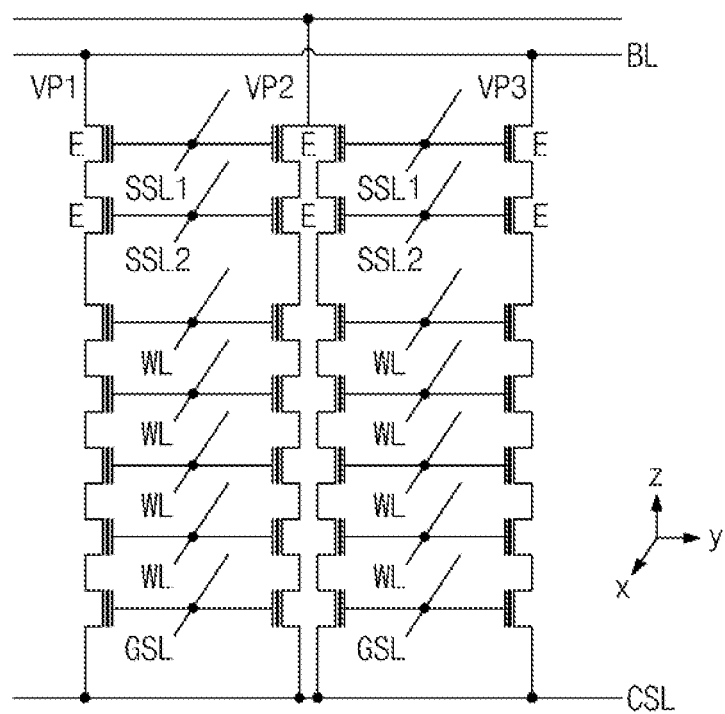
FIG. 34 is a circuit diagram illustrating a string selection structure that can be used in the three-dimensional semiconductor device of FIG. 27, according to an exemplary embodiment of the inventive concept.
Figure 35:
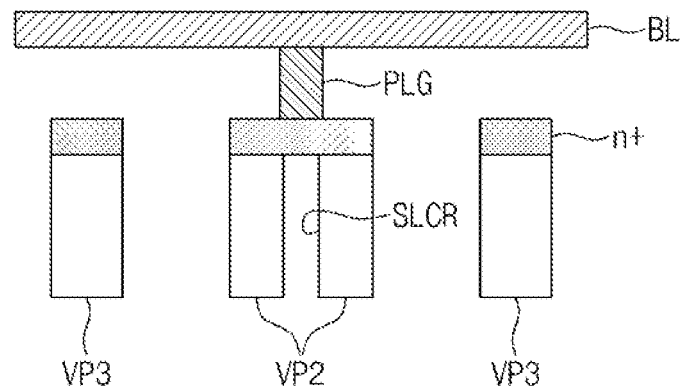
FIGS. 35 and 36 are sectional views illustrating wiring structures that can be used to realize the three-dimensional semiconductor devices of FIGS. 32 and 33, respectively, according to exemplary embodiments of the inventive concept.
Figure 36:
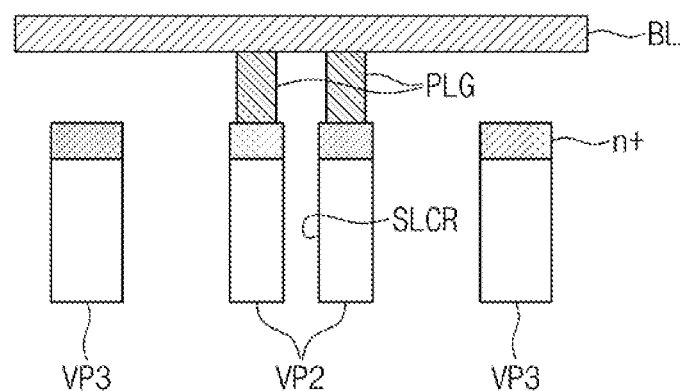

FIG. 27 is a perspective view illustrating a three-dimensional semiconductor device according to an exemplary embodiment of the inventive concept. FIGS. 28 and 29, respectively, are a plan view and a circuit diagram illustrating a string selection structure that can be used in the three-dimensional semiconductor device of FIG. 27, according to an exemplary embodiment of the inventive concept. FIGS. 30 and 31, respectively, are a plan view and a circuit diagram illustrating a string selection structure that can be used in the three-dimensional semiconductor device of FIG. 27, according to an exemplary embodiment of the inventive concept. FIGS. 32 and 33 are plan views illustrating a string selection structures that can be used in the three-dimensional semiconductor device of FIG. 27, according to an exemplary embodiment of the inventive concept. FIG. 34 is a circuit diagram illustrating a string selection structure that can be used in the three-dimensional semiconductor device of FIG. 27, according to an exemplary embodiment of the inventive concept. FIGS. 35 and 36 are sectional views illustrating wiring structures that can be used to realize the three-dimensional semiconductor devices of FIGS. 32 and 33, respectively, according to exemplary embodiments of the inventive concept. FIG. 27 may correspond to a portion of FIG. 28, 30, 32 or 33 depicted by dotted lines 99.

Referring to FIG. 27, according to an exemplary embodiment of the inventive concept, the inner cutting region SLCR may vertically penetrate the horizontal electrode structure HES. Due to the penetrating structure of the inner cutting region SLCR, the first and second unit structures S1 and S2 may be horizontally separated from each other. For example, the word lines WL of the first unit structure S1 may be horizontally separated from the word lines WL of the second unit structure S2. The inner cutting region SLCR may divide the center patterns VP2 into two distinct portions. Accordingly, each of the center patterns VP2 may include two portions, which are contained in the first and second unit structures S1 and S2, respectively. Other features of the horizontal electrode structure HES may be substantially the same as the horizontal electrode structure HES described above with reference to FIG. 3. The pillar groups PG may have substantially the same arrangement as the pillar groups PG described above with reference to FIG. 3.

Referring to FIG. 28, according to an exemplary embodiment of the inventive concept, each of the first pillar groups PG1 may include a pair of the vertical patterns VP1 and VP3, which penetrate the first and second unit structures S1 and S2, respectively, and the center pattern VP2 including two portions divided by the inner cutting region SLCR, and each of the second pillar groups PG2 may include a pair of the vertical patterns VP, which are provided to penetrate the first and second unit structures S1 and S2, respectively. One bit line BL may be provided on each of the pillar groups PG.

Referring to FIG. 29, the first pillar groups PG1 may form the first string selection structure in each of the first and second unit structures S1 and S2. Since the center pattern VP2 is shared by the first and second unit structures S1 and S2, the first string selection structures of the first and second unit structures S1 and S2 may have mirror symmetry with respect to the inner cutting region SLCR.

Referring to FIG. 30, according to an exemplary embodiment of the inventive concept, each of the first pillar groups PG1 may include a pair of the vertical patterns VP1 and VP3, which penetrate the first and second unit structures S1 and S2, respectively, and the center pattern VP2 including two portions divided by the inner cutting region SLCR, and each of the second pillar groups PG2 may include a pair of the vertical patterns VP, which are provided to penetrate the first and second unit structures S1 and S2, respectively. Two bit lines BL may be provided on each of the first pillar groups PG1, and one bit line BL may be provided on each of the second pillar groups PG2.

Referring to FIGS. 30 and 31, the two portions of the center pattern VP2 may be connected to a pair of bit lines disposed thereon, respectively. In each of the first pillar groups PG1, the vertical patterns VP1 and VP3, which penetrate the first and second unit structures S1 and S2, respectively, may be connected to the pair of the bit lines, respectively. Accordingly, each of the bit lines BL disposed on the first pillar groups PG1 may be connected to a pair of vertical patterns penetrating the first and second unit structures S1 and S2, respectively.

According to an exemplary embodiment of the inventive concept, although the pair of the vertical patterns VP may be connected to the corresponding one of the bit lines BL, the pair of the vertical patterns VP may penetrate the first and second unit structures S1 and S2 that are separated from each other. Accordingly, as shown in FIG. 31, each of the first pillar groups PG1 may form the second string selection structure of FIG. 2.

In an exemplary embodiment of the inventive concept, as shown in FIGS. 32 through 34, two portions constituting each of the center patterns VP2 may be connected, in common, to the corresponding one of the bit lines BL. In each of the first pillar groups PG1, one of the pair of the bit lines provided thereon may be connected, in common, to a pair of the vertical patterns VP1 and VP3 penetrating the first and second unit structures S1 and S2, respectively, and the other may be connected, in common, to the two portions of the center pattern VP2. For example, the two portions of the center pattern VP2 may be connected, in common, to one of the bit lines BL via one plug PLG, as shown in FIGS. 32 and 35. The two portions of the center pattern VP2 may be connected to each other by an upper conductive region n+ crossing the inner cutting region SLCR. Alternatively, the two portions of the center pattern VP2 may be connected, in common, to one of the bit lines BL via a pair of plugs PLG, as shown in FIGS. 33 and 36. The two portions of the center pattern VP2 may include upper conductive regions n+, which are separated from each other by the inner cutting region SLCR.

Figure 37:
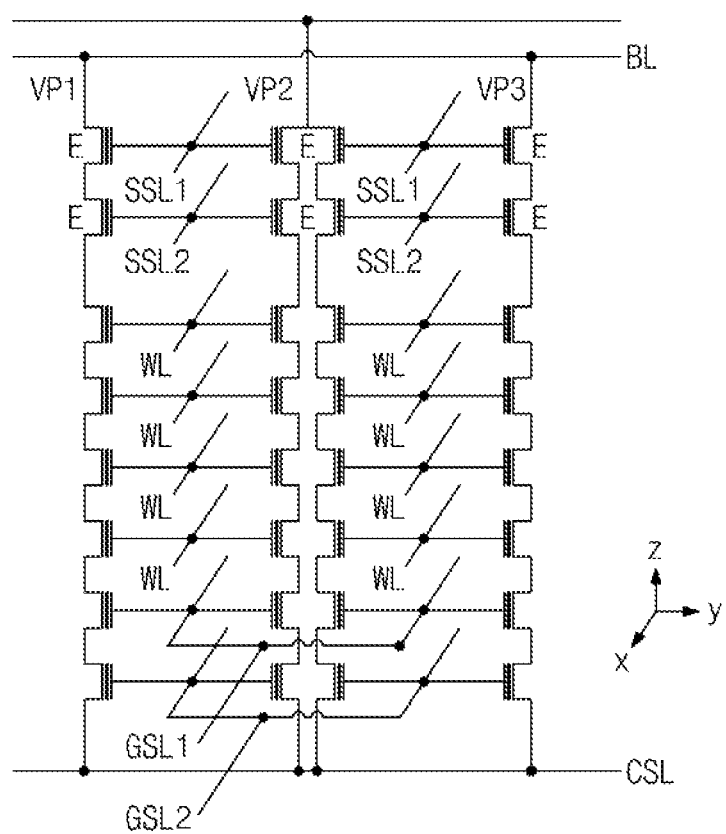
FIGS. 37 and 38, respectively, are a circuit diagram and a perspective view illustrating a three-dimensional semiconductor device according to an exemplary embodiment of the inventive concept.
Figure 38:
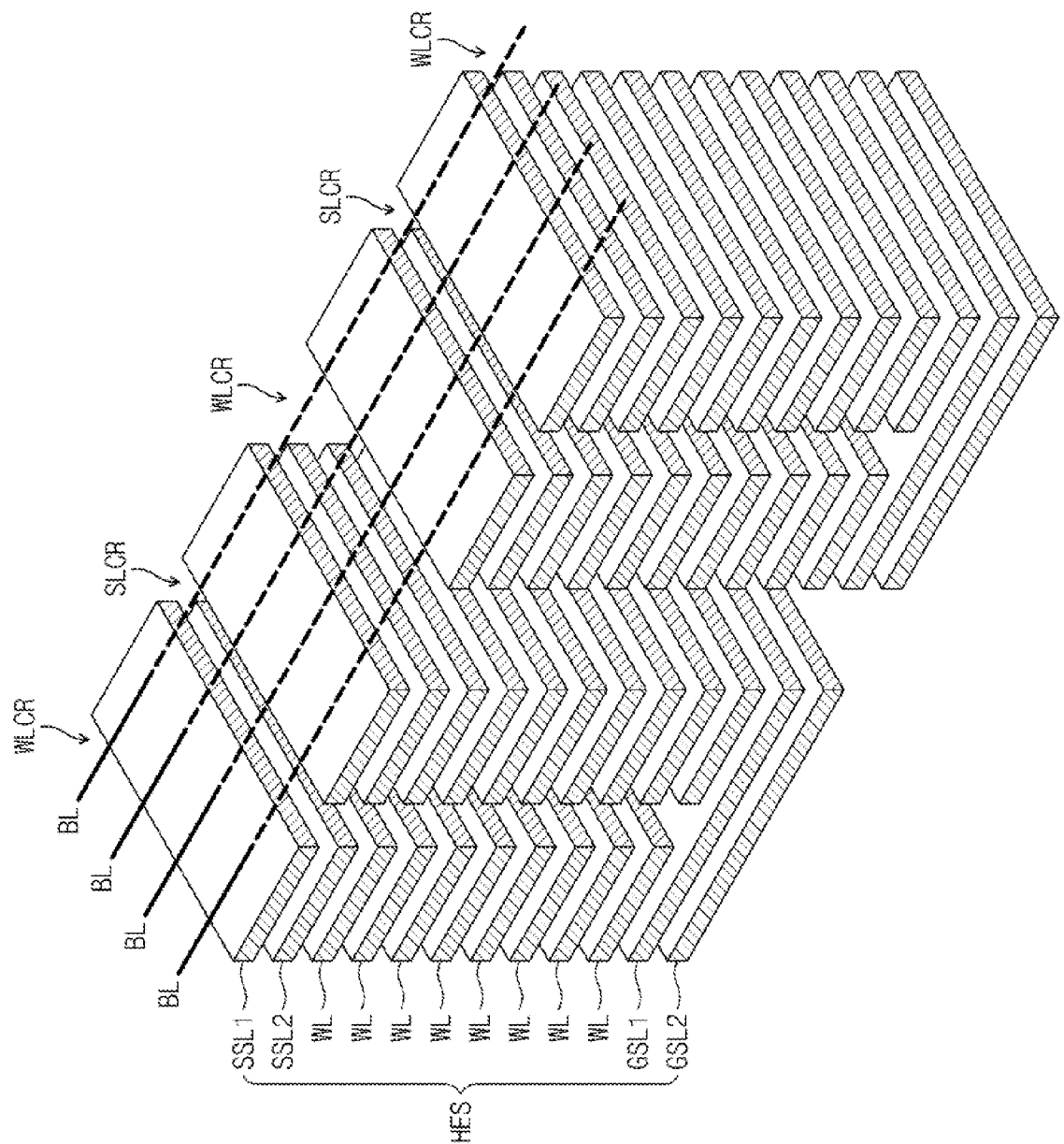
Figure 39:
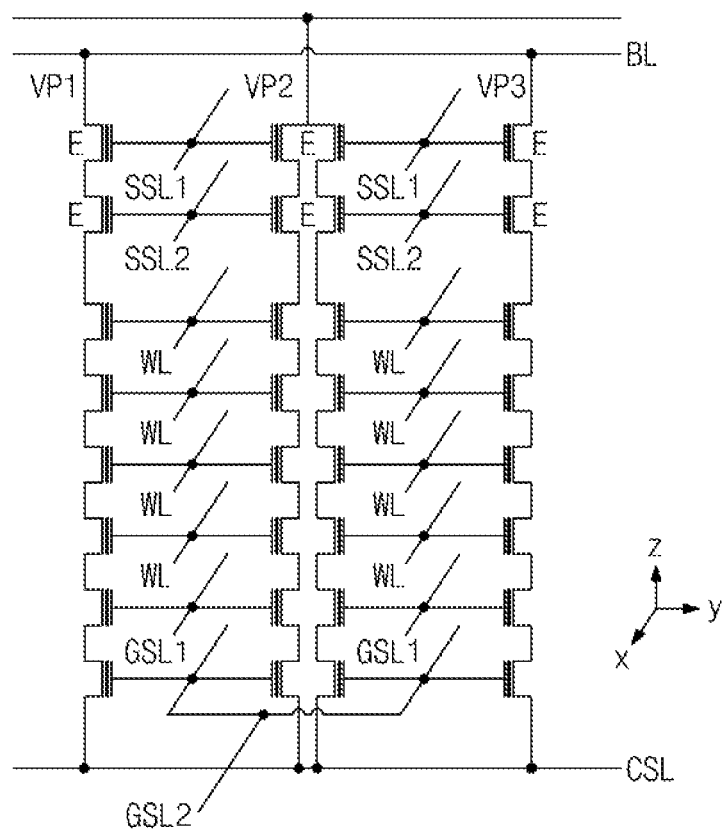
FIGS. 39 and 40, respectively, are a circuit diagram and a perspective view illustrating a three-dimensional semiconductor device according to an exemplary embodiment of the inventive concept.
Figure 40:
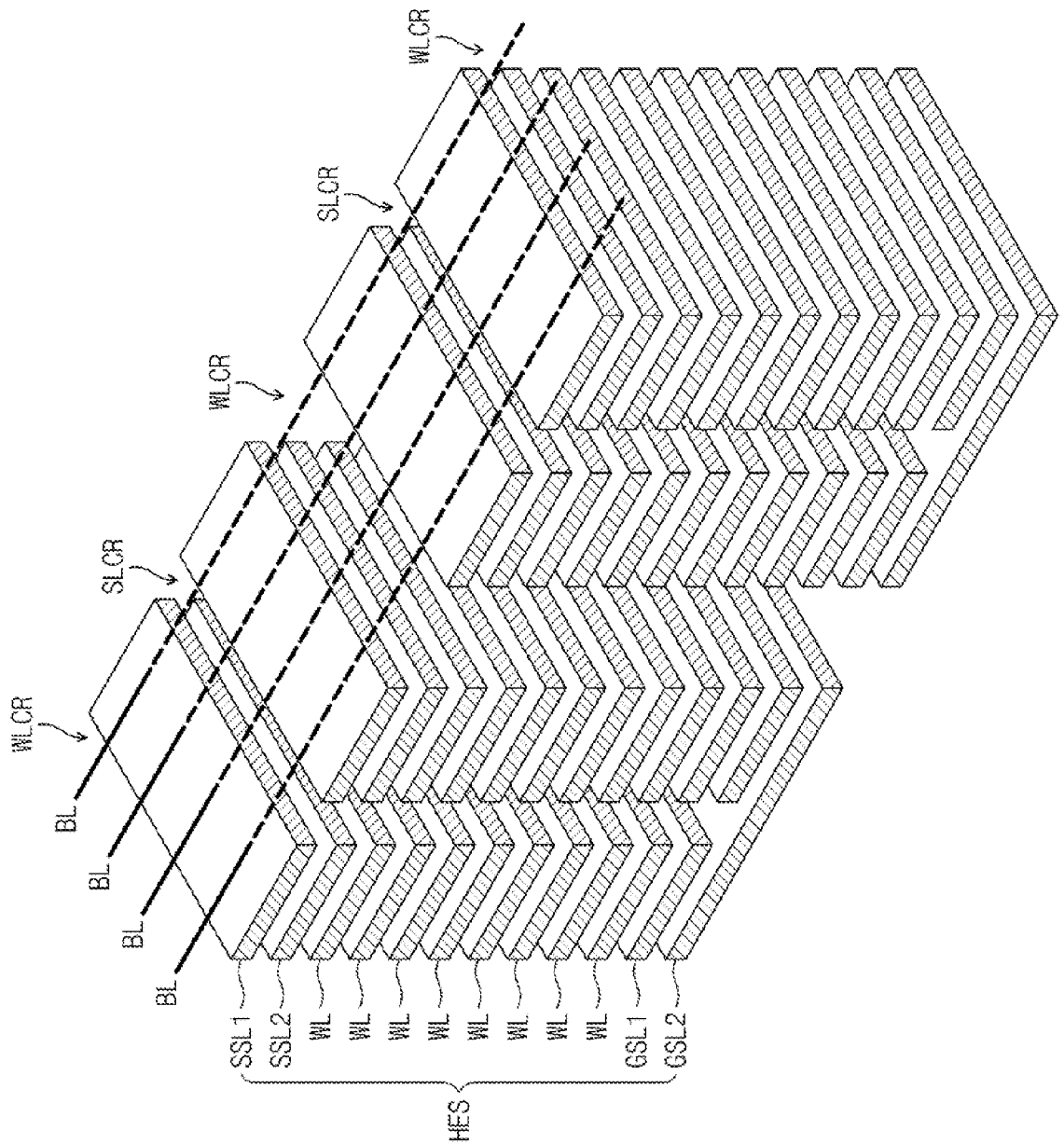

FIGS. 37 and 38, respectively, are a circuit diagram and a perspective view illustrating a three-dimensional semiconductor device according to an exemplary embodiment of the inventive concept, and FIGS. 39 and 40, respectively, are a circuit diagram and a perspective view illustrating a three-dimensional semiconductor device according to an exemplary embodiment of the inventive concept. Except the ground selection lines or the ground selection transistor, the three-dimensional semiconductor devices shown in FIGS. 37 to 40 may be substantially the same as the three-dimensional semiconductor device described above with reference to FIG. 34.

As shown in FIGS. 37 and 38, the inner cutting region SLCR may penetrate the word lines WL of the horizontal electrode structure HES, but not the ground selection lines GSL1 and GSL2. For example, the word lines WL of the first unit structure S1 may be horizontally separated from the word lines WL of the second unit structure S2, and the ground selection lines GSL1 and GSL2 of the first unit structure S1 might not be separated from the ground selection lines GLS1 and GSL2 of the second unit structure S2.

As shown in FIGS. 39 and 40, the inner cutting region SLCR may penetrate the word lines WL of the horizontal electrode structure HES. However, the inner cutting region SLCR may penetrate an upper layer GSL1 of the ground selection lines, but not a lower layer GSL2 of the ground selection lines. For example, the word lines WL and the upper ground selection line GSL1 of the first unit structure S1 may be horizontally separated from the word lines WL and upper ground selection line GSL1 of the second unit structure S2, and the lower ground selection line GSL2 of the first unit structure S1 might not be separated from the lower ground selection line GSL2 of the second unit structure S2.

Figure 41:
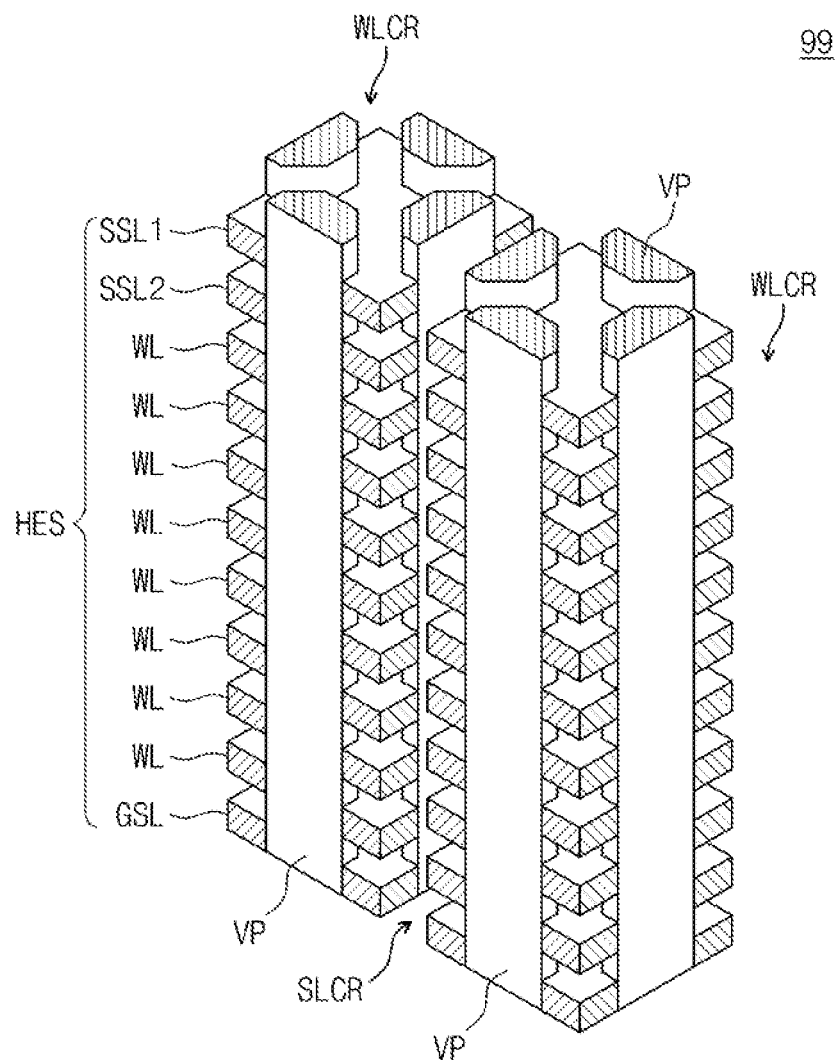
FIG. 41 is a perspective view illustrating a three-dimensional semiconductor device according to an exemplary embodiment of the inventive concept.
Figure 42:
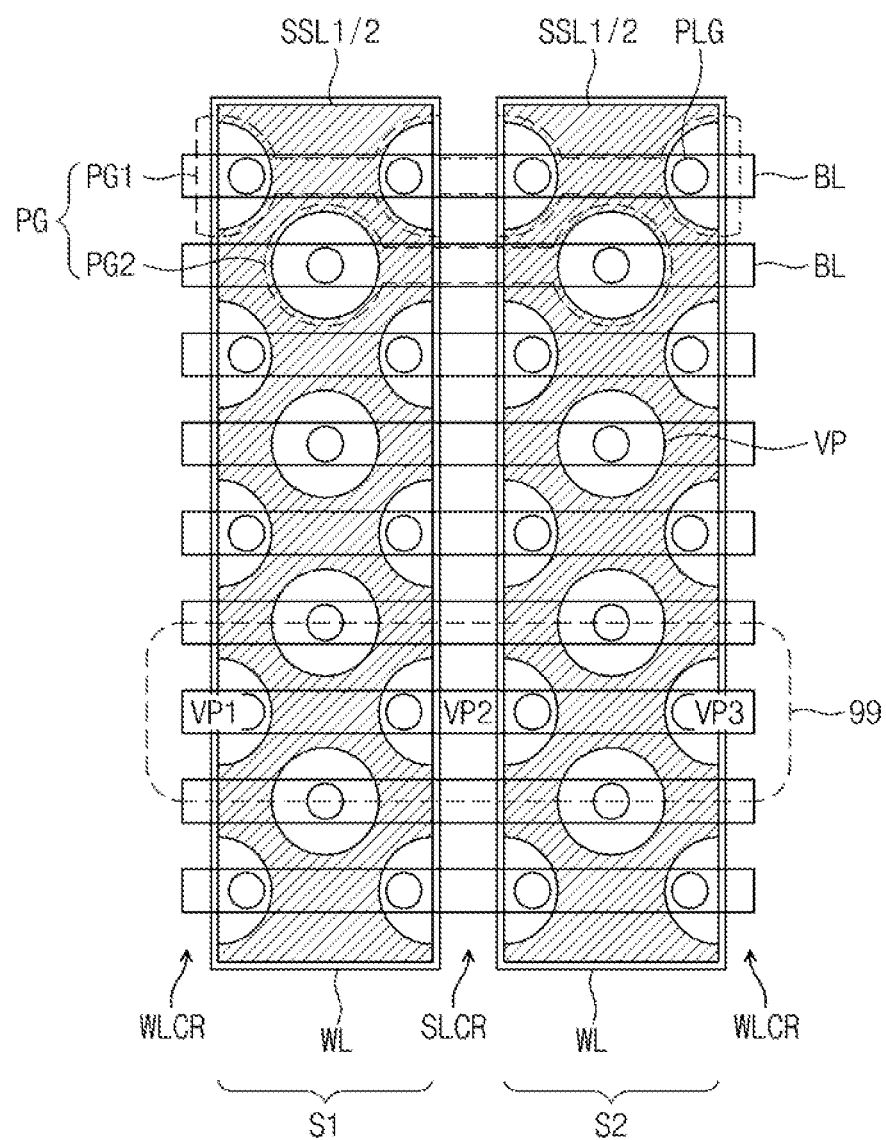
FIG. 42 is a plan view illustrating a string selection structure that can be used in the three-dimensional semiconductor device of FIG. 41, according to an exemplary embodiment of the inventive concept.

FIG. 41 is a perspective view illustrating a three-dimensional semiconductor device according to an exemplary embodiment of the inventive concept. FIG. 42 is a plan view illustrating a string selection structure that can be used in the three-dimensional semiconductor device of FIG. 41, according to an exemplary embodiment of the inventive concept. FIG. 41 may correspond to a portion of FIG. 42 depicted by dotted lines 99.

Referring to FIGS. 41 and 42, according to an exemplary embodiment of the inventive concept, the outer cutting regions WLCR may expose the outermost vertical patterns (e.g., VP1 and VP3) of the first pillar groups PG1. For example, as shown in FIG. 41, each of the first and second unit structures S1 and S2 may have substantially mirror symmetry with respect to its center. Except the outer cutting regions WLCR, the three-dimensional semiconductor devices shown in FIGS. 41 and 42 may be substantially the same as the three-dimensional semiconductor devices described above with reference to FIGS. 27 through 29.

Figure 43:
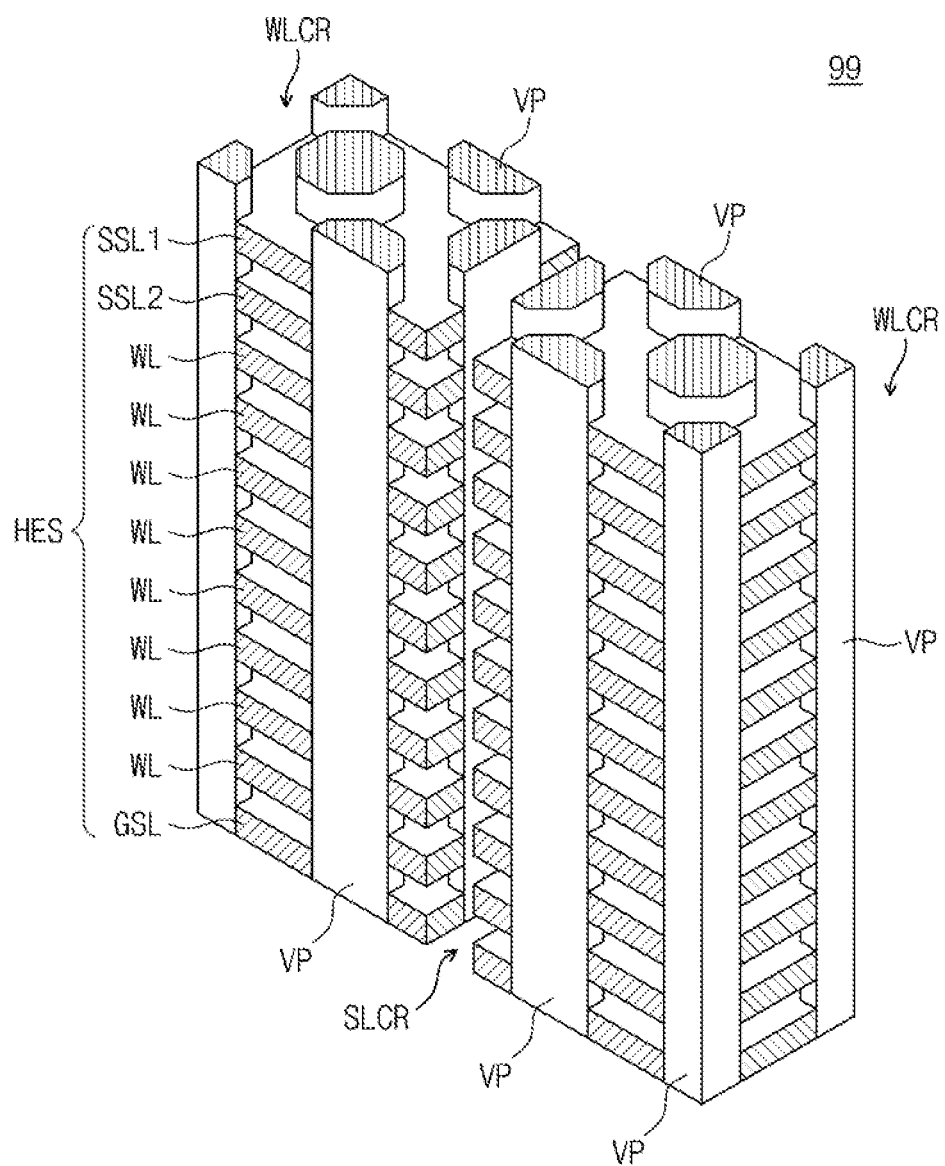
FIG. 43 is a perspective view illustrating a three-dimensional semiconductor device according to an exemplary embodiment of the inventive concept.
Figure 44:
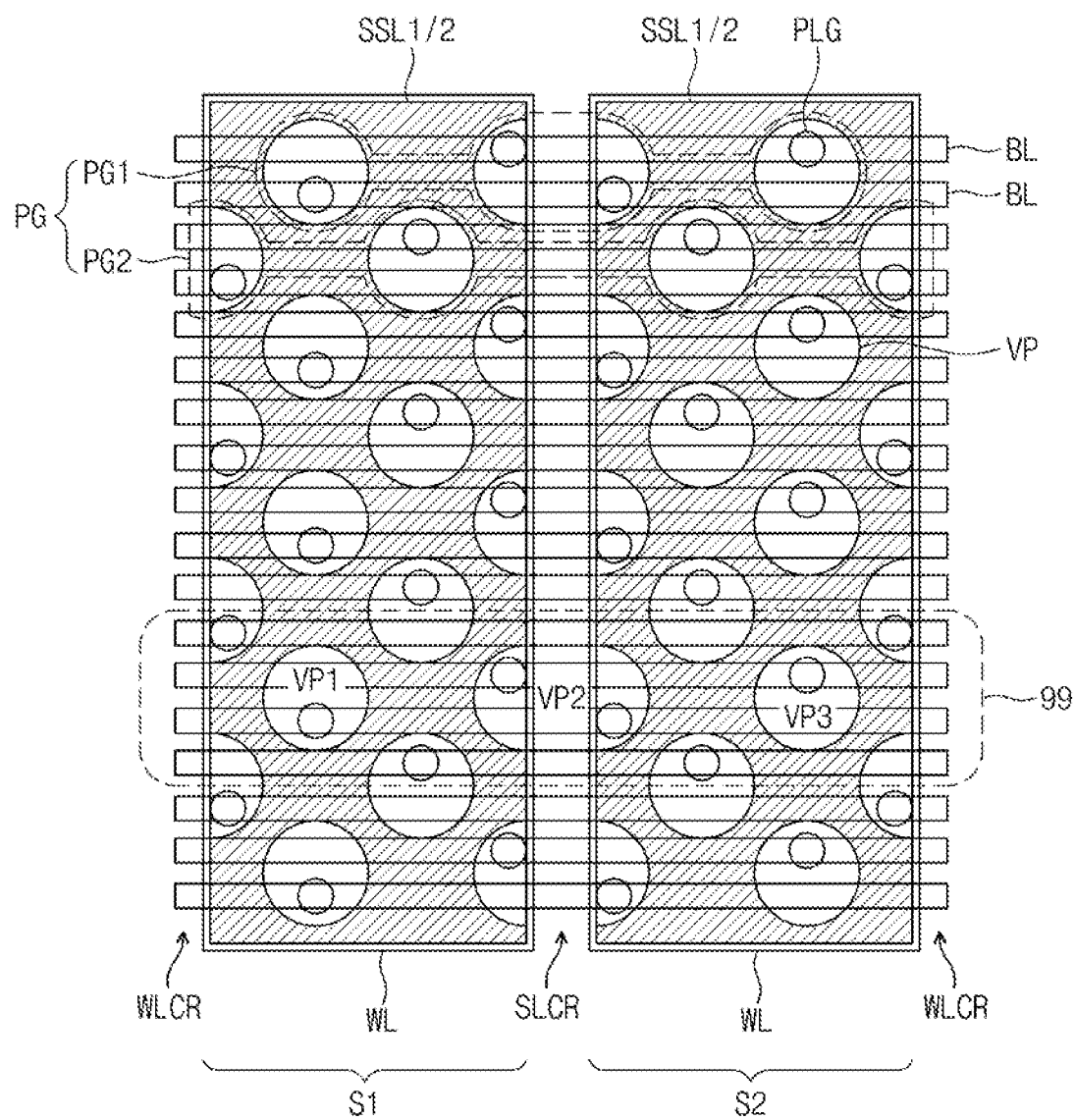
FIG. 44 is a plan view illustrating a string selection structure that can be used in the three-dimensional semiconductor device of FIG. 43, according to an exemplary embodiment of the inventive concept.

FIG. 43 is a perspective view illustrating a three-dimensional semiconductor device according to an exemplary embodiment of the inventive concept. FIG. 44 is a plan view illustrating a string selection structure that can be used in the three-dimensional semiconductor device of FIG. 43, according to an exemplary embodiment of the inventive concept. FIG. 43 may correspond to a portion of FIG. 44 depicted by dotted lines 99.

Referring to FIGS. 43 and 44, according to an exemplary embodiment of the inventive concept, the first pillar groups PG1 may have substantially the same technical features as the first pillar groups PG1 described above with reference to FIGS. 30 and 31. For example, according to an exemplary embodiment of the inventive concept, a pair of first bit lines BL may be provided on each of the first pillar groups PG1, and the first pillar groups PG1 may constitute a pair of the second string selection structures.

According to an exemplary embodiment of the inventive concept, each of the second pillar groups PG2 may include four vertical patterns, and the outer cutting regions WLCR may expose the outermost vertical patterns of the second pillar groups PG2. Except the outer cutting regions WLCR, the second pillar groups PG2 according to an exemplary embodiment of the inventive concept may have substantially the same technical features as the second pillar groups PG2 described above with reference to FIGS. 23 and 24.

The 3D semiconductor devices including the first string selection structure and/or the second string selection structure of FIGS. 1 and 2 have been described with reference to FIGS. 3 through 44, but exemplary embodiments of the inventive concept are not limited thereto.

In an exemplary embodiment of the inventive concept, the inventive concept may be applied to realize a three-dimensional charge-trap NAND FLASH memory device. For example, the horizontal electrode structure HES may include the horizontal patterns HP that are vertically separated by an interlayered dielectric ILD, as shown in FIGS. 45 through 48, and each of the vertical patterns VP and each of the horizontal patterns HP may constitute a unit memory cell as will be described below with reference to FIGS. 45 through 48.

The 3D charge-trap NAND FLASH memory device may include three-dimensionally arranged memory cells. In each memory cell, the vertical pattern VP may include a semiconductor pattern SP that functions as a channel region, and the horizontal pattern HP may include a horizontal electrode HE that functions as a gate electrode. In an exemplary embodiment of the inventive concept, the vertical pattern VP may further include a vertical insulating layer VI that is inserted into the semiconductor pattern SP. Each of the memory cells may further include a tunnel insulating layer TL, a charge storing layer CL, and a blocking insulating layer BK that constitute a memory element.

Figure 45:
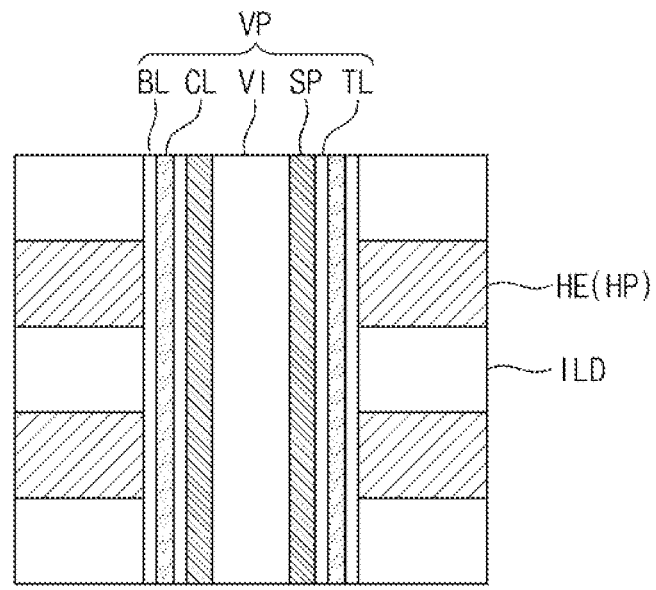
FIGS. 45 through 48 are sectional views illustrating portions of three-dimensional charge-trap NAND FLASH memory devices according to exemplary embodiments of the inventive concept.
Figure 46:
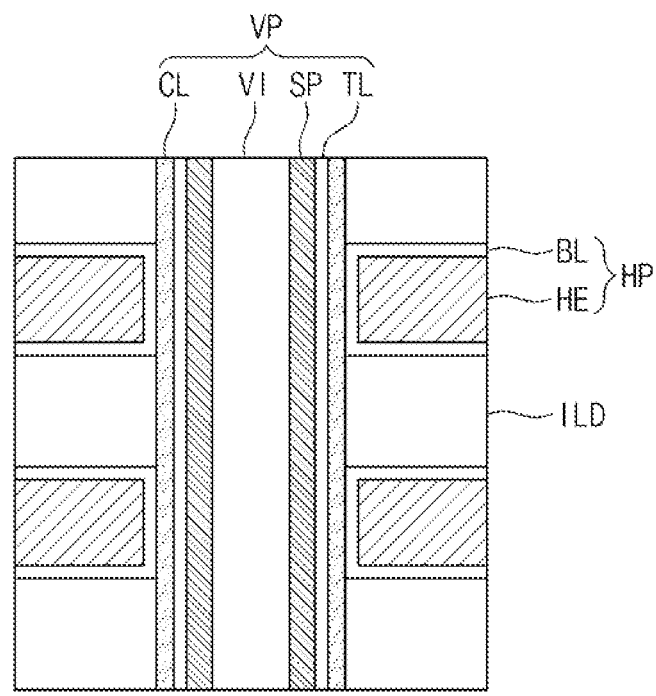
Figure 47:
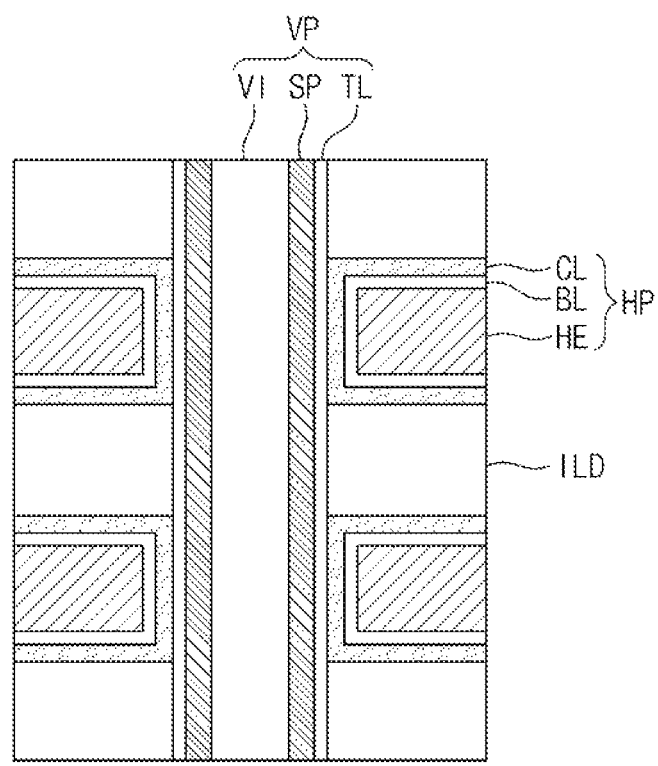
Figure 48:
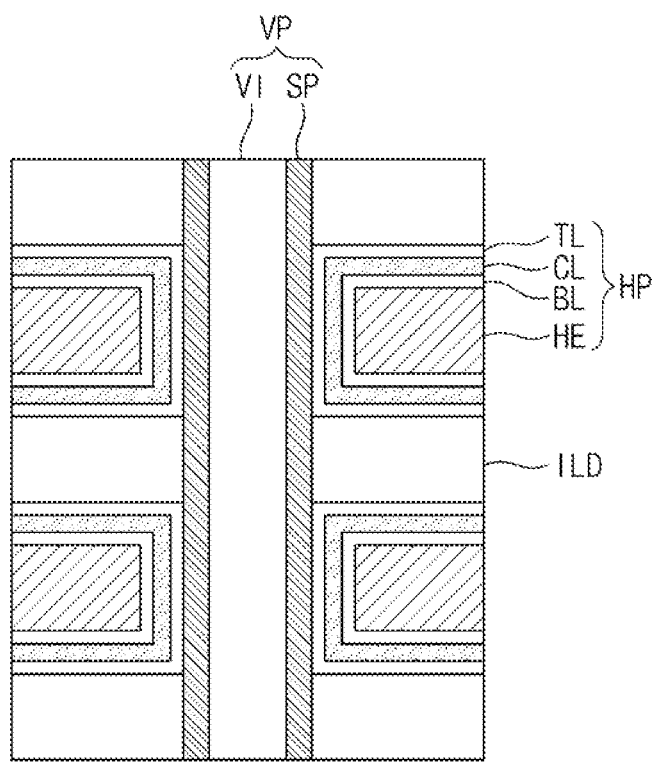

In an exemplary embodiment of the inventive concept, as shown in FIG. 45, the tunnel insulating layer TL, the charge storing layer CL, and the blocking insulating layer BK may constitute the vertical pattern VP. Alternatively, as shown in FIG. 48, the tunnel insulating layer TL, the charge storing layer CL, and the blocking insulating layer BK may constitute the horizontal pattern HP. In an exemplary embodiment of the inventive concept, as shown in FIG. 46, the tunnel insulating layer TL and the charge storing layer CL may constitute the vertical pattern VP, and the blocking insulating layer BK may constitute the horizontal pattern HP. In an exemplary embodiment of the inventive concept, as shown in FIG. 47, the tunnel insulating layer TL may constitute the vertical pattern VP, and the charge storing layer CL and the blocking insulating layer BK may constitute the horizontal pattern HP. However, exemplary embodiments of the inventive concept are not limited to the examples shown in FIGS. 45 through 48. For example, the tunnel insulating layer TL, the charge storing layer CL, and/or the blocking insulating layer BK may be provided in a multi-layered structure. The multi-layered structure may include multiple layers. At least one of the multiple layers is included in the vertical pattern VP, and the others thereof are included in the horizontal pattern HP.

The charge storing layer CL may be an insulating layer with many trap sites or an insulating layer with nano-particles. The charge storing layer CL may be formed by a chemical vapor deposition and/or an atomic layer deposition process. For example, the charge storing layer CL may include one of a trap insulating layer, a floating gate electrode, and/or an insulating layer with conductive nano dots. In an exemplary embodiment of the inventive concept, the charge storing layer CL may include a silicon nitride layer, a silicon oxynitride layer, a silicon-rich nitride layer, a nano-crystalline silicon layer, and/or a laminated trap layer.

The tunnel insulating layer TL may include one of materials having a greater band gap than the charge storing layer CL. The tunnel insulating layer TL may be formed by a chemical vapor deposition and/or an atomic layer deposition process. For example, the tunnel insulating layer TL may be a silicon oxide layer, which may be formed using a deposition process, such as, e.g., a chemical vapor deposition and/or an atomic layer deposition process. A thermal treatment process may be further performed on the tunnel insulating layer TL, for example, after the deposition of the tunnel insulting layer TL. The thermal treatment may include a rapid thermal nitridation (RTN) process and/or an annealing process that is performed under an atmosphere containing nitrogen and/or oxygen.

The blocking insulating layer BK may include the first and second blocking insulating layers that are formed of different materials from each other. In an exemplary embodiment of the inventive concept, the first or second blocking insulating layer may have a band gap that is smaller than a band gap of the tunnel insulating layer TL and that is higher than a band gap of the charge storing layer CL. The first and second blocking insulating layers may be formed using chemical vapor deposition or atomic layer deposition, and the first or second blocking insulating layer may be formed by a wet oxidation process. In an exemplary embodiment of the inventive concept, the first blocking insulating layer may include a high-k dielectric, such as aluminum oxide and hafnium oxide, and the second blocking insulating layer may include a material with a dielectric constant smaller than a dielectric constant of the first blocking insulating layer. In an exemplary embodiment of the inventive concept, the second blocking insulating layer may include a high-k dielectric, and the first blocking insulating layer may include a material with a dielectric constant smaller than a dielectric constant of the second blocking insulating layer.

FIGS. 49 and 50 are tables illustrating a method of operating a three-dimensional NAND FLASH memory device, according to an exemplary embodiment of the inventive concept. FIGS. 49 and 50, respectively, show program and reading operations that can be applied to a 3D NAND FLASH memory device including the three-dimensional array structure described above with reference to FIGS. 6 through 8.

In the semiconductor device described with reference to FIGS. 6 through 8, the first pillar groups PG1 may include a pair of the first string selection structures. Thus, each of the vertical patterns VP1, VP2, and VP3 constituting the first pillar groups PG1 may be electrically and selectively connected to the bit line BL using a voltage condition of FIG. 1 and Table 1. Accordingly, as shown in FIGS. 49 and 50, the selective connection using the first string selection structures may be used to perform program and reading operations on the first pillar groups PG1 of the semiconductor device that has been described above with reference to FIGS. 6 through 8.

FIGS. 51 and 52 are tables illustrating a method of operating a three-dimensional NAND FLASH memory device, according to an exemplary embodiment of the inventive concept. FIGS. 51 and 52, respectively, show program and reading operations that can be applied to a 3D NAND FLASH memory device including the three-dimensional array structure described above with reference to FIGS. 9 through 11.

In the semiconductor device described with reference to FIGS. 9 through 11, the first pillar groups PG1 may include a pair of the second string selection structures. Thus, each of the vertical patterns VP1, VP2, and VP3 constituting the first pillar groups PG1 may be electrically and selectively connected to the bit line BL using a voltage condition of FIG. 2. Accordingly, as shown in FIGS. 51 and 52, the selective connection using the second string selection structures may be used to perform program and reading operations on the first pillar groups PG1 of the semiconductor device described above with reference to FIGS. 9 through 11.

Figure 53:
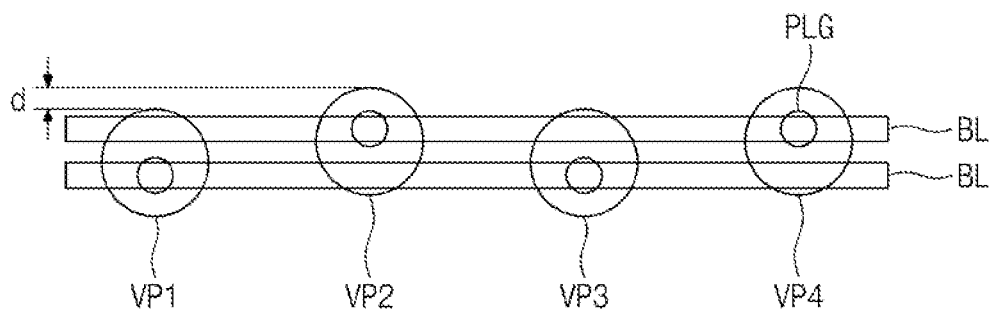
FIGS. 53 and 54 are plan views illustrating a portion of a three-dimensional semiconductor device according to one of modified exemplary embodiments of the inventive concept.
Figure 54:
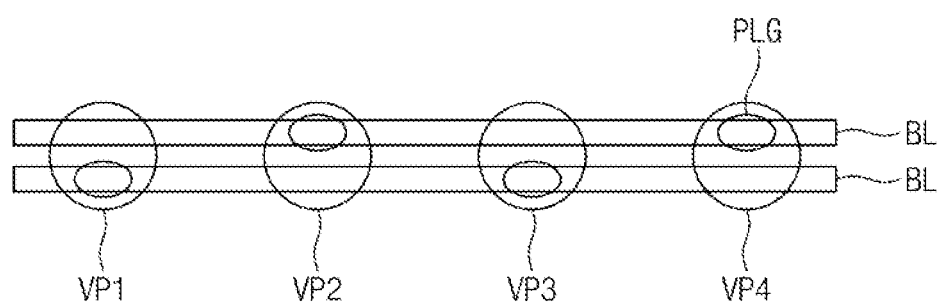

FIGS. 53 and 54 are plan views illustrating a portion of a three-dimensional semiconductor device according to an exemplary embodiment of the inventive concept.

According to an exemplary embodiment of the inventive concept, the vertical patterns VP1-VP4 of each of the pillar groups PG may be arranged in a zigzag manner. For example, as shown in FIG. 53, the first and third vertical patterns VP1 and VP3 may be located along a first line that is offset from a second line along which the second and fourth vertical patterns VP2 and VP4 are positioned. The first line is spaced apart from the second line by a predetermine distance along a direction substantially perpendicular to the bit line BL. By the zigzag arrangement of the vertical patterns, the bit line BL, the plug PLG, and the vertical patterns VP1-VP4 may be more easily connected to each other.

According to an exemplary embodiment of the inventive concept, the plug PLG may have a shape that may increase a contact area between the plug PLG and the bit line BL or between the plug PLG and the vertical pattern VP1-VP4. For example, as shown in FIG. 54, the plug PLG may be elongated along the longitudinal direction of the bit line BL to have substantially an elliptical shape, when viewed in plan view.

Figure 55:
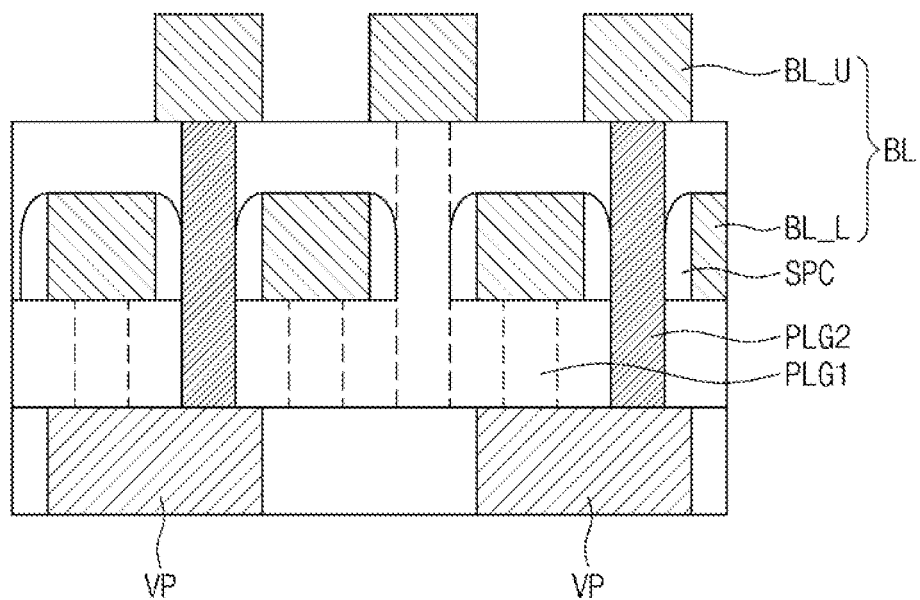
FIG. 55 is a sectional view illustrating a portion of a three-dimensional semiconductor device according to an exemplary embodiment of the inventive concept.

FIG. 55 is a sectional view illustrating a portion of a three-dimensional semiconductor device according to an exemplary embodiment of the inventive concept.

Referring to FIG. 55, the bit lines BL may include lower bit lines BL_L and upper bit lines BL_U disposed on the lower bit lines BL_L. For example, when viewed in plan view, the lower bit lines BL_L and the upper bit lines BL_U may be arranged in an alternating manner.

Each of the lower bit lines BL_L may be electrically connected to the vertical patterns VP through first plugs PLG1, and each of the upper bit lines BL_U may be electrically connected to the vertical patterns VP through second plugs PLG2. The second plugs PLG2 may be longer than the first plugs PLG1. Each of the second plugs PLG2 may cross the space between the lower bit lines BL_L, and each of the second plugs PLG2 may be connected to the corresponding one of the vertical patterns VP. To electrically separate the second plugs PLG2 from the lower bit lines BL_L, insulating spacers SPC may be further provided on sidewalls of the lower bit lines BL_L.

According to an exemplary embodiment of the inventive concept, since the lower bit lines BL_L are positioned at a different level from the upper bit lines BL_U, each of the bit lines BL can have an increased width and the bit lines BL may have an increased space in a horizontal direction.

The horizontal electrode structure HES may have a stepwise or terraced structure, when viewed in a vertical section view. For example, the horizontal electrode structure HES may include a plurality of horizontal lines HL1-HL9 that has a width or area decreasing as a distance from the substrate increases.

Figure 56:
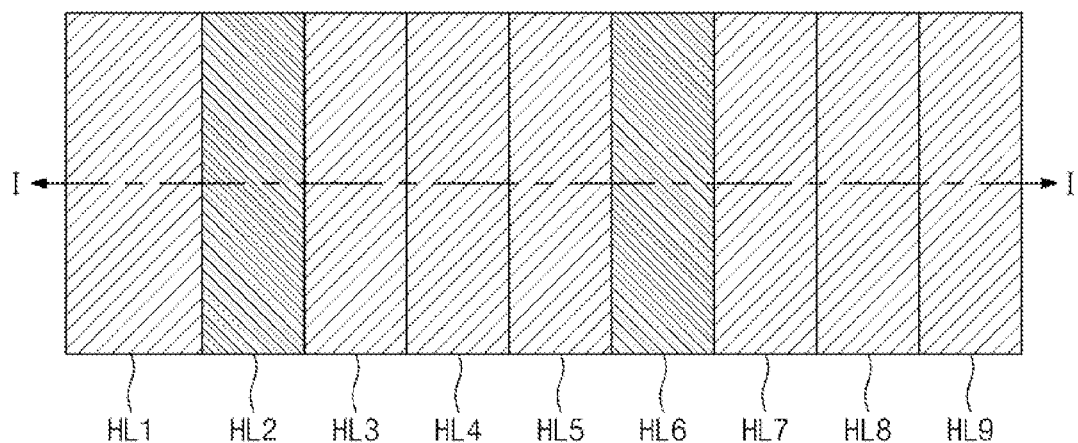
FIGS. 56 and 57, respectively, are a plan view and a sectional view illustrating a stepwise connection structure according to an exemplary embodiment of the inventive concept.
Figure 57:
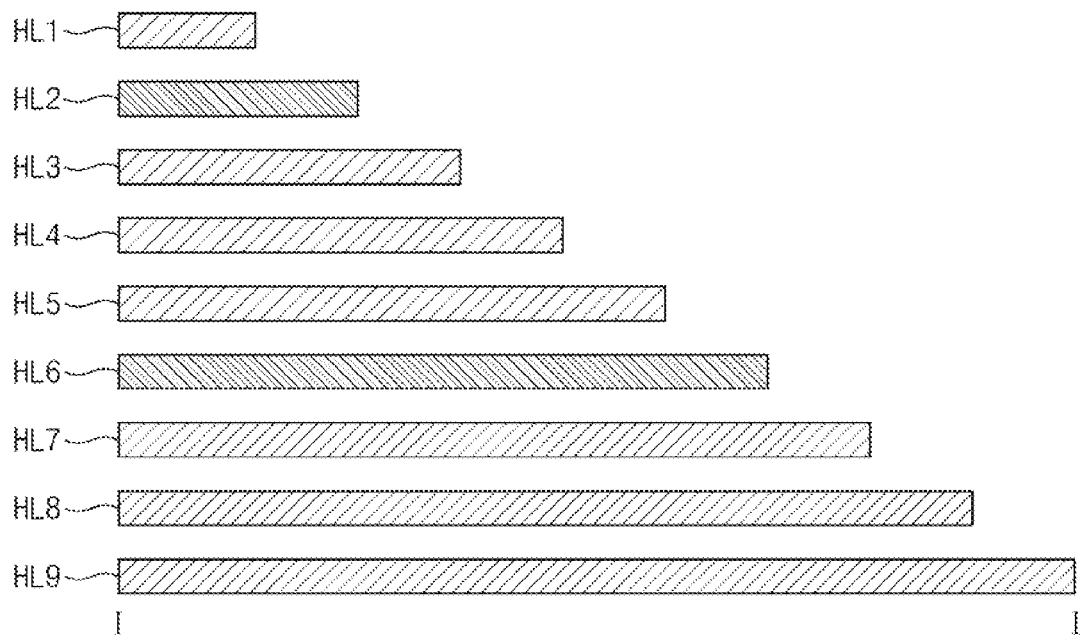

In an exemplary embodiment of the inventive concept, as shown in FIGS. 56 and 57, some of the horizontal lines, e.g., HL2 and HL6, may be formed of a material that is different from a material of other horizontal lines, e.g., HL1, HL3-HL5, and HL7-HL9.

Figure 58:
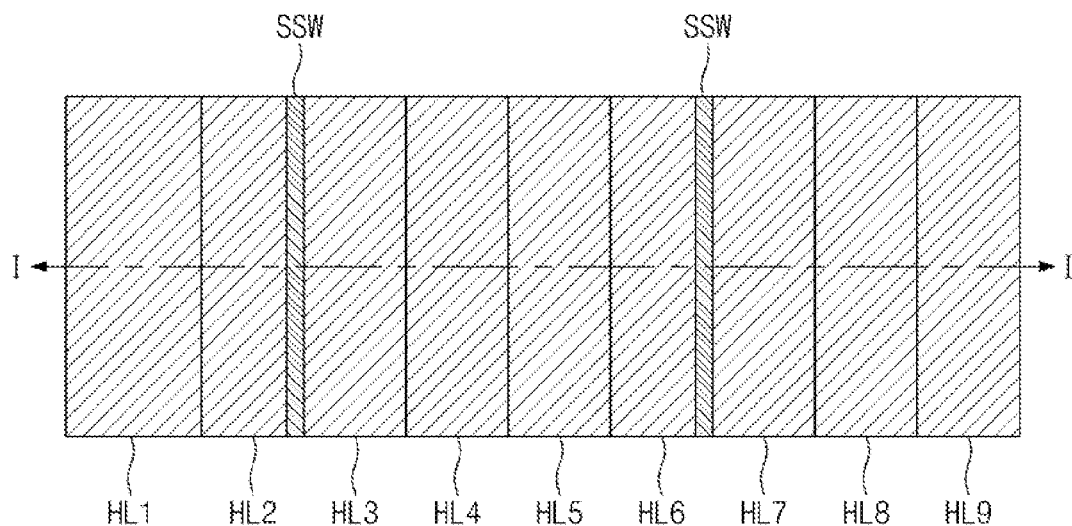
FIGS. 58 and 59, respectively, are a plan view and a sectional view illustrating a stepwise connection structure according to an exemplary embodiment of the inventive concept.
Figure 59:
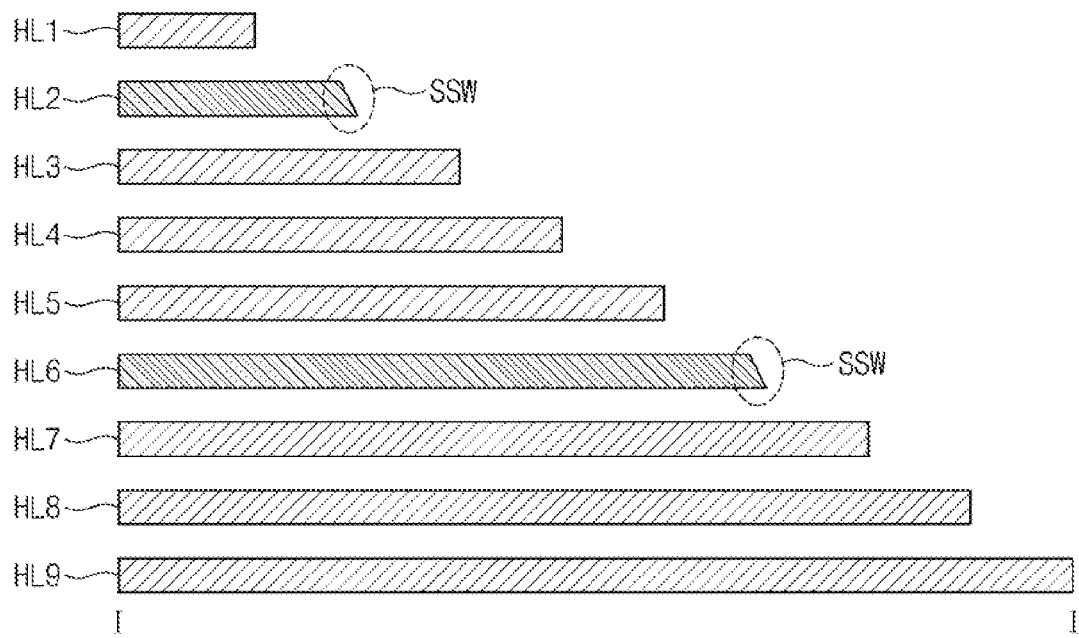

In an exemplary embodiment of the inventive concept, as shown in FIGS. 58 and 59, some of the horizontal lines, e.g., HL2 and HL6, may have a sidewall angle that is different from a sidewall angle of other horizontal lines, e.g., HL1, HL3-HL5, and HL7-HL9. For example, some of the horizontal lines, e.g., HL2 and HL6, may have slant sidewalls SSW, and other horizontal lines, e.g., HL1, HL3-HL5, and HL7-HL9, may have substantially vertical sidewalls.

Figure 60:
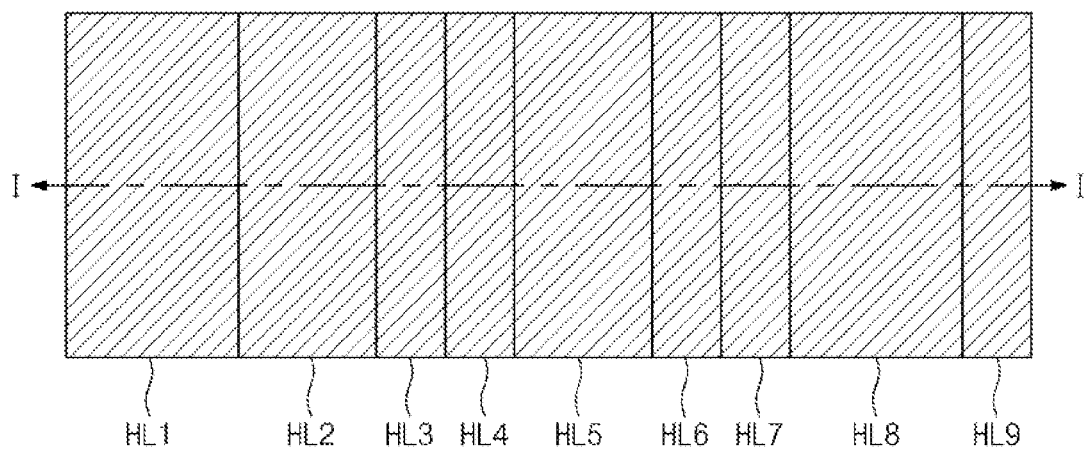
FIGS. 60 and 61, respectively, are a plan view and a sectional view illustrating a stepwise connection structure according to an exemplary embodiment of the inventive concept.
Figure 61:
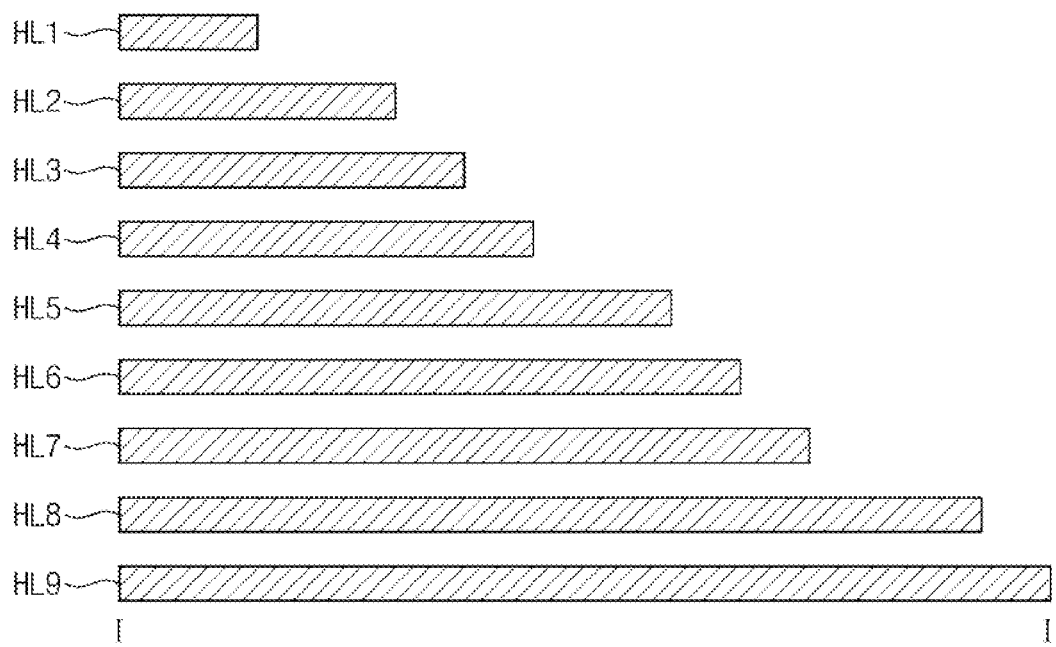
Figure 62:
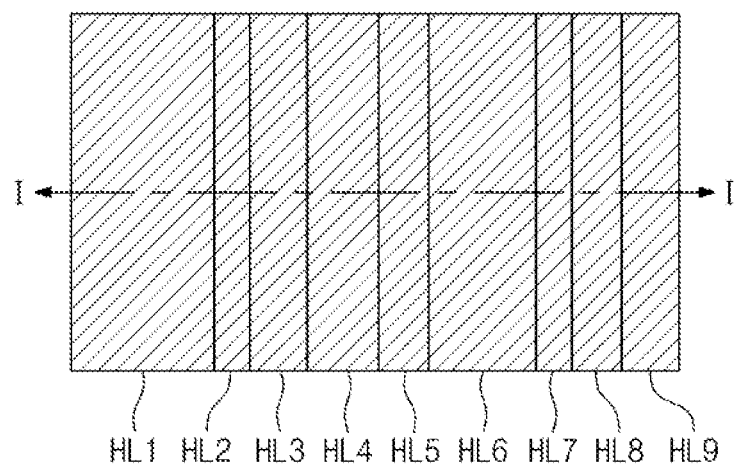
FIGS. 62 and 63, respectively, are a plan view and a sectional view illustrating a stepwise connection structure according to an exemplary embodiment of the inventive concept.
Figure 63:
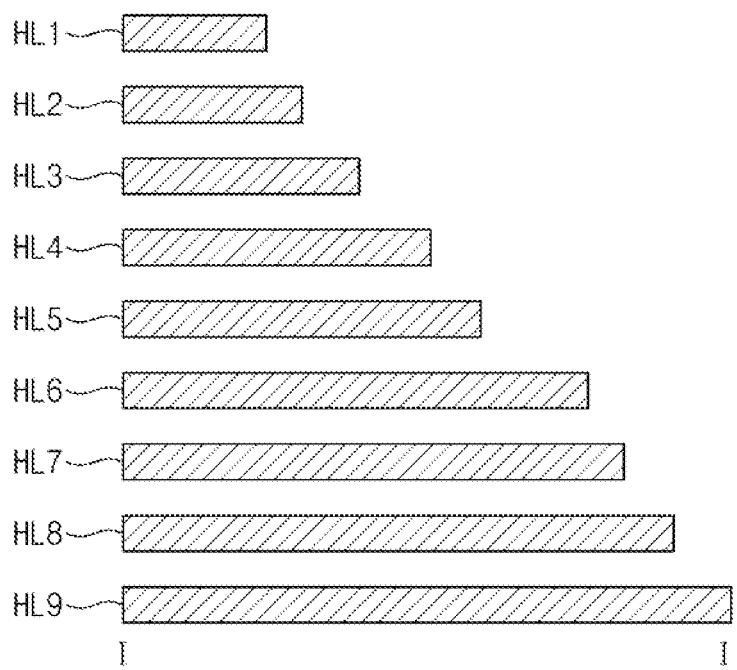

Each of the horizontal lines HL1-HL9 may have a pad region that is horizontally protruded beyond a sidewall of another horizontal line provided thereon. Accordingly, the horizontal electrode structure HES may have the stepwise or terraced structure. In an exemplary embodiment of the inventive concept, as shown in FIGS. 60 and 61, the horizontal lines HL1-HL9 may be classified into a first group including horizontal lines, e.g., HL2, HL5, and HL8, with wide pad regions, and a second group including horizontal lines, e.g., HL3, HL4, HL6, HL7, and HL9, with narrow pad regions. Alternatively, as shown in FIGS. 62 and 63, the horizontal lines HL1-HL9 may be classified into at least three groups depending on the width of the pad regions.

Figure 64:
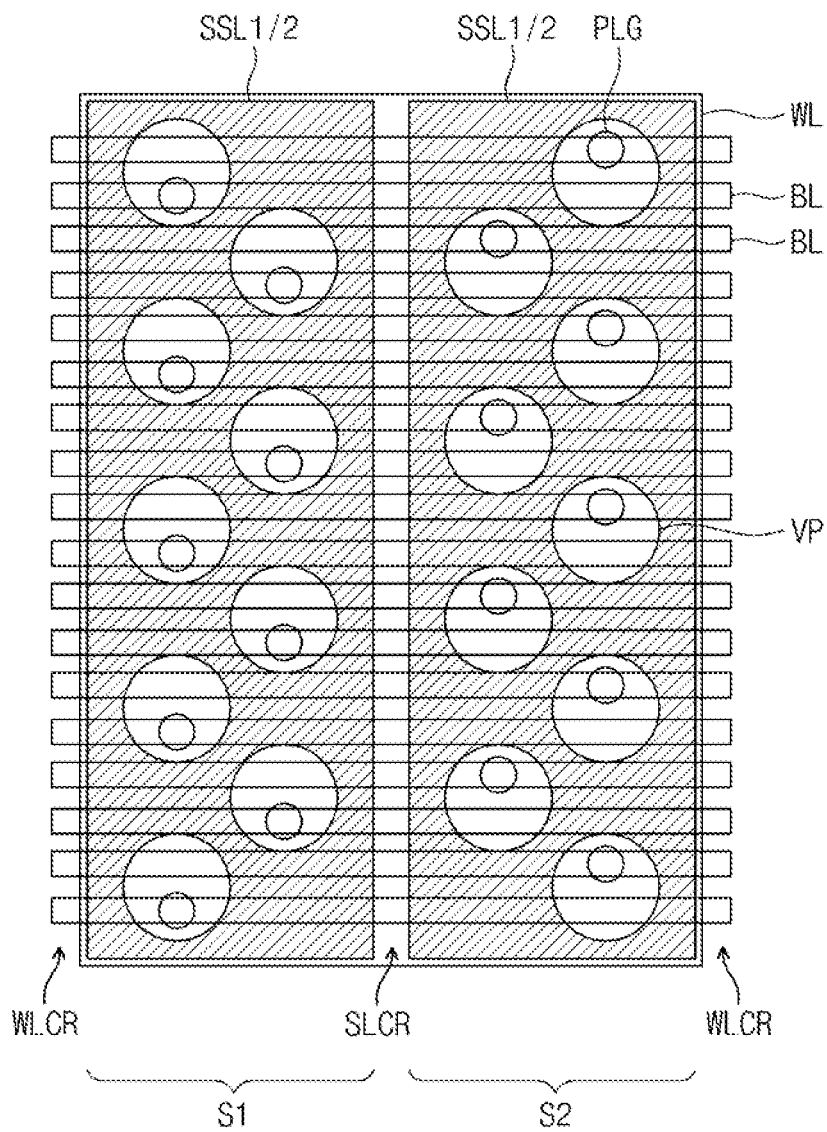
FIGS. 64 through 66 are plan views of three-dimensional semiconductor devices according to exemplary embodiments of the inventive concept.
Figure 65:
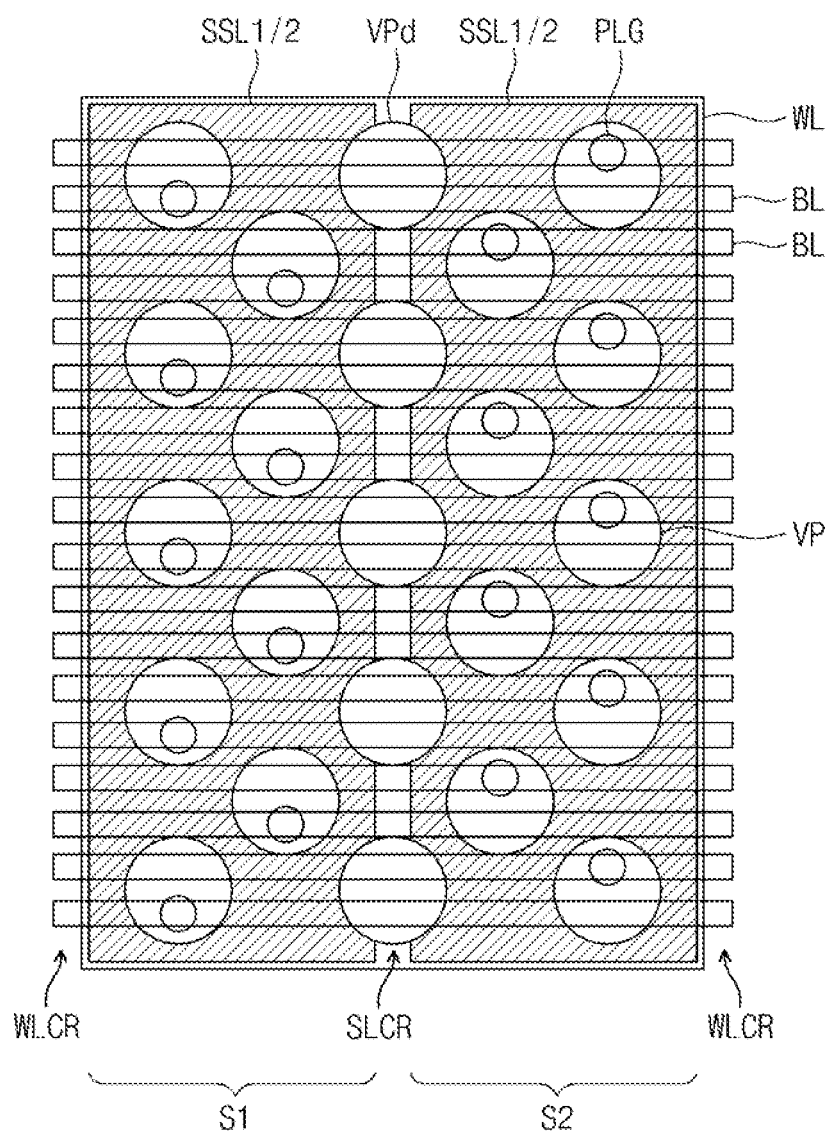
Figure 66:
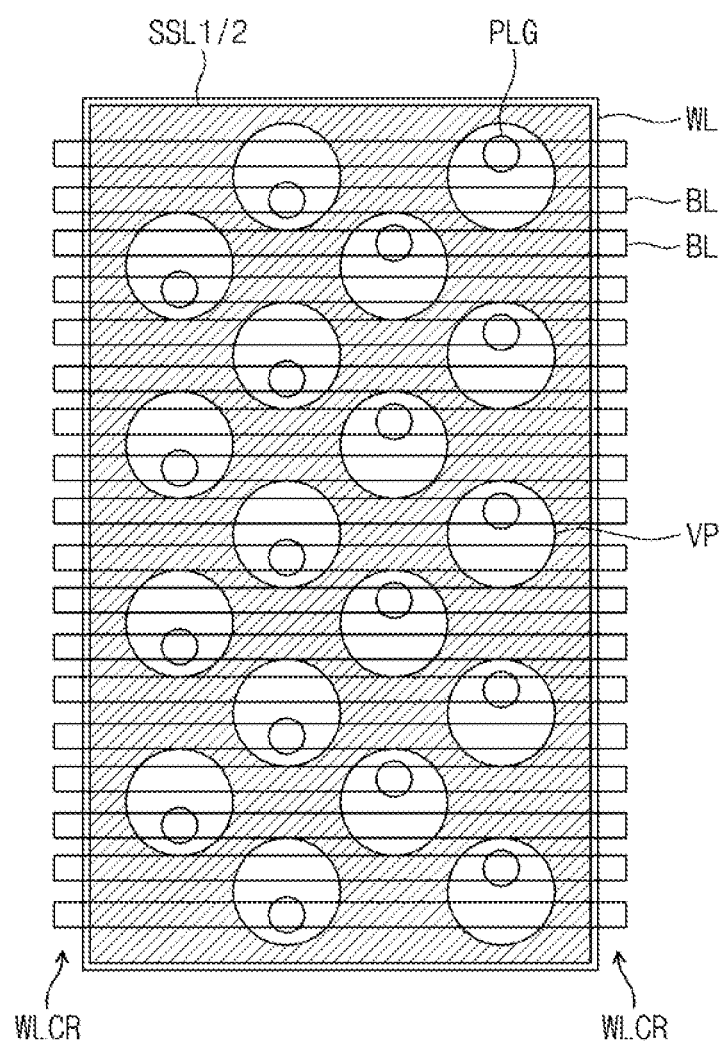

FIGS. 64 through 66 are plan views illustrating three-dimensional semiconductor devices according to exemplary embodiments of the inventive concept.

Referring to FIGS. 64 through 66, according to an exemplary embodiment of the inventive concept, the horizontal electrode structure HES may be provided between a pair of the outer cutting regions WLCR. Each of the vertical patterns VP may penetrate the corresponding one of the first and second unit structures S1 and S2, and a pair of the bit lines BL may be provided on each of the vertical patterns VP. According to an exemplary embodiment of the inventive concept, the bit lines BL and the vertical patterns VP may constitute the second string selection structure of FIG. 2. For example, according to an exemplary embodiment of the inventive concept, each of the bit lines BL may be connected to the corresponding one of the vertical patterns VP penetrating the first and second unit structures S1 and S2.

As shown in FIGS. 64 and 65, the horizontal electrode structure HES may include the first and second unit structures S1 and S2 that are sectioned or divided by the inner cutting region SLCR. In an exemplary embodiment of the inventive concept, the center pattern VPd may be provided on the inner cutting region SLCR, as shown in FIG. 65, and alternatively, the center pattern VPd may be omitted, as shown in FIG. 64. As shown in FIG. 66, in the horizontal electrode structure HES, the inner cutting region SLCR is not provided. In this case, the horizontal electrode structure HES, the vertical patterns VP, and the bit lines BL may have the same or similar structures as the corresponding structures in each of the first and second unit structures S1 and S2 described above with reference to FIG. 26. The inner cutting region SLCR may have substantially the same technical features as the inner cutting region SLCR described above with reference to FIGS. 9, 38, 39, and 43.

Figure 67:
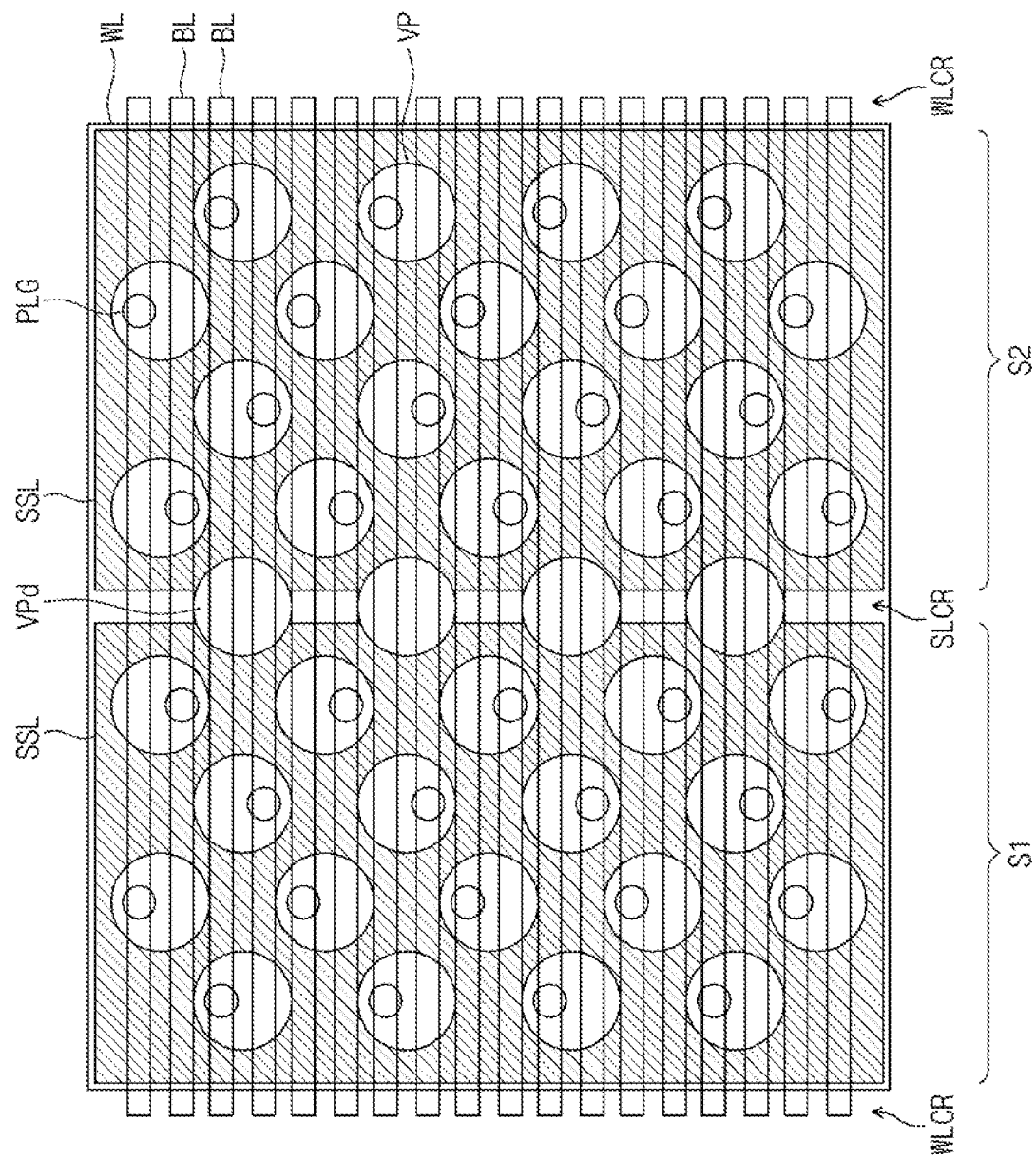
FIGS. 67 and 68 are plan views of three-dimensional semiconductor devices according to exemplary embodiments of the inventive concept.
Figure 68:
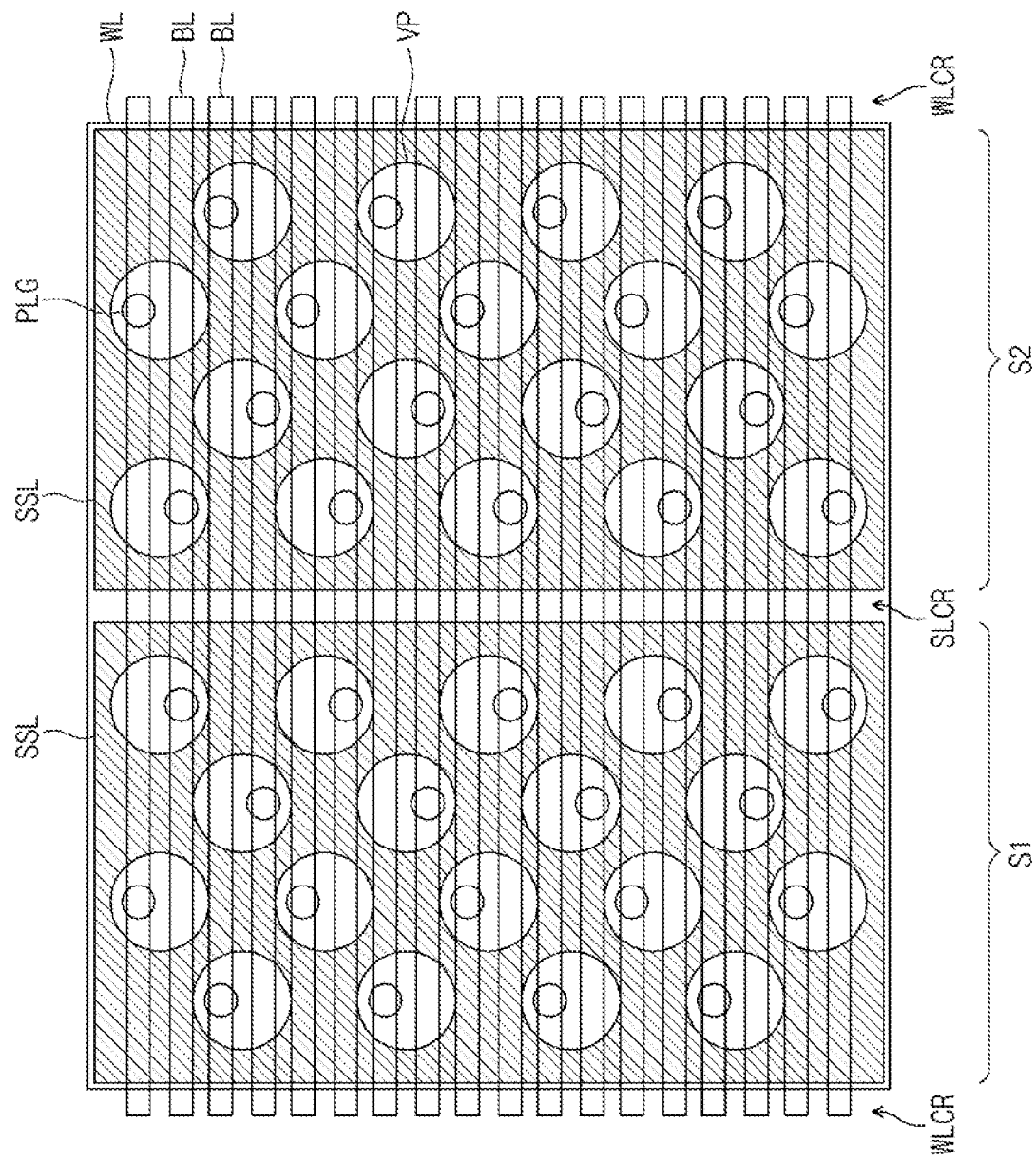

FIGS. 67 and 68 are plan views illustrating three-dimensional semiconductor devices according to exemplary embodiments of the inventive concept.

Referring to FIGS. 67 and 68, the first and second unit structures S1 and S2 of the horizontal electrode structure HES may have substantially the same structure as the first and second unit structures S1 and S2 described above with reference to FIG. 66. For example, according to an exemplary embodiment of the inventive concept, in each of the first and second unit structures S1 and S2, the horizontal electrode structure HES, the vertical patterns VP, and the bit lines BL may constitute the second string selection structure of FIG. 2. In an exemplary embodiment of the inventive concept, as shown in FIG. 67, the center pattern VPd may be provided on the inner cutting region SLCR, or alternatively, as shown in FIG. 68, the center pattern VPd may be omitted. In an exemplary embodiment of the inventive concept, the inner cutting region SLCR may have substantially the same technical features as the inner cutting region SLCR described above with reference to FIGS. 9, 38, 39, and 43.

Figure 69:
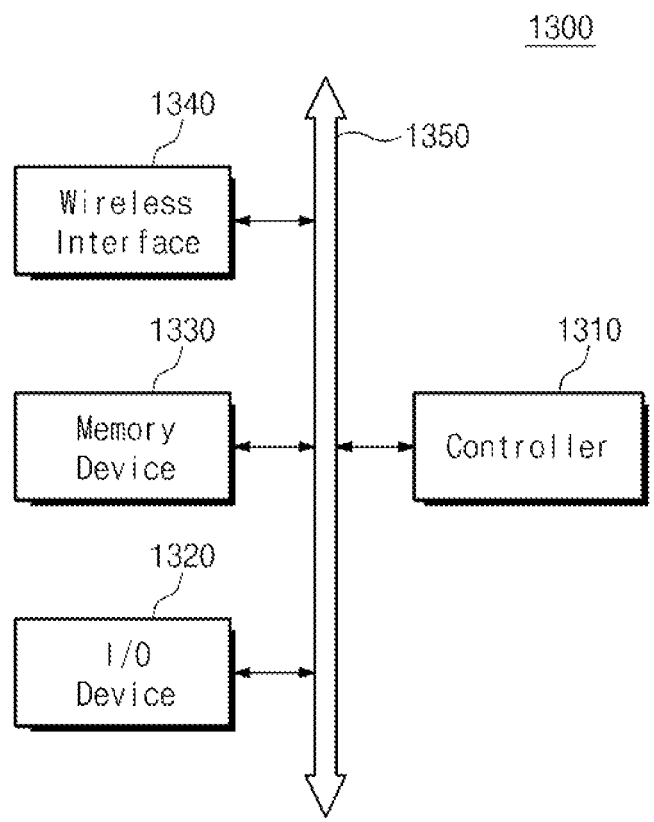
FIGS. 69 and 70 are schematic diagrams illustrating electronic systems including a semiconductor device according to exemplary embodiments of the inventive concept.
Figure 70:
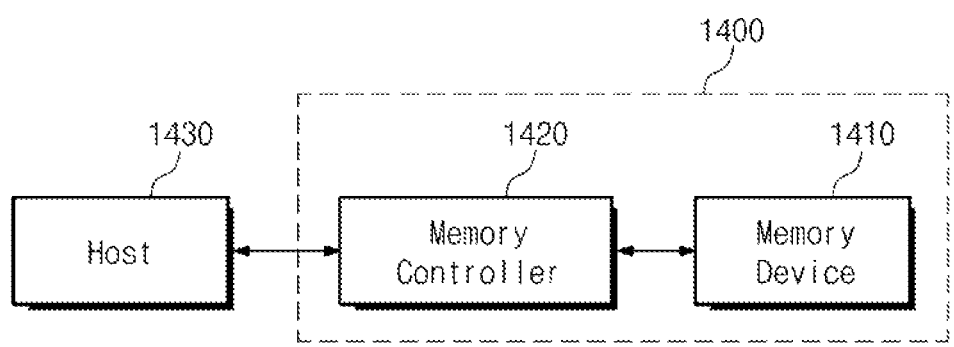

FIGS. 69 and 70 are block diagrams illustrating electronic devices including a semiconductor device according to an exemplary embodiment of inventive concept.

Referring to FIG. 69, an electronic device 1300 including a semiconductor device according to an exemplary embodiment of inventive concept may be used in one of a personal digital assistant (PDA), a laptop computer, a mobile computer, a web tablet, a wireless phone, a cell phone, a digital music player, a wire or wireless electronic device, and/or a complex electronic device including at least two thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, a microprocessor, a digital signal process, and/or a microcontroller. The memory 1330 may store a command code to be used by the controller 1310 or a user's data. The memory 1330 may include a semiconductor device according to an exemplary embodiment of inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system, such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, CPRS, iBurst, WiBro, WiMAX, WiMAX-Advanced, UMTS-TDD, HSPA, EVDO, LTE-Advanced, MMDS, and so forth.

Referring to FIG. 70, a memory system including a semiconductor device according to an exemplary embodiment of the inventive concept is described. The memory system 1400 may include a memory device 1410 for storing huge amounts of data and a memory controller 1420. The memory controller 1420 controls the memory device 1410 to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to an exemplary embodiment of the inventive concept.

A semiconductor memory device according to an exemplary embodiment of the inventive concept may be encapsulated using various and diverse packaging techniques. For example, a semiconductor memory device according to an exemplary embodiment of the inventive concept may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique, and/or a wafer-level processed stack package (WSP) technique.

A package including a semiconductor memory device according to an exemplary embodiment of the inventive concept may further include at least one semiconductor device (e.g., a controller and/or a logic device) that is configured to control the semiconductor memory device.

According to an exemplary embodiment of the inventive concept, a string selection structure may be realized using a combination of depletion and enhancement mode transistors. In an exemplary embodiment of the inventive concept, a string selection structure may be configured in such a way that a plurality of bit lines is provided on each vertical pattern. In an exemplary embodiment of the inventive concept, a complex string selection structure, in which the two string selection structures are combined or modified, may be provided. By using the string selection structures, a three-dimensional semiconductor device with increased integration density may be formed.

While exemplary embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
    a selection line extending along a first direction;
    first and second upper lines horizontally crossing over the selection line and extending along a second direction orthogonal to the first direction; and
    first and second vertical patterns vertically crossing the selection line and extending along a third direction orthogonal to the first and second directions, the first and second vertical patterns connected to the first and second upper lines, respectively,
    wherein each of the first and second vertical patterns overlaps both of the first and second upper lines, when viewed from plan view.

2. The three-dimensional semiconductor device of claim 1, wherein the first and second vertical patterns are arranged along a longitudinal direction of the first and second upper lines.

3. The three-dimensional semiconductor device of claim 1, wherein a width of each of the first and second upper lines is smaller than about half a width of each of the first and second vertical patterns.

4. The three-dimensional semiconductor device of claim 1, further comprising plugs interposed between the first and second upper lines and the first and second vertical patterns, wherein each of the plugs connects one of the first and second upper lines to a corresponding one of the first and second vertical patterns.

5. The three-dimensional semiconductor device of claim 4, wherein the first and second vertical patterns constitute a pair of selection transistors sharing the selection line as a gate electrode thereof.

6. The three-dimensional semiconductor device of claim 1, wherein at least two upper lines including the first and second upper lines are provided on each of the first and second vertical patterns.

7. A three-dimensional semiconductor device, comprising:
    first and second selection lines that are stacked one on the other;
    an upper line horizontally crossing over the first and second selection lines; and
    first and second vertical patterns vertically crossing the first and second selection lines, wherein the first and second vertical patterns are connected in common to the upper line, wherein each of the first and second vertical patterns includes a plurality of memory cells,
    wherein an upper portion of each of the first and second vertical patterns constitutes first and second selection transistors that are connected in series to each other, the first and second selection transistors respectively having first and second threshold voltages that are different from each other, and wherein the first selection transistors of the first and second vertical patterns are controlled by the first and second selection lines, respectively.

8. The three-dimensional semiconductor device of claim 7, wherein the first selection transistors of the first and second vertical patterns, respectively, use the first and second selection lines as their respective gate electrodes, and wherein the second selection transistors of the first and second vertical patterns, respectively, use the second and first selection lines as their respective gate electrodes.

9. The three-dimensional semiconductor device of claim 7, further comprising: an additional upper line horizontally crossing over the first and second selection lines; and a third vertical pattern vertically crossing the first and second selection lines, the third vertical pattern connected to the additional upper line, wherein each of the first, second, and third vertical patterns overlaps both of the upper line and the additional upper line, when viewed in plan view.

10. The three-dimensional semiconductor device of claim 7, wherein both of the first and second selection transistors include metal-oxide-semiconductor field effect transistors (MOSFETs) of substantially the same conductivity type, and wherein the first threshold voltage is lower than the second threshold voltage.

11. The three-dimensional semiconductor device of claim 7, wherein both of the first and second selection transistors include n-MOSFETs, and wherein the first threshold voltage is a negative value, and the second threshold voltage is a positive value.

12. The three-dimensional semiconductor device of claim 7, wherein the first and second selection transistors comprise a charge storing layer, and wherein the first selection transistors are subjected to electrical erasing to have a threshold voltage lower than a threshold voltage of the second selection transistors.

13. The three-dimensional semiconductor device of claim 7, wherein the first selection transistors of the first and second vertical patterns include n-MOSFETs, and wherein at least one of the n-MOSFETs has an n-type channel region.

14. A three-dimensional semiconductor device, comprising:
    unit structures, at least one of the unit structures including:
        first and second selection lines stacked one on the other; and
        first and second vertical patterns penetrating the first and second selection lines; and
    upper lines provided on the unit structures, the upper lines crossing over the first and second selection lines,
    wherein in the at least one of the unit structures, the first and second vertical patterns are connected in common to one of the upper lines,
    wherein each of the first and second vertical patterns includes a plurality of memory cells, and an upper portion of each of the first and second vertical patterns constitutes first and second selection transistors that are connected in series to each other,
    wherein the first and second selection transistors, respectively, have first and second threshold voltages that are different from each other, and
    wherein the first selection transistors of the first and second vertical patterns are controlled by the first and second selection lines, respectively.

15. The three-dimensional semiconductor device of claim 14, wherein the unit structures comprise first and second unit structures adjacent to each other, the first and second unit structures having substantially mirror symmetry.

16. The three-dimensional semiconductor device of claim 15, wherein the first and second unit structures are spaced apart from each other.

17. The three-dimensional semiconductor device of claim 15, wherein the first and second unit structures at least partially contact each other.

18. The three-dimensional semiconductor device of claim 15, wherein the second vertical pattern of the first unit structure functions as the second vertical pattern of the second unit structure.

19. The three-dimensional semiconductor device of claim 18, wherein an upper portion of the second vertical pattern is at least partially cut by a slit that is formed substantially parallel to the upper line.

20. The three-dimensional semiconductor device of claim 15, wherein each of the first and second unit structures further comprises plugs disposed between the first and second vertical patterns and the upper lines, and wherein the plugs of the first and second unit structures have substantially mirror symmetry.

21. The three-dimensional semiconductor device of claim 15, wherein each of the first and second unit structures further comprises plugs disposed between the first and second vertical patterns and the upper lines, and wherein the plugs of the first and second unit structures have substantially rotational symmetry.

22. The three-dimensional semiconductor device of claim 15, wherein each of the first and second unit structures further comprises a plurality of word lines that are stacked one on another below the first selection line, wherein each of pairs of the first and second selection lines, which are included in the first and second unit structures and are located at substantially the same level, are electrically separated from each other, and wherein each of pairs of the word lines, which are included in the first and second unit structures and are located at substantially the same level, are electrically connected to each other to be in an equipotential state.

23. The three-dimensional semiconductor device of claim 15, wherein each of the first and second unit structures further comprises a plurality of word lines that are stacked one on another below the first selection line, each of pairs of the first and second selection lines, which are included in the first and second unit structures and are located at substantially the same level, are electrically connected to each other to be in an equipotential state, and wherein each of pairs of the word lines, which are included in the first and second unit structures and are located at substantially the same level, are electrically connected to each other to be in an equipotential state.

24. A method of operating the three-dimensional semiconductor device of claim 7, the method comprising selectively connecting one of the first and second vertical patterns to the upper line, wherein a first voltage is applied to one of the first and second selection lines, and a second voltage is applied to the other of the first and second selection lines, the first voltage being higher than both of the first and second threshold voltages, and wherein the second voltage having an intermediate level between the first and second threshold voltages.

25. A semiconductor device comprising:
a first string selection structure, the first string selection structure including:
a first selection line;
first and second upper lines horizontally crossing over the first selection line; and
first and second vertical patterns vertically crossing the first selection line, the first and second vertical patterns connected to the first and second upper lines, respectively, wherein the first selection line is shared by the first and second vertical patterns; and
a second string selection structure, the second string selection structure including:
second and third selection lines that are stacked one on the other;
a third upper line horizontally crossing over the second and third selection lines; and
third and fourth vertical patterns vertically crossing the second and third selection lines, the third and fourth vertical patterns connected in common to the third upper line,
wherein each of the second and third selection lines is shared by the third and fourth vertical patterns.

26. The semiconductor device of claim 25, wherein each of the third and fourth vertical patterns includes first and second selection transistors that are connected in series to each other, the first and second selection transistors respectively having first and second threshold voltages that are different from each other, and wherein the first selection transistors of the third and fourth vertical patterns are controlled by the second and third selection lines, respectively.

27. The semiconductor device of claim 25, wherein each of the first and second vertical patterns overlaps both of the first and second upper lines, when viewed in plan view.

* * * * *